United States Patent
Goldberg et al.

(10) Patent No.: US 10,135,386 B2
(45) Date of Patent: Nov. 20, 2018

(54) SENSING, INTERLOCKING SOLAR MODULE SYSTEM AND INSTALLATION METHOD

(71) Applicant: Smash Solar, Inc., Richmond, CA (US)

(72) Inventors: Neil Goldberg, Berkeley, CA (US); Troy Douglas Tyler, El Cerrito, CA (US); David Mathew Johnson, San Francisco, CA (US)

(73) Assignee: Smash Solar, Inc., Richmond, CA (US)

( * ) Notice: Subject to any disclaimer, the term of this patent is extended or adjusted under 35 U.S.C. 154(b) by 17 days.

(21) Appl. No.: 14/521,245

(22) Filed: Oct. 22, 2014

(65) Prior Publication Data
US 2016/0049900 A1 Feb. 18, 2016

Related U.S. Application Data

(63) Continuation-in-part of application No. 14/054,807, filed on Oct. 15, 2013.
(Continued)

(51) Int. Cl.
*H02S 20/23* (2014.01)
*H02S 40/36* (2014.01)
(Continued)

(52) U.S. Cl.
CPC .......... *H02S 20/23* (2014.12); *F24J 2/4607* (2013.01); *F24J 2/5237* (2013.01); *F24J 2/5239* (2013.01); *F24J 2/5245* (2013.01); *F24J 2/5254* (2013.01); *F24J 2/5262* (2013.01); *H01L 31/05* (2013.01); *H02S 20/00* (2013.01); *H02S 20/24* (2014.12); *H02S 40/32* (2014.12); *H02S 40/36* (2014.12);
(Continued)

(58) Field of Classification Search
CPC .......... H02S 20/23; H02S 20/24; H02S 40/32; H02S 40/36
See application file for complete search history.

(56) References Cited

U.S. PATENT DOCUMENTS 4,650,386 A 3/1987 McSherry et al.
6,035,595 A 3/2000 Anderson
(Continued)

FOREIGN PATENT DOCUMENTS

DE 10336145 A1 3/2005
JP 2005290755 A * 10/2005
(Continued)

OTHER PUBLICATIONS

English Translation of Higuchi (JP 2005290755).*
(Continued)

*Primary Examiner* — Shannon M Gardner
(74) *Attorney, Agent, or Firm* — SF Bay Area Patents, LLC; Andrew V. Smith

(57) ABSTRACT

A solar module system is coupled directly to a fixed structure either individually or collectively as an array. Universal mounting brackets attached to the back of each solar panel module each connect to one or more other brackets of adjacent solar panels and/or to mounting feet that anchor to the fixed structure. Mounting brackets interlock with mounting brackets on adjacent solar modules and include a flexible snap coupling mechanism including a locking feature to selectively flexibly connect to and disconnect from other mounting brackets of adjacent solar panels.

20 Claims, 60 Drawing Sheets

US 10,135,386 B2

Page 2

Related U.S. Application Data

(60) Provisional application No. 61/712,878, filed on Oct. 12, 2012.

(51) Int. Cl.
- F24J 2/46 (2006.01)
- F24J 2/52 (2006.01)
- H01L 31/05 (2014.01)
- H02S 20/00 (2014.01)
- H02S 40/32 (2014.01)
- H02S 20/24 (2014.01)
- F24J 2/54 (2006.01)

(52) U.S. Cl.
CPC ....... F24J 2002/4661 (2013.01); F24J 2002/4669 (2013.01); F24J 2002/5281 (2013.01); F24J 2002/5486 (2013.01); Y02B 10/12 (2013.01); Y02E 10/47 (2013.01); Y02E 10/50 (2013.01)

(56) References Cited

U.S. PATENT DOCUMENTS

| | | |
|---|---|---|
| 6,161,999 A | 12/2000 | Kaye et al. |
| 6,750,391 B2 | 6/2004 | Bower et al. |
| 7,406,800 B2 | 8/2008 | Cinnamon et al. |
| 7,435,134 B2 | 10/2008 | Lenox |
| 7,487,771 B1 | 2/2009 | Eiffert et al. |
| D600,200 S | 9/2009 | Dimov et al. |
| 7,592,537 B1 | 9/2009 | West |
| 7,762,027 B1 | 7/2010 | Wentworth et al. |
| 7,806,377 B2 | 10/2010 | Strizki |
| 7,819,114 B2 | 10/2010 | Augenbraun et al. |
| 7,921,607 B2 | 4/2011 | Thompson et al. |
| 7,977,818 B1 | 7/2011 | Wahl |
| 7,987,641 B2 | 8/2011 | Cinnamon |
| 8,816,189 B2 | 8/2014 | Janssens et al. |
| 2003/0070368 A1 | 4/2003 | Shingleton |
| 2006/0090789 A1 | 5/2006 | Thompson |
| 2007/0295393 A1 | 12/2007 | Cinnamon |
| 2009/0078299 A1 | 3/2009 | Cinnamon et al. |
| 2009/0120486 A1 | 5/2009 | Buller |
| 2009/0282755 A1 | 11/2009 | Abbott et al. |
| 2009/0320904 A1 | 12/2009 | Botkin et al. |
| 2010/0018571 A1 | 1/2010 | Placer |
| 2010/0065108 A1 | 3/2010 | West et al. |
| 2010/0089389 A1 | 4/2010 | Seery et al. |
| 2010/0089390 A1 | 4/2010 | Miros et al. |
| 2010/0101561 A1 | 4/2010 | Frank et al. |
| 2010/0212244 A1 | 8/2010 | Yu |
| 2010/0219304 A1 | 9/2010 | Miros et al. |
| 2010/0293874 A1 | 11/2010 | Liebendorfer |
| 2011/0000519 A1 | 1/2011 | West |
| 2011/0000526 A1 | 1/2011 | West |
| 2011/0005983 A9 | 1/2011 | Blaha et al. |
| 2011/0088740 A1 | 4/2011 | Mittan et al. |
| 2011/0174365 A1 | 7/2011 | Drake et al. |
| 2011/0203637 A1 | 8/2011 | Patton et al. |
| 2011/0241426 A1 | 10/2011 | Wahl |
| 2012/0005983 A1 | 1/2012 | Stephan |
| 2012/0048350 A1 | 3/2012 | Gonzalez |
| 2012/0061337 A1 | 3/2012 | Seery et al. |
| 2012/0085394 A1 | 4/2012 | McPheeters et al. |
| 2012/0085395 A1 | 4/2012 | Kuster et al. |
| 2014/0130849 A1 | 5/2014 | Silberschatz et al. |
| 2014/0230877 A1 | 8/2014 | Goldberg et al. |
| 2014/0273559 A1 | 9/2014 | Schaefer et al. |
| 2015/0040944 A1 | 2/2015 | Dinwoodie et al. |
| 2015/0204583 A1 | 7/2015 | Stephan et al. |
| 2017/0062639 A1 | 3/2017 | Goldberg et al. |
| 2018/0041161 A1 | 2/2018 | Goldberg et al. |

FOREIGN PATENT DOCUMENTS

| | | |
|---|---|---|
| WO | 2009/158712 A2 | 12/2009 |
| WO | 2011/154019 A1 | 12/2011 |
| WO | 2014/059445 A2 | 4/2014 |
| WO | 2014/059445 A3 | 7/2015 |
| WO | 2016/065210 A1 | 4/2016 |
| WO | 2016/140730 A1 | 9/2016 |
| WO | 2017/019719 A2 | 2/2017 |
| WO | 2017/027758 A2 | 2/2017 |
| WO | 2017/019719 A3 | 3/2017 |
| WO | 2017/027758 A3 | 3/2017 |

OTHER PUBLICATIONS

PCT Invitation to Pay Additional Fees and, Where Applicable, Protest Fee, for PCT Application No. PCT/US2015/057018; International filing date: Oct. 22, 2015; Invitation dated Dec. 30, 2015, 2 pages.
PCT Notification of Transmittal of the International Search Report and the Written Opinion of the International Searching Authority, or the Declaration, for PCT Application No. PCT/US2015/057018, report dated Mar. 11, 2016, 16 pages.
PCT Notification of Transmittal of the International Search Report and the Written Opinion of the International Searching Authority, or the Declaration, for PCT Application No. PCT/US2013/065144, dated Mar. 28, 2014, 9 pages.
PCT Notification of Transmittal of International Preliminary Report on Patentability (Chapter II of the Patent Cooperation Treaty), Form IPEA/416, including PCT International Preliminary Report on Patentability, Form IPEA/409, for PCT Application No. PCT/US2013/065144, report dated Nov. 17, 2014, 10 pages.
PCT Notification of Transmittal of the International Search Report and the Written Opinion of the International Searching Authority, or the Declaration, for PCT Application No. PCT/US2016/000019, dated Jul. 12, 2016, 12 pages.
EPO Communication regarding the transmission of the European search report, European search opinion, Information on Search Strategy, and Supplementary European search report, for European patent application No. 13845553.0 (EP2907166), report dated Apr. 29, 2016, 11 Pages.
EPO Google Machine Patent Translate for JP 2005290755 A; Publication Date: Oct. 20, 2005; "Supporting Device for Solar Battery Panel".
EPO Google Machine Patent Translate for DE 103 36 145 A1; Publication Date: Mar. 10, 2005. "Process and assembly to install roof-mounted solar panels with quick-fit tensile fixtures" 13 pages.
Non-Final Rejection, dated Nov. 30, 2016, for U.S. Appl. No. 14/054,807, filed Oct. 15, 2013.
PCT Notification of Transmittal of International Preliminary Report on Patentability Chapter I, and International Preliminary Report on Patentability Chapter I, for PCT Application No. PCT/US2015/057018, report dated May 4, 2017, 9 pages.
Communication from the Examining Division, and Annex to the communication, pursuant to Article 94(3) EPC, for European patent application No. 13845553.0 (EP2907166), report dated Jun. 20, 2017, 5 pages.
PCT Invitation to Pay Additional Fees and, Where Applicable, Protest Fee, for PCT Application No. PCT/US2016/044151, International filed: Aug. 11, 2016; Invitation dated Nov. 28, 2016, 2 pages.
PCT Notification of Transmittal of the International Search Report and the Written Opinion of the International Searching Authority, or the Declaration, for PCT Application No. PCT/US2016/044151, dated Jan. 19, 2017, 18 pages.
PCT Invitation to Pay Additional Fees and, Where Applicable, Protest Fee, for PCT Application No. PCT/US2016/046649; International filed: Aug. 11, 2016; Invitation dated Nov. 7, 2016, 2 pages.
PCT Notification of Transmittal of the International Search Report and the Written Opinion of the International Searching Authority, or the Declaration, for PCT Application No. PCT/US2016/046649, report dated Feb. 3, 2017, 20 pages.
Communication about intention to grant a European patent, for European patent application No. 13845553.0 (EP2907166), report dated Dec. 22, 2017, 225 Pages.
PCT Notification of Transmittal of International Preliminary Report on Patentability Chapter I, and International Preliminary Report on

(56) References Cited

OTHER PUBLICATIONS

Patentability Chapter I, for PCT Application No. PCT/US16/00019, report dated Sep. 14, 2017, 6 pages.

PCT Notification of Transmittal of International Preliminary Report on Patentability (Chapter II of the Patent Cooperation Treaty, IPEA/416) and PCT International Preliminary Report on Patentability (Chapter II of the Patent Cooperation Treaty, IPEA/409), for PCT application No. PCT/US16/44151, report dated Sep. 26, 2017, 20 pages.

PCT Notification of Transmittal of International Preliminary Report on Patentability (Chapter II of the Patent Cooperation Treaty, IPEA/416) and PCT International Preliminary Report on Patentability (Chapter II of the Patent Cooperation Treaty, IPEA/409), for PCT application No. PCT/US16/46649, report dated Oct. 24, 2017, 8 pages.

Final Rejection, dated Sep. 13, 2017, for U.S. Appl. No. 14/054,807, filed Oct. 15, 2013.

\* cited by examiner

AC SOLAR PANELS (each with a micro-inverter, cables and a mounting bracket at each corner)

FEET (that attach to brackets with ¾" nut)

ANCHORS (3/16" SNAP TOGGLE with 3/16" MACHINE SCREWS)

FLASHING (12" x 12" galvanized metal)

JUNCTION BOX (snap together transition box)

END CAPS

Set the Anchor Point on first course (INSTALLATION SCHEMATIC will define the dimension of the anchor point off of roof edge.)

Mark centerline of 1st flashing on first course (where you will place the lower left bracket of module 1)

Measure 31 1/2" & mark centerline of 2<sup>nd</sup> flashing (where you will place lower right bracket of module 1)

Measure 41 1/4" & mark centerline of 3<sup>rd</sup> flashing (where you will place the lower left bracket of module 2)

Using Install Template, find & mark the open shingle course [up slope]
(Use the course which aligns with 4 of the inch scale marks at the top of the template – this is the course where the next row of flashing will be placed and where you will place the top of module 1)

Mark the centerline of the 4$^{th}$ flashing
(where you will place the upper left corner of module 1)

Measure over 31 1/2" and 41 1/4" and mark centerline of 5th and 6th flashing locations Install flashing at all centerline marks

Prep modules: Install Junction Box & End Caps (see INSTALLATION SCHEMATIC for locations)

Prep modules: Verify cable management (see INSTALLATION SCHEMATIC)

Prep modules: Verify Feet locations
(see INSTALLATION SCHEMATIC for locations)

Install Module 1 (aka "anchor module")
• Refer to INSTALLATION SCHEMATIC
• Align with flashing and secure
• Adjust up slope feet as required & tighten with Allen wrench

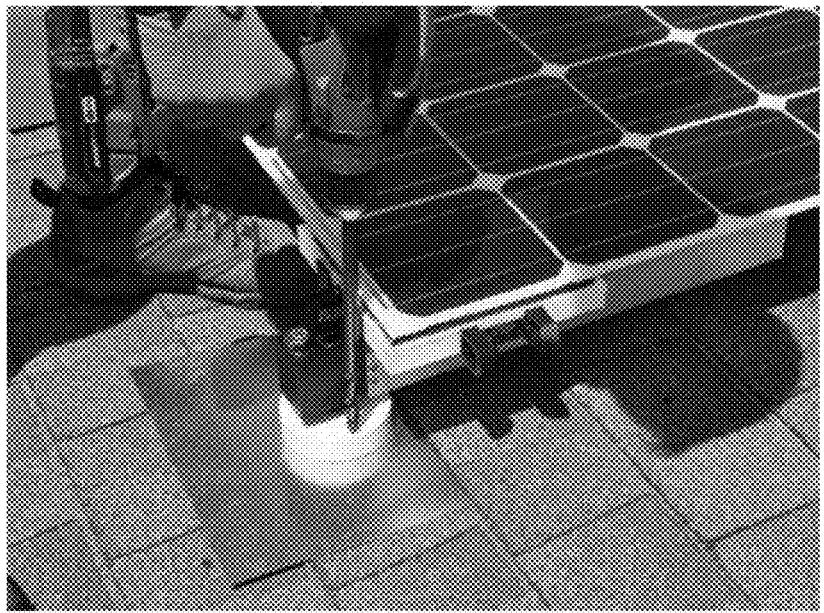
Drill ½" holes through SMASH feet (to insert SNAPTOGGLE anchors into)
DRILL 2 X holes per foot
Figure 73
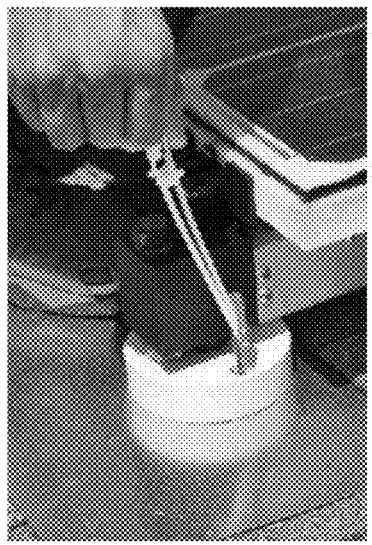 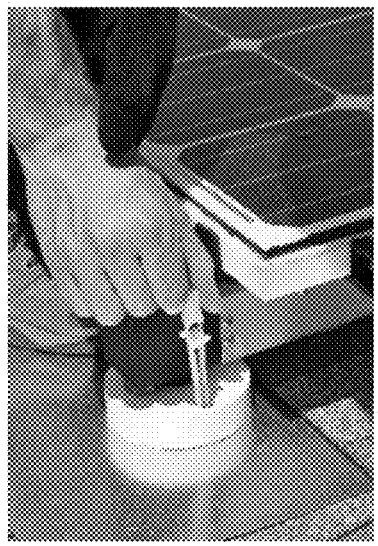
Insert SNAPTOGGLE into each ½" hole in foot.
- Insert toggle nut first (making sure that the toggle nut is positioned straight up and down)
Figure 74

SNAP off SNAPTOGGLE and insert 3/16" screw through SNAPTOGGLE

Drive 3/16" screw in SNAPTOGGLE
- NOTE: may need to hold the top of SNAP TOGGLE to prevent spinning.

Install Module 2: lock to Anchor Module
(see INSTALLATION SCHEMATIC).
- Hold module vertical against edge of Anchor Module
- Lower & snap into the snap connectors of the anchor module

Install Module 2: connect electrical cables
(see INSTALLATION SCHEMATIC).
- Connect the electrical cables and
- Secure cables in the clips

Install Module 2: secure to roof
(per INSTALLATION SCHEMATIC).
- Rotate the panel down so that both feet are laying on roof
- Adjust feet as required & tighten ¼ turn with wrench
- Secure to the roof with two (2) SNAPTOGGLE Anchors in each foot and two (2) 3/16 screws in each anchor.

Figure 79

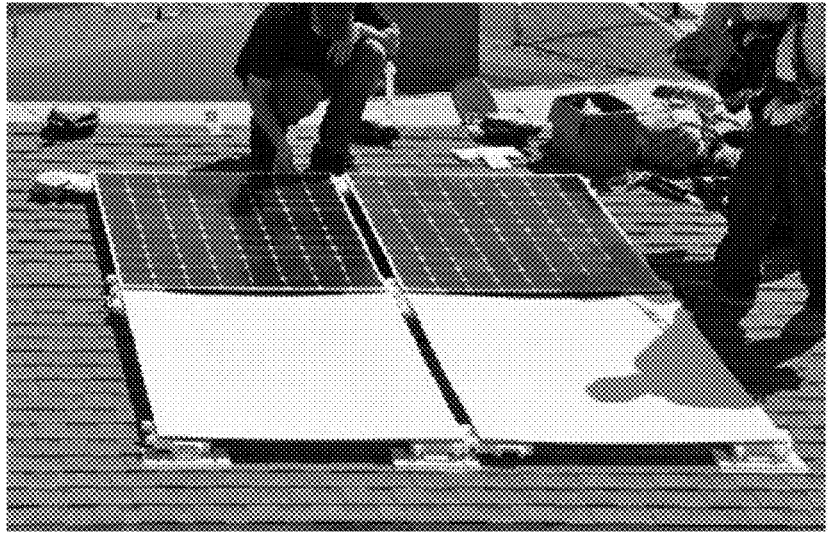

Repeat for Module 3 and Module 4
(per INSTALLATION SCHEMATIC).
- Repeat steps 13, 14, 15 for Module 3
- Repeat steps 13, 14, 15 for Module 4

Figure 80

SENSING, INTERLOCKING SOLAR MODULE SYSTEM AND INSTALLATION METHOD

PRIORITY AND RELATED APPLICATIONS

This patent application is a Continuation-in-Part (CIP) application which claims the benefit of priority to U.S. patent application Ser. No. 14/054,807, filed Oct. 15, 2013, which claims priority to U.S. provisional patent application No. 61/712,878, filed Oct. 12, 2012. Each of these priority applications is incorporated by reference.

GOVERNMENT LICENSE RIGHTS

This invention was made with government support under the SunShot Financial Assistance Award number DE-EE0006457 awarded by the Department of Energy. The government has certain rights in the invention.

BACKGROUND

Solar panels are widely used in the production of electricity with multiple panels typically connected together as panel assemblies. These assemblies are typically arranged in arrays and mounted on structural racking systems on the roofs of buildings, on the ground or other fixed structures. A fixed structure can include, but is not limited to, existing residential or commercial roof tops, horizontal surfaces or vertical surfaces, existing fences, railings, walls or open ground-mounted areas. These racking assemblies are required to pass loading tests to ensure they can withstand static and dynamic loading anticipated during the life of the installation. These solar racking systems must be custom designed for each application and custom installed by contractors and tradespeople using specialty skills and following the approved drawings. What is needed is a system that meets the loading requirements of solar module racking systems through a configurable design which eliminates expense of custom design and installation activities.

In addition, a number of solar panel manufacturers have released new solar panels with integrated micro-inverters to simplify the electrical installation process and give customers the promise of flexibility: install a small system now and expand in the future.

Considering the complexity of typical racking systems and the promise of customer flexibility, existing solar mounting systems have a number of problems and limitations that this invention solves.

Current solar systems on the market are engineered to be custom designed and installed for each application. Each application is typically designed as a maximum size for a single large, complex and custom installation. This custom approach carries inherent costs which customers unknowingly bear. Customers prefer flexibility and control over their power purchases.

Installation contractors must either train their workforce or hire specially-skilled solar workers raising their cost of doing business.

BRIEF DESCRIPTION OF THE DRAWINGS

FIGS. 61-80 schematically illustrate a method of installing a set of four preassembled solar modules on a roof surface in accordance with certain embodiments.

DETAILED DESCRIPTIONS OF THE EMBODIMENTS

Figure 1:
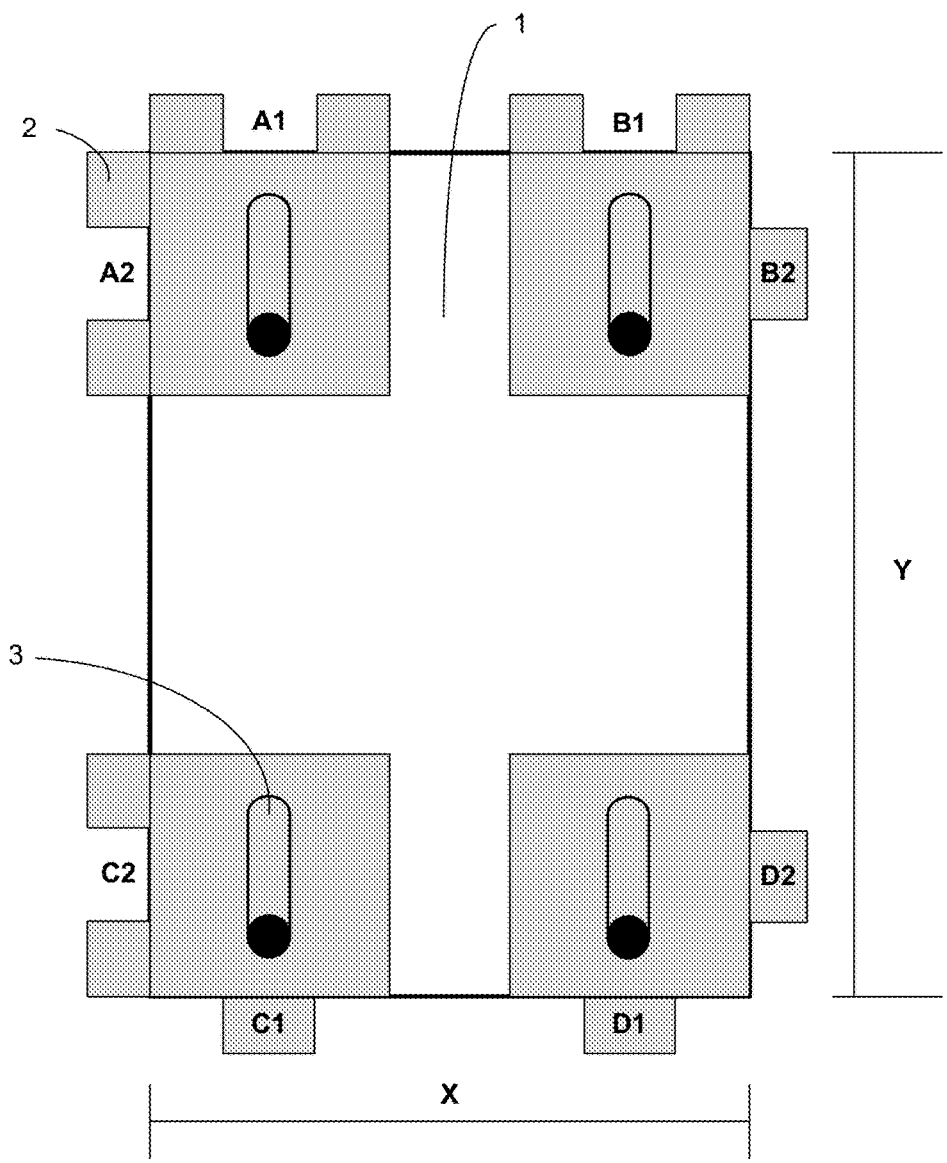
FIG. 1 illustrates an embodiment including an Interlocking Mounting Brackets (at corner extremities of solar panel).

Solar panel modules are provided in embodiments that are not designed to anchor through the roofing membrane into roof rafters. These systems create significant efficiency in the installation process. They reduce work effort and time and personnel for installing the solar panel modular system.

Solar panel modules have integrated brackets that install with reduced parts count, supply chain burden, logistical cost and installation complexity.

Solar panel mounting systems are provided that allow users to cost effectively install smaller, more affordable systems and expand them in small increments over time.

Solar panel modules are provided that installs without aluminum alloy frames nor mounting system members (also primarily made from aluminum alloys) that would otherwise involve more complex electrical equipment grounding for safety.

An interlocked, modular mounting bracket is provided that is attached to solar panels that significantly streamlines the field installation process using a module with an integral, factory-installed mounting system that is ready to install as soon as it's removed from the package. The interlocking module may have integral sensors which record mechanical and electrical characteristics of the solar installation for instant field verification of a complete and accurate installation and for mobile field inspections for the building inspector.

Flat plate solar collectors, otherwise known as solar panels, are provided with enhanced efficiency of anchoring to a fixed structure. Aluminum alloy frame, rails and roof standoffs are optional. An interlocking, modular solar panel system is provided that enables a simplified workflow for installing solar panels and provides an electronic measure of the waterproofing and structural integrity of the mounting to the fixed structure.

A sensing, interlocking module has a structural platform for both connecting solar panels together and anchoring them to a fixed structure. The platform is based on a universal mounting bracket that can be adhered to a plurality of solar panels. This mounting bracket is made from non-conductive materials and mechanically adhered to the back of a solar panel. Each mounting bracket connects to adjacent mounting brackets allowing the interlocking modules to quickly connect to any number of interlocking modules. These brackets structurally support the solar panel without a traditional module frame. These frameless modules rely on the mounting bracket and the connected mounting feet to secure the solar panel to a fixed structure.

The mounting bracket platform may connect to a plurality of mounting feet for different fixed structure mounting applications. Such applications include rooftop, ground mount and external building envelope such as, but not limited to the following: sloped residential roofs, flat residential roofs, flat commercial roofs, sloped standing seam metal roofs, sloped corrugated metal roofs, vertical walls, fences, railings or other external fixed structures. Each mounting foot contains a number of anchor points each with their own integral waterproofing ring or gasket aligned with the anchor point hole on the bottom of the foot. Standard anchors designed for exposed, external applications will be employed as mechanically driven anchors through one or more anchor point in each mounting foot. Each mounting foot connects to the mounting bracket via a connector that can be quickly and easily released from the top of the mounting foot. This manually activated release connector provides for simple release and reattachment of the interlocking module to the mounting feet for maintenance or upgrades. For composite shingle roofs, the mounting foot also adjusts to align with the specific exposed shingle course dimension which varies by roofing product and manufacturer.

The mounting feet may contain a radio frequency transmitter and pressure sensor ("mounting sensor") on the bottom of the mounting foot. The mounting sensor is attached adjacent to the anchor point where an anchor is driven through the mounting foot, into the flashing, roofing material and into the roofing substrate. The anchor exerts force against the mounting foot which in turn exerts force against the integral waterproofing ring and roof flashing. The mounting sensor measures the compressive pressure between the mounting foot and the roof flashing to confirm the compliance to the waterproofing and structural anchor installation specifications. With a minimum compressive pressure at each anchor point, waterproofing and structural attachment are assured.

A mobile electronic device (such as a mobile phone, tablet or specialty radio frequency reader) can read each transmitter and confirm the compressive pressure meets a minimum value for the specific application. The sensors and mobile devices can use one communication protocol or a plurality of communication protocols including but not limited to high frequency (HF), ultra-high frequency (UHF) or Bluetooth standards. The software code or application ("MOUNTING APP") on the mobile device will collect user entered information, photographic images, the longitudinal and latitudinal location from the mobile device global positioning system sensor, the radio frequency transmitter signals including compressive pressure compliance, a unique identifier for each transmitter and any other relevant information. The information collected by the mobile device will be communicated to remote computing devices and machines using Internet protocols—either in real-time (if a network signal exists on the mobile device) or at a later time (when the network signal is available or when the mobile device is connected to an Internet connected computer).

These and other features are provided in various embodiments of the sensing, interlocking solar module system. Certain embodiments eliminate the time, cost and complexity of anchoring to roof rafters with a mounting foot that can be installed directly to the roof membrane with standard metal flashing anchored through the roof substrate (plywood sheeting).

Certain embodiments significantly reduce the number of loose parts involved in installation of a solar panel array through a factory-assembled interlocking mounting system.

Certain embodiments streamline the system design and installation process especially for smaller system sizes, giving customers an affordable small solar option through its modular, all-in-one design.

Certain embodiments use non-conductive, composite materials, eliminating the equipment grounding requirement.

Certain embodiments include mounting brackets that are designed to structurally support the frameless module eliminating special panel designs (e.g. thicker glass) intended to strengthen or stiffen the panel when the frame is removed.

Certain embodiments involve a factory-installed mounting system that simplifies the installation process reducing in field decision making, eliminating specialty skills and human error potential.

Certain embodiments eliminate the need to precisely layout and install roof connectors at the roof rafters.

Certain embodiments reduce the size of the crew involved in installing a solar array, which can be installed with one or two workers in only a matter of hours.

Certain embodiments mitigate the risk of a failed anchor installation—in which the anchor is over tightened and strips out the underlying roof substrate using a compressive pressure sensor that will confirm the physical connection meets minimum compliance levels.

Certain embodiments include a radio transmitter and pressure sensor and array installation monitor that gives installers and system owners data on their system installation that are not available today.

Certain embodiments reduce the number of roof penetrations compared to a direct attachment system since the mounting feet are shared across interlocking modules.

Certain embodiments include an anchoring mounting foot for composite shingle applications that addresses the shingle course exposure variability with an adjustable connection between mounting foot and mounting bracket, allowing the alignment of the mounting foot and the open shingle course.

Certain embodiments include a connection between the mounting bracket and mounting feet that accept the angular variation between the roof membrane and roofing plane. The mounting feet may be always adjusted to lay flat against the roof flashing to create a strong waterproofing seal and/or any angular variation is absorbed in the connector between the mounting foot and mounting bracket.

Certain embodiments create a simplified installation process which reduces worker stress and strain typical in traditional solar array installations.

Locking Mechanism (for Bracket to Bracket Couplings)

Bracket to bracket coupling is achieved when a pair of complementary bracket connectors, one protruding from each of two adjacent mounting brackets of two adjacent solar panel modules, are snapped together. That is, the coupled bracket configuration is one of stable equilibrium. This is achieved in certain embodiments by coupling a tranverse protrusion component of one of the pair of complementary mounting bracket connectors to a recess component of the other of the pair of bracket connectors. The snapping together that occurs when the protruding component centers within the recess in achieved in certain embodiments using flexible material such as a durable polymer that has a hardness that permits flexing sufficient for the protrusion component of one bracket connector to traverse the raised outer region that defines the recess of the other bracket component, by bending and thereby displacing the end of the protrusion by a distance equal to the distance between the bottom of the recess and its outer region.

The protrusion climbs the outer region of the recess in a direction transverse to the coupling direction of the brackets until the protrusion falls into the recess thereby snapping into a stable coupling configuration. In order to do that, a space is provided for the protruding component to bend or flex into during the coupling of the brackets. In order to prevent the bending or flexing to occur in reverse in an undesired bracket to bracket decoupling event, an advantageous locking mechanism is provided in accordance with certain embodiments. Nonexhaustive example embodiments are provided particularly at FIGS. 81-83. The locking mechanism is configured to be actuated, e.g., by sliding or alternatively lifting and setting or perhaps rotating, from an unlocked position to a locked position. During this actuation from unlocked to locked position, a spacer is moved into the flex space so that the protruding component cannot flex therein thereby locking the complementary bracket connectors together in a strong coupling arrangement.

In certain embodiments, a visual queue is apparent to installation personnel when the locking mechanism is unlocked (e.g., a bright colored spot or symbol) and becomes hidden or otherwise noticeably changes its appearance when the locking mechanism is locked. When the installation of all of the solar panel modules of a system or array of modules is completed, all of the locking mechanisms should be in the locked position.

The locking mechanism is only actuated back to the unlocked position when a solar panel module is to be replaced or otherwise removed from the sunlight receiving surface upon which it has been mounted. To release a bracket to bracket coupling, a pair of recesses formed in protrusion components may permit them to be squeezed with a plyer tool or the recess components may have recess that can be pulled apart with a same or similar tool, as an alternative to the pull tabs 52 described with reference to the example embodiment of FIG. 8.

Stiffeners

In certain embodiments, one or more stiffeners are mounted to the underside of each solar panel module in preassembly to support the solar panels, particularly when in certain embodiments the solar panels are frameless and therefore do not have the mechanical support that a frame could otherwise provide. The stiffeners, in alternative embodiments, are placed closer to the edges of the solar panels than is shown in the example embodiments illustrated schematically at FIGS. 31 and 39. The Stiffeners taken together form in certain embodiments a rectangular shape having same or similar perspective ratio length to width as the solar panel to which the stiffeners are mounted. Alternatively, a set of one or more stiffeners can form an other than rectangular shape, such as may be formed with more or less than four straight components as in a triangle, pentagon, hexagon, octagon, etc., or a shape including one of more curved segments or even an ellipse or partial ellipse, or a shape that is not closed such as a U, X or H shape. Moreover, the stiffeners can form a rectangular shape that has other than the same perspective ratio length to width as the solar panel to which they are mounted.

In fact, a frame is typically understood by definition to be provided at the outer edge of whatever is being framed to provide structural support, and in some cases to protect the edges from fraying or warping or being damaged by contact with the ground, a roof surface or any other object. A set of stiffeners could be placed at the edges of the solar panels in certain embodiments and in this sense function in some ways more similar to a frame than the stiffeners illustrated in the example embodiments of FIGS. 31 and 39. The advantageous stiffeners provided herein in accordance with certain embodiments are disposed away from the edges closer to the center and are mounted to the underside of the solar panels such as to not overlap the solar panel edges in either of the two flat dimensions of the solar panel.

Stiffeners perform further functions in certain embodiments. Stiffeners can be shaped in cross section to provide ease of gripping with human hands. Stiffeners may have electrical wiring clamped or otherwise coupled thereto. The cross sectional height of the stiffeners is less than the height of the mounting brackets that have mounting feet coupled thereto, so that the feet can reach, contact and be anchored via the flashing on the roof or other mounting surface during installation.

The stiffeners are metallic or otherwise conducting or semiconducting and coated with insulating material in certain embodiments. Alternatively, the stiffeners may be fabricated from durable polymeric material or another material that is electrically insulating.

Fastening Mechanism

In certain embodiments, a fastening mechanism similar to that described at U.S. Pat. No. 6,161,999, which is incorporated by reference, is used for anchoring a mounting foot to the roof or other installation surface. In certain embodiments, a snap toggle component may be rectangular or otherwise elongated such as to be configured to be rotatable after penetrating a drill hole only slightly larger than the short dimensions of the rectangular or otherwise elongated component. The rectangular or otherwise elongated component may be configured with teeth or another mechanism for gripping the underside of the roof or other mounting surface which may comprise wood. The teeth or other gripping configuration prevent the rectangular or otherwise elongated component from rotating excessively and/or otherwise causing for example damage to the underside of the roof or instability in the anchoring of the feet to the roof.

The rectangular or otherwise elongated component of the snap toggle anchoring system may include one or more components that serve to strengthen the fastening mechanism so that it can better withstand lateral or transverse forces. In one embodiments, steel threads are provided. In another embodiment, a brace is provided that serves to prevent buckling of the rectangular or otherwise elongated component. One or more elongated brace components may be coupled to the rectangular or other otherwise elongated component of the snap toggle anchoring mechanism, for example, at the interior of the "U" when the rectangular or otherwise elongated component has a U-shape cross-section or other shape that permits coupling the brace component at an empty area of the cross-section.

Flashing

The flashing may be generally rectangular and flat such as to fit under a roof shingle. The flashing may be without any holes drilled in it before placement on the roof, or a drill hole may be formed in the flashing during preassembly. The drill hole in the flashing is used for inserting the shape toggle anchoring mechanism therethrough (and through an overlapping hole in the roof) in order to secure the solar panel modules at the mounting feet to the roof. The flashing may have a dome indentation formed around the drill hole at the time of installation or in preassembly, which serves to divert water that may otherwise tend to flow down the drill hole and erode the anchoring stability that is advantageously achieved at the time of installation in accordance with certain embodiments such as the snap toggle anchoring components described above and at the U.S. Pat. No. 6,161,999 patent incorporated by reference above.

The dome shaped protrusion may be used to self-align a mounting foot during installation. That is, a mounting foot may be configured with a cutout section or other protrusion or indentation or shape in certain embodiments so that a mounting foot rests most stably in the two dimensions of the flashing when the mounting foot is aligned properly in those two dimensions with the drill hole in the flashing and roof.

Mounting feet may be tightened in coupling to mounting brackets using a foot to bracket latching mechanism such as any of a variety of known coupling mechanisms that first loosely coupled two things together followed by a step of tightening them. In one embodiment, a U-shaped cam-lock connector component is rotated to tighten the foot to the bracket. A buckling mechanism may also be used. A mounting foot may be slid across a bracket section until it reaches a latched coupling position. A mounting foot may be snap coupled to a mounting bracket, e.g., along similar general lines as the bracket to bracket snap coupling mechanism that is described above and below herein. In certain embodiments, mounting feet and coupled to mounting brackets in preassembly or at least prior to anchoring a solar panel module to a roof via one, two or four mounting feet. However, in other embodiments, mounting feet may coupled to the roof via the flashing before the mounting bracket is coupled to the mounting foot to secure the solar panel module to the roof Installed solar panel modules of a system or array may be spaced edge to edge by between 10 mm and 120 mm, e.g., 1.5 inches. The solar panels are spaced from the surface of the roof when installed between 2-12 inches, e.g., 4 inches in certain embodiments.

Wind, water and/or thermal flow blocking or shaping components may be installed along with an array of solar panel modules in certain embodiments depending on the environment and characteristics of the setting within which the solar panel modules are being installed.

Figure 81:
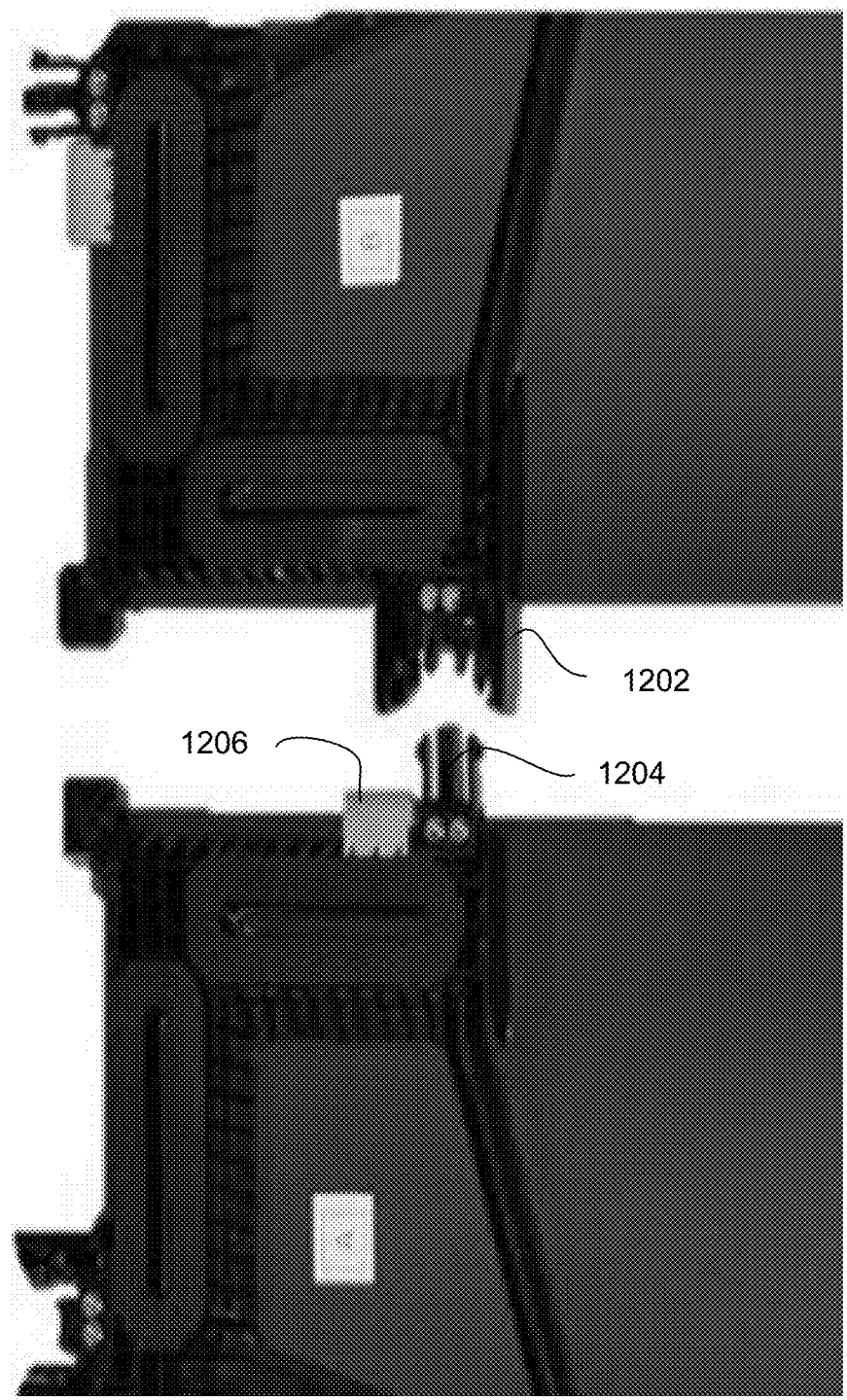
FIG. 81 schematically illustrates a pair of uncoupled solar panel bracket connectors in accordance with certain embodiments.
Figure 82:
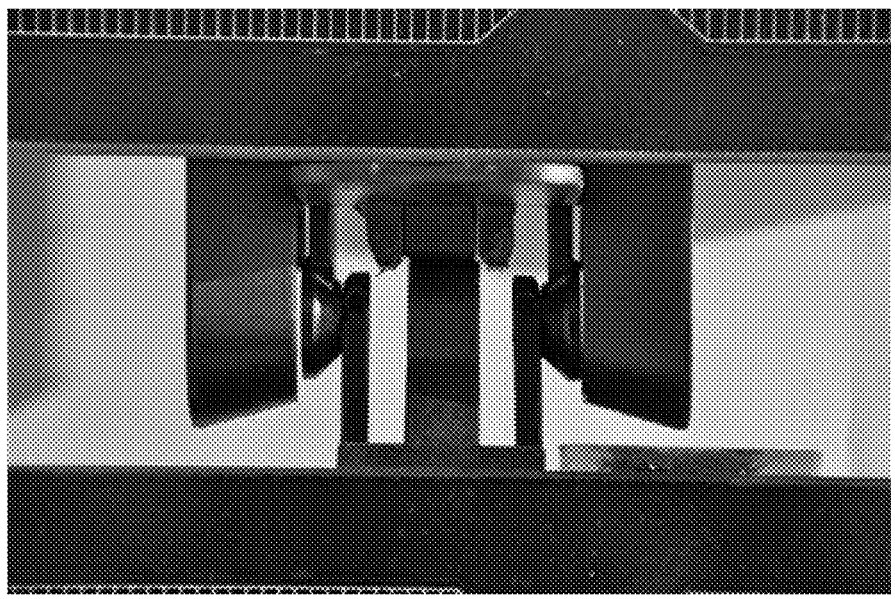
FIG. 82 schematically illustrates a pair of coupled and unlocked solar panel bracket connectors in accordance with certain embodiments.
Figure 83:
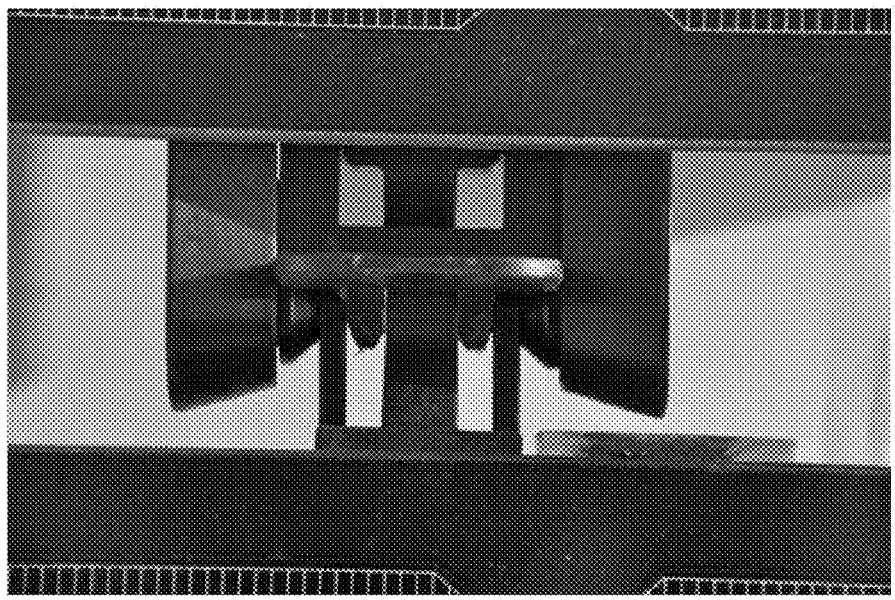
FIG. 83 schematically illustrates a pair of coupled and locked solar panel bracket connectors in accordance with certain embodiments.

The complementary bracket to bracket connector pair coupling mechanism illustrated schematically at FIGS. 81-83 in certain embodiments is configured such that brackets may be coupled together by relative movement in more than just the plane of the solar panel modules or horizontally if we take the plane of the roof as horizontal for this discussion. A bracket connector component of a next module to be installed in the array may approach the other one of the complementary pair at an angle that is less than 90 degrees to vertical and could be vertical or near vertical or any angle in between. Moreover, a solar panel module may be moved in the direction that is normal to the plane such that the bracket connectors actually slide toward their relative snap coupling positions as much as 90 degrees displaced around the closed outer region that defines the recess for one of the pair of bracket connectors and as much as 90 degrees in the opposite direction around the periphery of the protrusion component of the other of the bracket connectors that form the complementary pair. In short, adjacent solar panel modules in accordance with certain embodiments may be relatively moved toward each other in a relative direction that is any of a wide range of combinations of horizontal and vertically movements in the plane of the next solar panel module to be installed, and of movements of the solar panel module normal to the plane of the flat solar panel surface of the module.

Bumpers

Bumpers are provided in certain embodiments at each of the four corners of a solar panel module to protect the edges of the solar panel, particularly for embodiments that include frameless solar panels. The bumpers are preassembled to solar panel modules in accordance with certain embodiments to prevent edge contact with the ground or the roof or floor of the truck or other object when moving modules in transit from the factory preassembly site and during installation at roof site and for guiding bracket to bracket coupling or facilitating alignment or easing precision coupling precision requirements during bracket to bracket coupling.

There may be corner protection bumpers overlapping both edges at corners of solar panel modules in accordance with certain embodiments. These bumpers may overlap the flat top and underside surfaces of the solar panels for facilitating of stacking modules without damaging solar panel surfaces. There may be middle alignment bumpers for alignment during coupling of adjacent panels.

There may be a middle protection bumper for protection between male or protrusion connector tabs of one of the pair of complementary bracket connector components. There may also be a pair of surrounding protection bumpers for protecting female or recess connector tabs of the other bracket to bracket connector component of the complementary pair. As understood, the male or protrusion components could be switched with female or recess components inside-outside for a complementary pair and/or bracket to adjacent bracket.

FIG. 1 schematically illustrates a cross-sectional top view of a preassembled solar panel in accordance with certain embodiments. The preassembled solar panel of FIG. 1 includes a top surface that is not shown, but which is configured to receive sunlight and convert it to electrical energy or thermal energy or other energy that can be transmitted from the solar panel to a storage battery or capacitor or directly to an energy need such as a light or heat application. Four integrated mounting brackets are shown in FIG. 1.

The integrated mounting brackets are preassembled with the solar panel, integrated to the back of the solar panel at the factory, formed together with a back surface of the solar panel as a single integrated element or are otherwise coupled to the solar panel prior to coupling each of the mounting brackets to one of four spaced apart mounting feet that have previously attached or coupled to a roof surface or other structure that receives an effective amount of sunlight. Each of the mounting brackets shown in the illustrative example of FIG. 1 includes a square or otherwise rectangular base portion and certain extremities. The base portions may have other shapes such as triangular or curved. The extremities of the mounting brackets protrude outside of the rectangular extent of the solar panel. That is, if the solar panel were shown in FIG. 1, then it would cover the base portions in a top view and only the extremities would be seen in a top view.

The extremities of the interlocking mounting brackets illustrated schematically in the example embodiment of FIG. 1 include mating, complementary and/or otherwise interlocking features both left to right and top to bottom. In alternative embodiments, wherein different designs may be desired such as a linear array, then just the top and bottom or just the left and right extremities may be included. In either case, each preassembled solar panel of a solar panel array or solar energy system including two or more or several or many or any number of panels can be identically or similarly preassembled within certain tolerances and be integrable with any of the one or more other preassembled solar panels that are used to install the system.

For example, the extremity C1 of the bottom-left mounting bracket that protrudes from the bottom of the solar panel matches the recess A1, and is intended to couple with a same or similar recess in another solar panel, that is defined by two extremities protruding from the base portion of the top-left mounting bracket from the top of the solar panel in as oriented in FIG. 1 to the left and right of the recess A1. The extremity C1 has a slightly smaller height and width that the recess A1, or the material can have flexibility such as to provide snug fitting.

The protrusion D1 of the bottom-right mounting bracket that protrudes from the bottom of the solar panel likewise matches the shape of the recess B1 defined by protrusions from the top of the solar panel and from the top-right mounting bracket on either side of the recess B1 to define the recess B1. The protrusion D1 is intended to couple with a same or similar recess as B1 in another solar panel that is interlocked with the solar panel illustrated in FIG. 1.

Likewise, the protrusion B2 protruding from the right of the solar panel in FIG. 1 and from the top-right mounting bracket matches the shape and dimensions of the recess A2 defined by protrusions from the left of the solar panel of FIG. 1 and from the top-left mounting bracket. The recess A2 is defined by the two protrusions above and below the recess A2 protruding to the left from the top-left mounting bracket illustrated schematically in FIG. 1. The protrusion B2 is intended to couple with a same or similar recess as A2 in another preassembled solar panel that is substantially the same as the one shown in FIG. 1 in accordance with this embodiment.

Likewise the protrusion D2 protruding from the right of the bottom-right mounting bracket matches the shape and dimensions of the recess C2 defined by two protrusions overlapping the left edge of the solar panel of FIG. 1 from the bottom-left integrated mounting bracket. The protrusion D2 is intended to couple and interlock with a same or similar recess as C2 in a same or similar preassembled solar panel that is adjacent to the preassembled solar panel of FIG. 1 in an installed solar panel array. Likewise the recess C2 is intended to couple and interlock with a same or similar protrusion as D2 in a same or similar preassembled solar panel that is disposed adjacent to that of FIG. 1. Similarly, solar panels can be interlocked to the top and/or bottom of the solar panel of FIG. 1 in an installed array.

The interlocking features can have a variety of shapes and can have ledges or other passive features designed to snap into place and/or otherwise hold adjacent modular solar panels together at constant relative distance when interleaved properly. In certain embodiments, a locking/quick release mechanism is provided for attaching and holding down feet of various designs to the module, and for quickly releasing them in the field when not needed in installation. The advantageous design allows for variability of hold down positions in at least one orientation, wherein any of the mounting brackets shown can be adjusted up or down relative to the mounting foot to which the bottom of the mounting bracket is coupled beneath it in FIG. 1. The circular feature at the bottom of the groove in each of the mounting brackets in FIG. 1 can be slid along the groove to better fit each bracket to each mounting foot.

As will be seen, other panels may have fewer than all four mounting brackets coupled to mounting feet, particularly those that are coupled to mounting brackets of adjacent solar panels, although a mounting bracket can be coupled to both a mounting foot, that is directly coupled to a roof or other sunlight receiving structure, and one or even two mounting brackets of respectively one or two adjacent solar panels of an installed array. When a mounting bracket is coupled to two mounting brackets of two different adjacent solar panels, those solar panels are coupled to edges of the solar panel and the mounting bracket in certain embodiments that are at right angles to each other.

FIG. 1 illustrates an "X" referring to a transverse reference dimension of the interlocking mechanism assembled to or integrated with a preassembled or otherwise pre-integrated solar panel such that panels of similar specification from alternate batches and/or manufacturers are compatible for assembly into a common array within specified assembly tolerances, even when the panels themselves vary to a wider degree. The "X" length can refer to any dimension, plus or minus acceptable tolerances, for a given array specification.

Likewise, "Y" is shown as the perpendicular dimension or obverse reference dimension of the interlocking mechanism. The "Y" length can be any dimension, plus or minus acceptable tolerances, for a given array specification, and need not be at a right angle to "X". For example, solar panels can be triangular in shape, right triangular or isosceles or otherwise, such that "X" and "Y" can have 45 degree angles to each other and such that a third side of length "Z" can also be apportioned in the accounting relevant to mating the preassembled, integrated solar panel with mounting brackets in accordance with various alternative embodiments.

A sensing, interlocking solar module system in accordance with embodiments described herein has one or more or all of the following characteristics (with or without electrical micro-inverter and conductors and with or without integral radio frequency transmitters and sensors and array installation monitor).

The interlocking module combines a solar panel, and in the example embodiment of FIG. 1 four (4) mounting brackets and four (4) mounting feet. The installation scope of the interlocking module includes (a) a single solar panel or (b) a solar array (a mechanically contiguous installation of solar panels). When more than one preassembled integrated solar panel are coupled together in interlocking fashion in accordance with certain embodiments, fewer than four mounting feet may be coupled to each solar panel due to the fact that mating mounting brackets of adjacent solar panels may be interlocked. For example, a quad may include a first solar panel with four mounting brackets coupled to a roof or other sunlight receiving structure via coupling each to one of four spaced-apart mounting feet that are coupled to the roof or flashing or other material of the structure. Adjacent panels are then coupled to the first panel at orthogonal edges by interlocking two mounting brackets at each edge to the two mating brackets of the adjacent panel, instead of four mounting feet. A fourth panel can interlock at orthogonal edges of the second and third panels by interlocking one mounting bracket to a mounting bracket of each of the two panels and by interlocking another mounting bracket each to another mounting bracket of the second and third solar panels, thereby mounting only a single mounting bracket to a mounting foot, and forming a quad structure that includes sixteen (16) mounting brackets integrated with four preassembled solar panels that are coupled directly to only nine mounting feet that are installed to the roof or other sunlight receiving structure at nine spaced apart locations such as in a three by three array.

The solar panel [1] can be any type of flat solar collector, typically without a frame. Solar panel: the solar panel includes either a frameless panel type or a framed panel type.

a. Frameless panel—a solar panel manufactured with no structural frame, typically made of extruded aluminum or aluminum alloy.

b. Framed panel—a solar panel with a structural frame typically made of extruded aluminum or aluminum alloy.

Mounting brackets are structural members attached to the underside of preassembled or otherwise integrated solar panels in accordance with various embodiments described herein.

FUNCTION: The functions of mounting brackets may include the following:

a. Establish and regulate the spacing between solar modules (holding adjacent panels at constant relative distance when interleaved properly.

b. Interleaf/interconnect with adjacent mounting brackets [2] when two solar modules are placed side by side. Positive and negative bracket connection points are configured as shown.
c. Support four (4) configurations of bracket as shown in FIG. 1: The interlocking features allow connections A1 and B1 to interleaf and interconnect with connections C1 and D1 respectively, while connections A2 and C2 are configured to interleaf and interconnect with connections B2 and D2 respectively.
d. Create a strong structural connection allowing adjacent modules to share mounting feet.
e. Provide a locking, quick release mechanism [3] for attaching mounting feet of various designs for various applications. The release mechanism allows for the release for mounting feet in the field when not used for installation or when feet are attached to the fixed structure to release the module.
f. Establish an optional attachment point for micro-inverters or other power electronics as may be utilized when assembled as part of the interlocking module.
g. Allow the installation of solar modules on a sloped surface, in a portrait or landscape orientation with respect to a horizontal reference point.
h. Provide means for securing, controlling and managing electrical conductors originating from the solar panel and/or optionally an attached micro-inverter or other power electronics.

An interlocking system of mounting brackets may have their top surfaces is structurally adhered to the bottoms of solar panels, e.g., in each of the 4 corners of a rectangular module as in the example of FIG. 1. Each mounting bracket may have one or more connection points to pair with adjacent solar module mounting brackets. Each mounting bracket can interconnect to another mounting bracket on an adjoining solar module, and one, two, or more mounting brackets may be configured to interconnect to two brackets of two adjacent solar panels. Each bracket can accommodate a plurality of mounting feet for unique fixed structures, roof materials, roof configurations, and/or ground mounted applications.

Each mounting bracket may have a secure, quick release mechanism to attach to a mounting foot that has been previously coupled to a roof or other sunlight receiving structure. The quick release mechanism may be configured to allow the mounting feet to adjust in the obverse direction of the panel. The quick release mechanism may lock and be accessible from the top side of a panel.

The mounting bracket can be made from any structurally appropriate material (metal, wood, plastic, composite, concrete, stone, or the like). The result of using a non-conductive, composite material (e.g. non-metal) is the elimination of certain equipment grounding that may be typically involved when conductive materials are used to increase safety in eliminating the risk of electrical arc flash from the solar panel to an adjacent conductive material.

The dimensions of the brackets can vary depending on the specific specifications of the solar panel physical characteristics and mechanical specs. The mounting brackets therefore can take any number of shapes or configurations with different dimensions in the obverse and transverse dimensions. For example, mounting brackets could be fabricated in the following ways each with a consistent dimension between interlocking features [2]. The distance between A2 and C2 matches the distance between B2 and D2, while the distance between A1 and B1 matches the distance between C1 and D1.

The solar panel of FIG. 1 includes four (4) separate corner mounting brackets, and two (2) pairs of mounting brackets each spanning the full width of the solar panel in the transverse direction, attached to the solar panel such that the bracket interlocking features [2] have consistent geometries with respect to one another, and two (2) pairs of mounting brackets each spanning the full length of the solar panel in the longitudinal direction, attached to the solar panel such that the bracket interlocking features have consistent geometries with respect to one another in this second dimension.

One mounting bracket can be configured to span across the width and length of the solar panel with a shape that can be any geometry to span the obverse and transverse dimensions such that the bracket interlocking features [2] have consistent dimensions with respect to one another.

A mounting bracket may be integrated with or may be adhered to the bottom of the solar panel using injection molding. In other embodiments, commercially available structural adhesives, tapes, glues, cements or the like, having the appropriate structural properties for the structural loads and compatible with the material on the bottom of the solar panel may be used, and/or a flexible material like neoprene, natural rubber or other flexible material may be used.

A mounting bracket may have a quick disconnect latch that is used to couple and decouple rapidly with a mounting foot that is directly coupled to a roof or other sunlight receiving structure. This quick disconnecting mechanism is accessed from the top of a module to allow for removal or replacement of the solar panel after the mounting feet are attached to the fixed structure.

The coupling of the mounting brackets to the mounting feet that are coupled to the roof, flashing or other structure or structural material or surface that receives a significant amount of sunlight is adjustable in the plane of the roof in certain embodiments including that illustrated at FIG. 1. If the roof or other structure is sloped, then the adjustability is preferably in the direction of the slope. The coupling mechanism may be adjustable in height in accordance with later described embodiments. The coupling mechanism may also include a quick release feature such as that described below with reference to FIG. 8. In certain embodiments, a non-adjustable mounting foot may be directly coupled to the roof or other structure, either to a tile or to a flashing material or through certain material layers utilizing specialized anchoring materials in some embodiments described below. A mounting foot may have a fixed design or an adjustable foot may be fixed in place ready to receive the underside of a mounting bracket whose top surface is coupled to or integral with a bottom surface of a solar panel in accordance with various embodiments.

Figure 8:
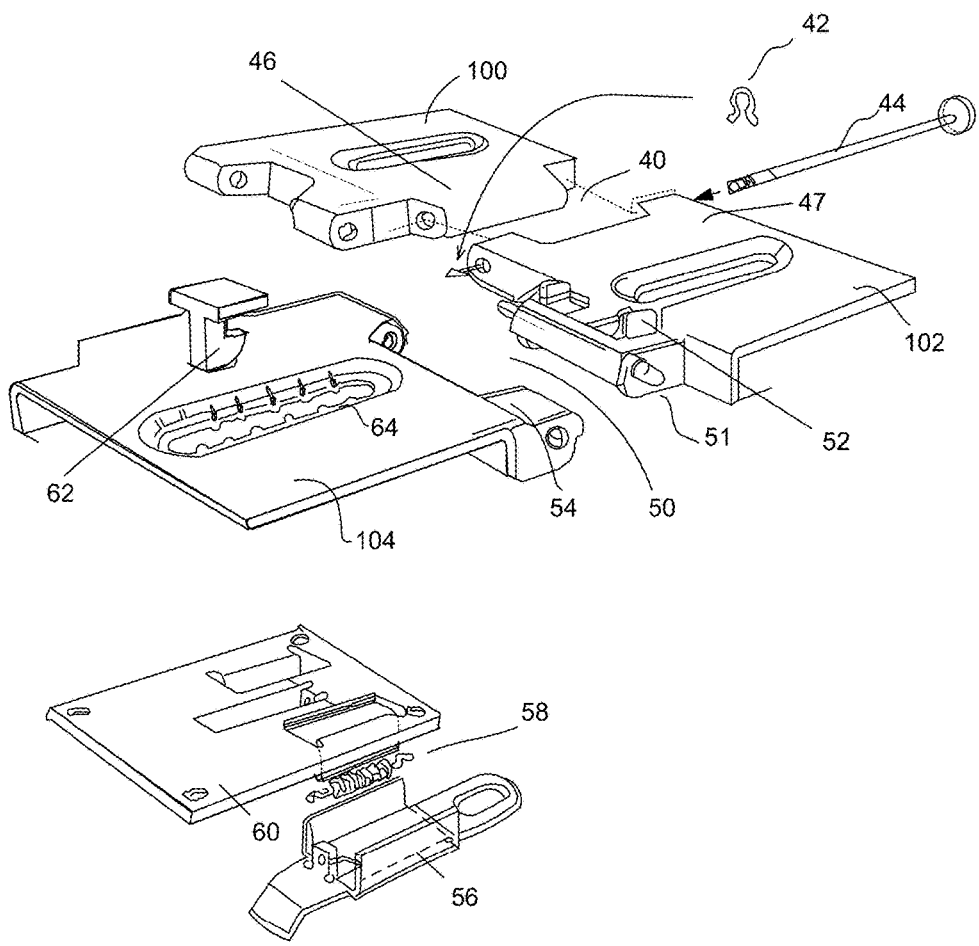
FIG. 8 illustrates an embodiment including a Mounting Bracket Assembly.

A quick release feature, such as that described in FIG. 8 or otherwise, may include a screw or other physical adjustment mechanism that is calibrated to the desired relative adjusting movement of the mounting foot and the mounting bracket.

Each mounting bracket includes one or more features designed to permit the mounting bracket to couple to another mounting bracket of an adjacent solar panel, such as by interleafing with the adjacent module bracket in such as way as to provide alignment and stability to adjacent solar panels as additional advantages to the rapid installation and rapid removability features thereby provided.

The mounting brackets have features that interlock with features of adjacent module brackets that have interleafed or otherwise have been coupled with one another. A locking mechanism can be used to secure mounting brackets together structurally and securely (to prevent theft or vandalism).

Figure 2:
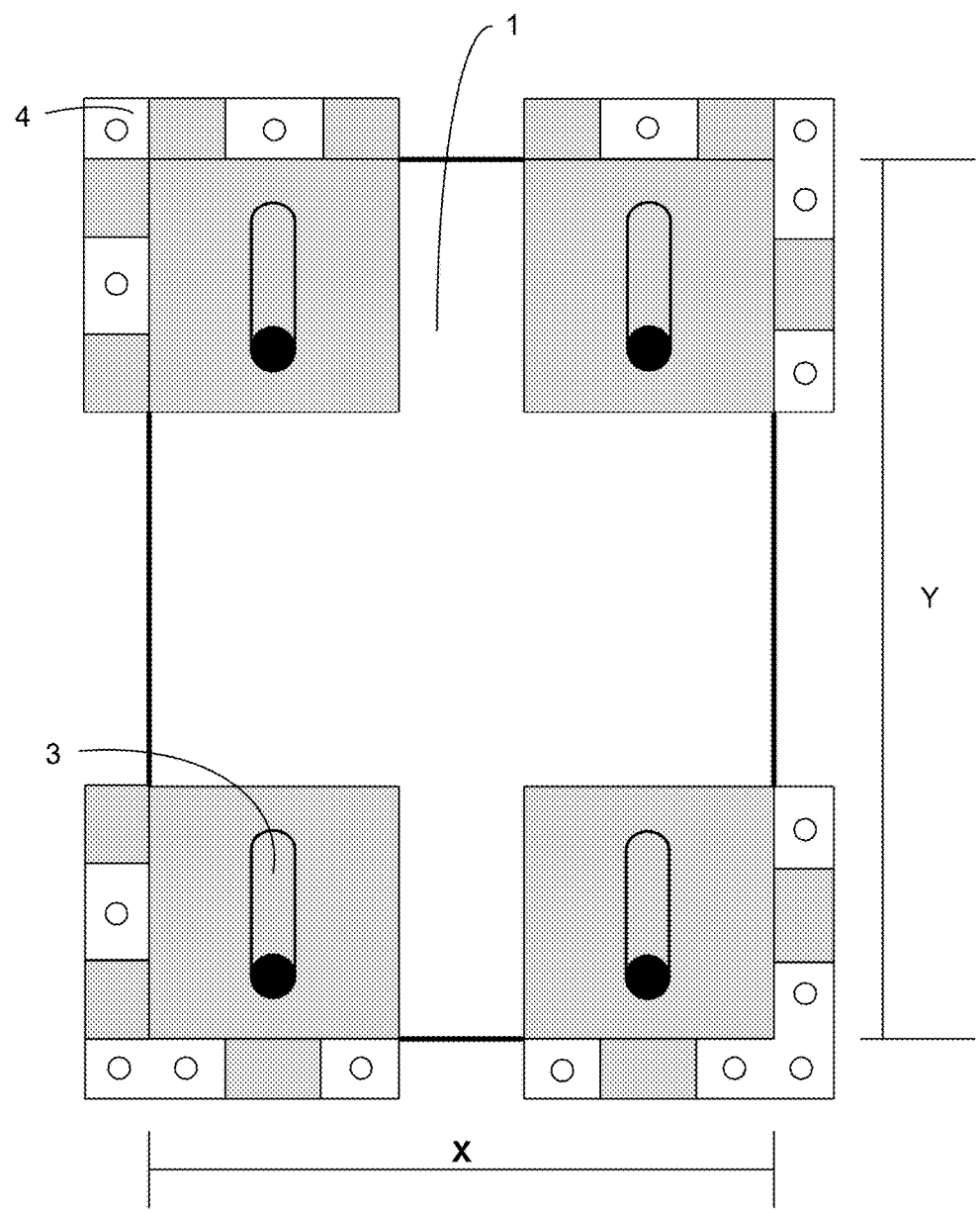
FIG. 2 illustrates an embodiment including an Interlocking mounting brackets with adjustable through hole anchoring feet for attaching solar panels securely to sloped surfaces such as residential roofs.

FIG. 2 illustrates a preassembled solar panel with integrated mounting brackets including interlocking mounting brackets with adjustable through hole anchoring feet for attaching solar panels securely to sloped surfaces such as residential roofs. FIG. 2 illustrates a solar panel with corner anchoring at extremity locations A, B, C and D at the top-left, top-right, bottom-left and bottom-right corners, respectively, of the integrated solar panel shown in top view in the example illustration. Through hole anchor points of mounting feet are shown overlapping the edges of the solar panels along the same perimeter segment as the protruding portions of the mounting brackets. The anchoring feet notably protrude beyond edge of panel to allow reach from above when the preassembled solar panel module is in place. The four interlocking mounting brackets each connect to one of four spaced-apart mounting feet for the solar panel of FIG. 2, wherein each is designed for their particular mounting application. In FIG. 2, anchoring mounting feet each have multiple through holes available for anchors to secure the feet to a fixed structure and/or roofing system. Three, four or five anchoring through-holes are shown for each mounting foot in the example of FIG. 2, while more than five may be provided that are selectively used to provide extra support if desired or needed or to provide balance.

These anchoring feet can be adjusted in certain embodiments in the obverse direction at the connection point with the mounting feet. Mounting feet anchor to the fixed structure associated with a sunlight receiving surface and connect to the underside of a mounting bracket. Mounting feet are structural members that perform specific functions depending on the type of fixed structure they are attached to.

Mounting feet are structural members and may perform the following functions (depending on the type of fixed structure the solar module or array of solar modules is being installed upon):
 a. Seals against a galvanized steel flashing (or similar reliably durable and affordable flashing material) with an integral waterproofing gasket or ring under each attachment point. Sealing material may be EPDM, butyl, butyl rubber, neoprene or the like formed into a geometry that seals around the hole in the flashing created by the anchor.
 b. Structurally connects the solar module and mounting bracket to the roof structure using one or more anchors through the anchor points; and/or
 c. Connects to the mounting bracket with a quick release mechanism [3].

A mounting foot can be made from any structurally appropriate material (metal, wood, plastic, composite, concrete, stone, or the like). The result of using a non-conductive, composite material (e.g. non-metal) is the elimination of certain equipment grounding that would otherwise be used in association with use of conductive materials.

A mounting foot can be manifested in one or more of the following ways:
 a. Anchored—contains an integral sealing compound, so that once anchored to the fixed structure, a permanent seal is created. For composite shingle roofing in accordance with certain embodiments, two mounting feet may be disposed on one end of the module and fixed in position, while two mounting feet on the other end of the module are adjustable to align with exposed courses that vary by roofing manufacturer and roofing product.

Specialty anchored feet may be used for different fixed structures and roofing systems, such as standing seam metal roofing, corrugated metal roofing, horizontal walls, and ground-mounting.
 b. Non-penetrating—designed not to penetrate the building envelope (exterior wall, roof membrane, or other water boundary of a fixed structure. For a flat roof in accordance with certain embodiments, a single mounting foot with integral ballast pan and air deflector may connect with the north edge of the solar module. This north foot will connect with an adjacent solar module's mounting bracket on its south edge. A separate single foot with a ballast pan can be attached to the south edge of the solar module.

Specialty non-penetrating feet may be used for different fixed structures and roofing systems, such as sloped roof, ground-mounted, railing, fencing and the like.

Figure 3:
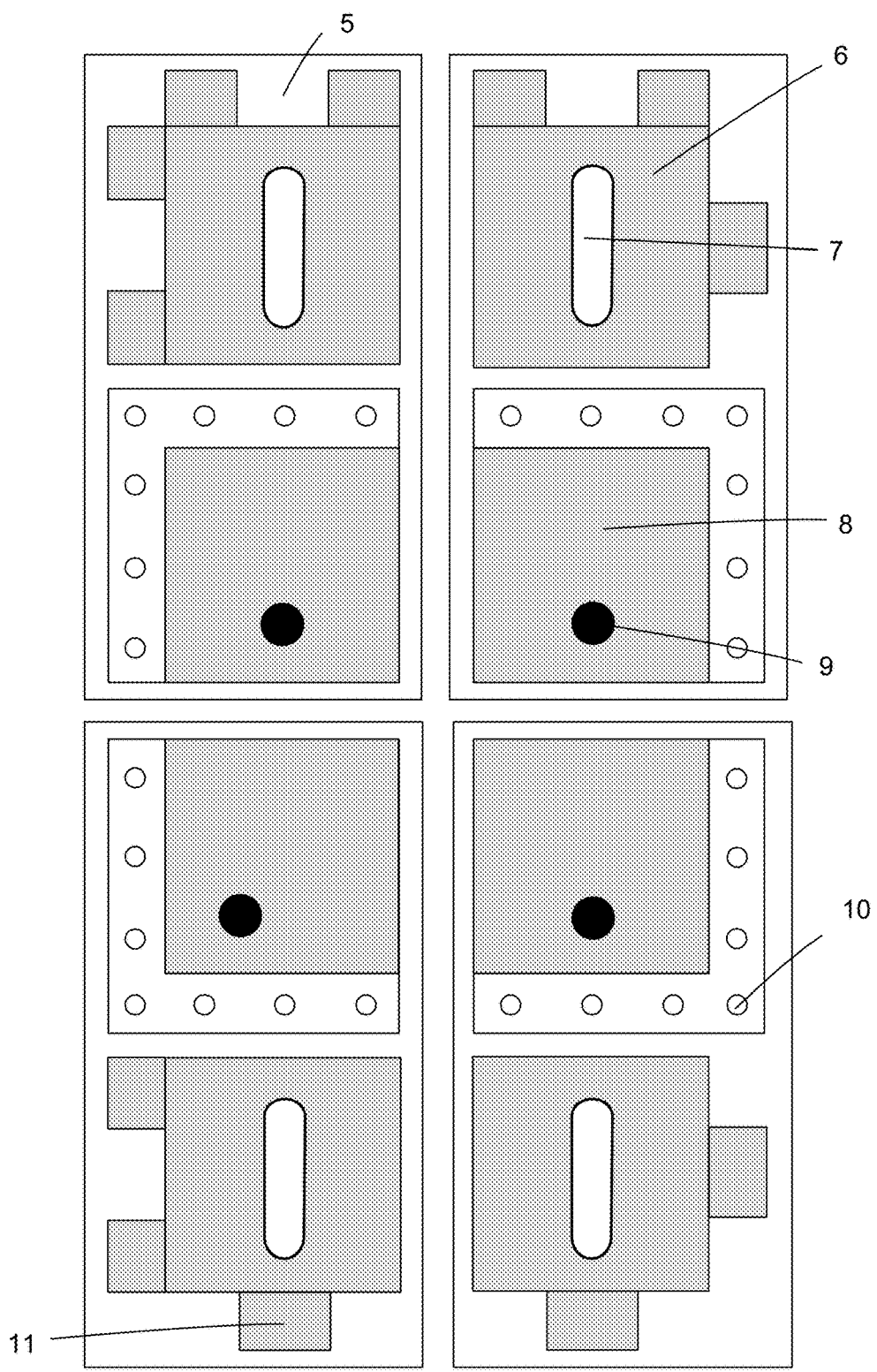
FIG. 3 illustrates an embodiment including an Interlocking Mounting System for Solar Panels mounted parallel to a sloped or non-flat application (where resistance to axial uplift and shear forces are particularly desired.

FIG. 3 illustrates an interlocking mounting system for solar panels mounted parallel to a sloped or non-flat application, where in certain embodiments, resistance to axial uplift and shear forces are particularly desirable.

A preassembled solar panel module interlocking mechanism recess 5 or negative feature 5 defined by two protruding portions to the left and right of it that is configured to couple with a protruding portion at the opposite edge of an adjacent solar panel that has the same or similar design.

A mounting bracket 6 may attach to the underside of any flat solar panel with specialty adhesive or clamping or locking mechanism or may be injection molded together with a polymeric underside of the solar panel.

The variable assembly feature or adjustment mechanism for the relative displacement of mounting brackets relative to mounting feet allows a foot to be adjust in relationship to a bracket to fit variations in mount surface structures.

An anchoring foot 8 is configured for mounting to sloped surfaces and other situations where high hold down forces may be desired or to any other sunlight receiving surface to which a solar panel may be deployed.

Mounting feet couple to mounting brackets by a locking mechanism that has a quick release feature of the type to allow ease of use and installation in field.

Through-hole anchor points 10 are shown in feet along a same perimeter segment as the mating protrusions 11 and recesses 5 for anchoring the feet at positions not overlapped by mounting bracket protrusions.

Module interlocking protruding mechanisms 11 or positive features 11 are illustrated in FIG. 3. Positive/protruding and negative/recess features of the interlock mechanism on corresponding corners of adjacent panels fit together with locking components. Locking components may be self actuating/quick release mechanism, or attachment hardware, such as a spring-loaded latch, pin, hinge or bolt.

Module Interlocking mechanism has both a negative feature [5] which accepts an adjoining positive feature [11] to successfully interleaf adjacent mounting brackets as a prerequisite to interlocking the brackets.

The mounting bracket attaches to underside of any flat solar panel (not shown) with structural adhesive or other coupling mechanism such as a screw or bolt [6].

Adjustable or variable assembly feature allows a mounting foot to adjust in relationship to a mounting bracket to fit variations in mount surface structures. [7].

An anchoring mounting foot 8 for use on sloped surfaces and other situations where high hold down forces may be desired or otherwise to secure the solar panel array to the sunlight receiving structure.

As with other mounting feet, this anchoring mounting foot attaches to the mounting bracket with a locking mechanism. The locking mechanism may be of "quick-release" type to allow ease of use during installation in field [9].

Each anchoring mounting foot has through hole anchor points ready to accept an anchor [10].

Figure 4:
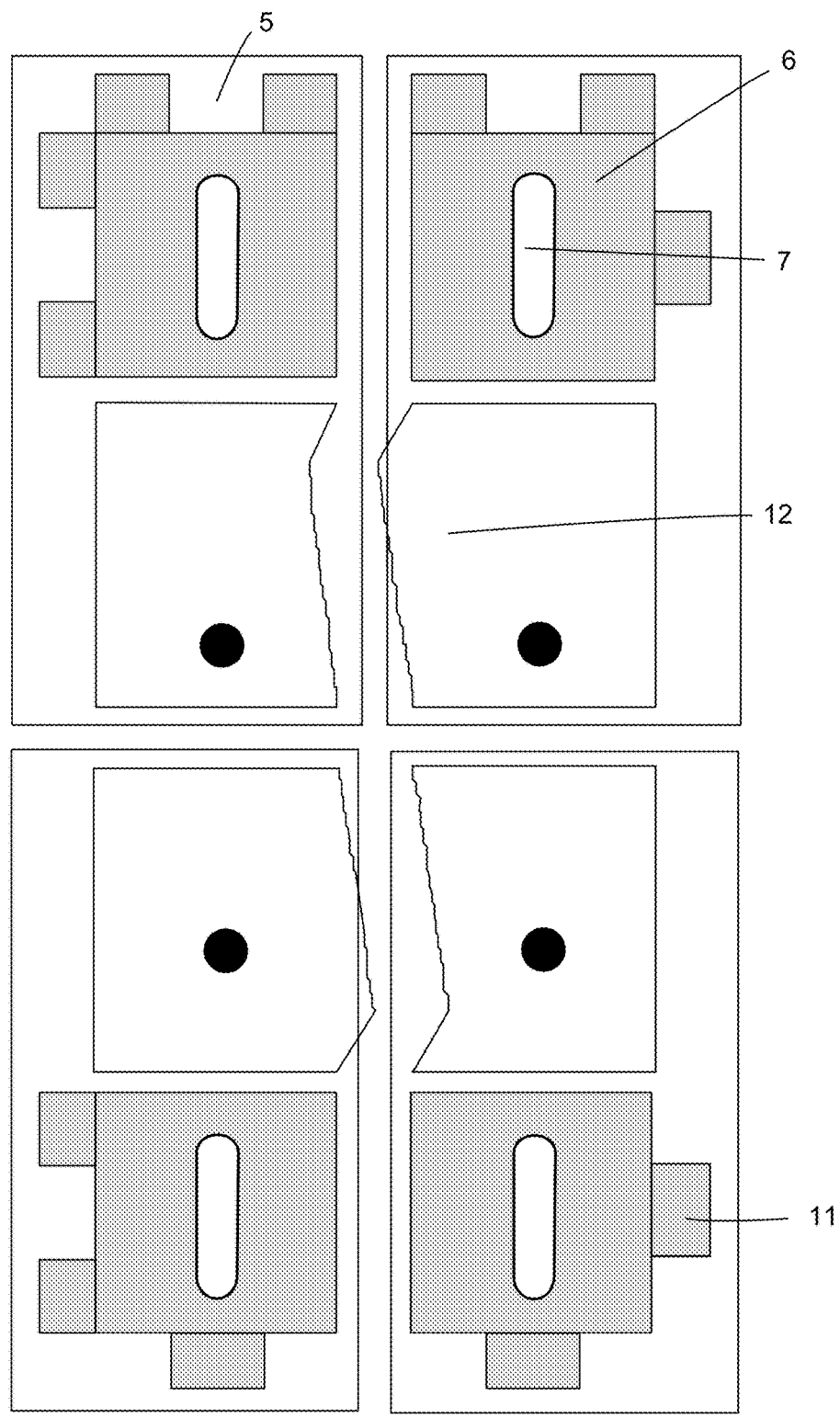
FIG. 4 illustrates an embodiment including an Interlocking Mounting System for Solar Panels mounted parallel to a flat fixed structure application (where ballast can resist axial uplift forces).

FIG. 4 schematically illustrates an example of an interlocking mounting system for solar panels that is particularly suited for mounting parallel to a flat fixed structure application, where, e.g., ballast can resist axial uplift forces. Features 5, 6, 7 and 11 have been previously described. In FIG. 4, a ballasted foot 12 is introduced that may have a hollow form filled with sand or similarly grainy material or may be fabricated from high density material, such as concrete or similar. The ballasted foot 12 may attach to a mounting bracket with a locking mechanism. The locking mechanism may be of "quick-release" type to allow ease of use/installation in field.

On flat roof structures, solar arrays may be installed without penetrating the roof membrane and/or with reduced penetration of the roof membrane. This is performed by using a ballasted mounting system. FIG. 4 shows how in certain embodiments, a unique mounting foot may be used that is designed to support ballast for a flat fixed structure application.

FIG. 4 illustrates schematically certain detailed features of the interlocking module mounting brackets and mounting feet for a flat roof application.

Module Interlocking mechanism has both a negative feature [5] which accepts an adjoining positive feature [11] to successfully interleaf adjacent mounting brackets as a prerequisite to interlocking the brackets.

The mounting bracket attaches to underside of any flat solar panel (not shown) with structural adhesive [6].

Variable assembly feature allows foot to adjust in relationship to bracket to fit variations in mount surface structures [7].

In this figure, the ballasted foot (for example, a hollow form filled with sand, concrete masonry unit or the like) attaches to the mounting bracket with locking mechanism. Locking mechanism may be of "quick-release" type to allow ease of use during installation in field [12].

Figure 5:
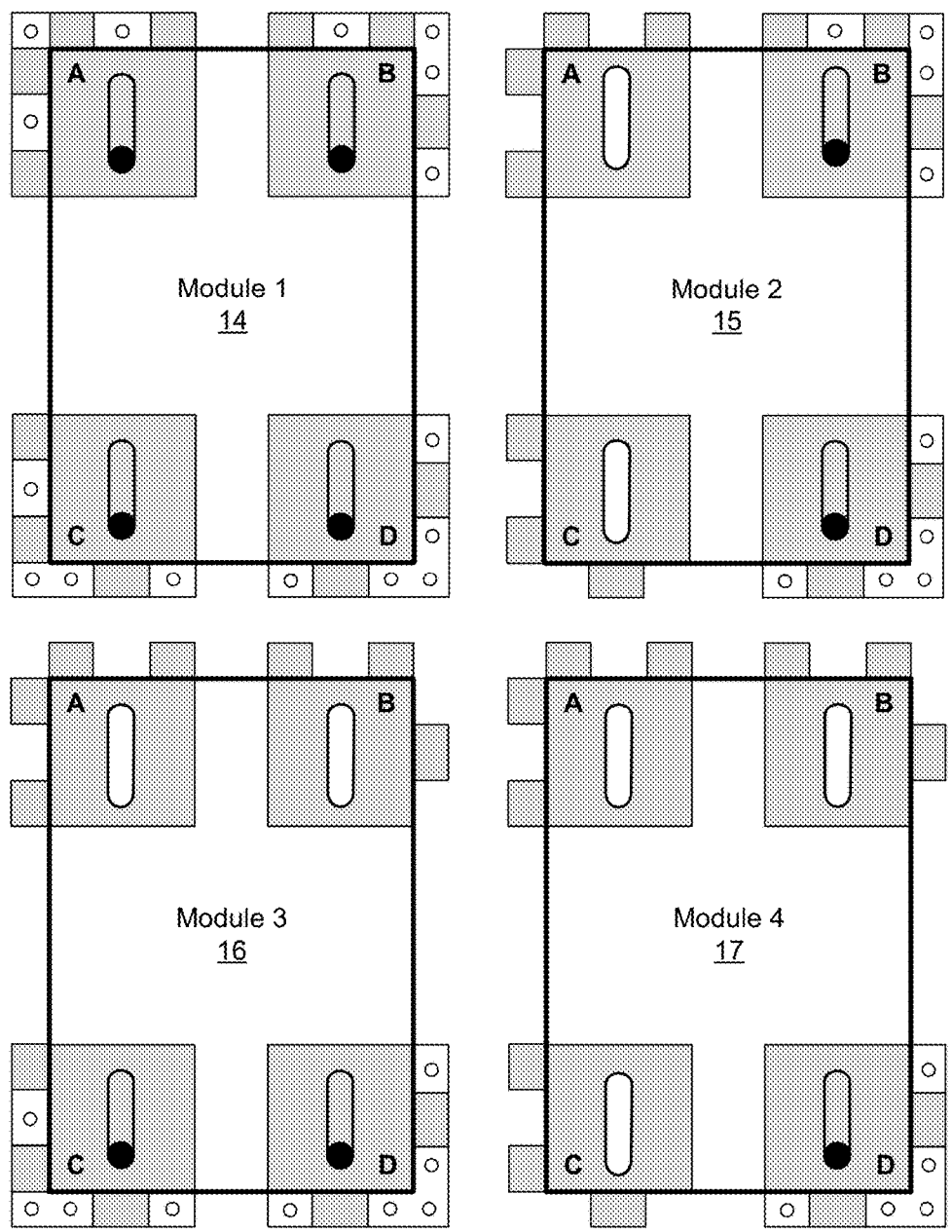
FIG. 5 illustrates an embodiment including an Module Assembly Conditions for Interlocking Mounting System for Solar Panels mounted parallel to a sloped or non-flat application (where resistance to axial uplift and shear forces are desired).

FIG. 5 schematically illustrates a module assembly conditions for interlocking mounting system for solar panels mounted parallel to a sloped or non-flat application, where, e.g., resistance to axial uplift and shear forces may be desired.

Module assembly 14 includes four (4) complete corner anchoring, interlocking and quick release mechanisms.

Module assembly 16 includes two (2) complete corner anchoring, interlocking and quick release mechanisms at location A and B, and with anchoring feet removed at locations C and D.

Module assembly 15 includes two (2) complete corner anchoring, interlocking and quick release mechanism at location B and D, and with anchoring feet removed at locations A and C.

Module assembly 17 includes one (1) complete corner anchoring, interlocking and quick release mechanism at location D, and with anchoring feet removed at locations A, B, and C.

In the assembly of an interlocking mounting system for a solar panel array on a sloped roof in which resistance to axial uplift and shear forces is desired, mounting feet can be shared between adjacent interlocked modules, reducing the quantity of roof penetrations.

FIG. 5 schematically illustrates four example embodiments in which the interlocked modules share mounting feet such that the number of mounting feet that are used to secure the solar panel array is reduced and is less than the total number of mounting brackets that are involved.

Module 1: Module assembly with 4 complete corner anchoring, interlocking and quick release mechanisms [14].

Module 2: Module assembly with 2 complete corner anchoring, interlocking and quick release mechanisms at location B and D, and with anchoring feet removed at locations A and C [15].

Module 3: Module assembly with 2 complete corner anchoring, interlocking and quick release mechanisms at location A and B, and with anchoring feet removed at locations C and D [16].

Module 4: Module assembly with 1 complete corner anchoring, interlocking and quick release mechanisms at location D, and with anchoring feet removed at locations A, B and C [17].

Figure 6:
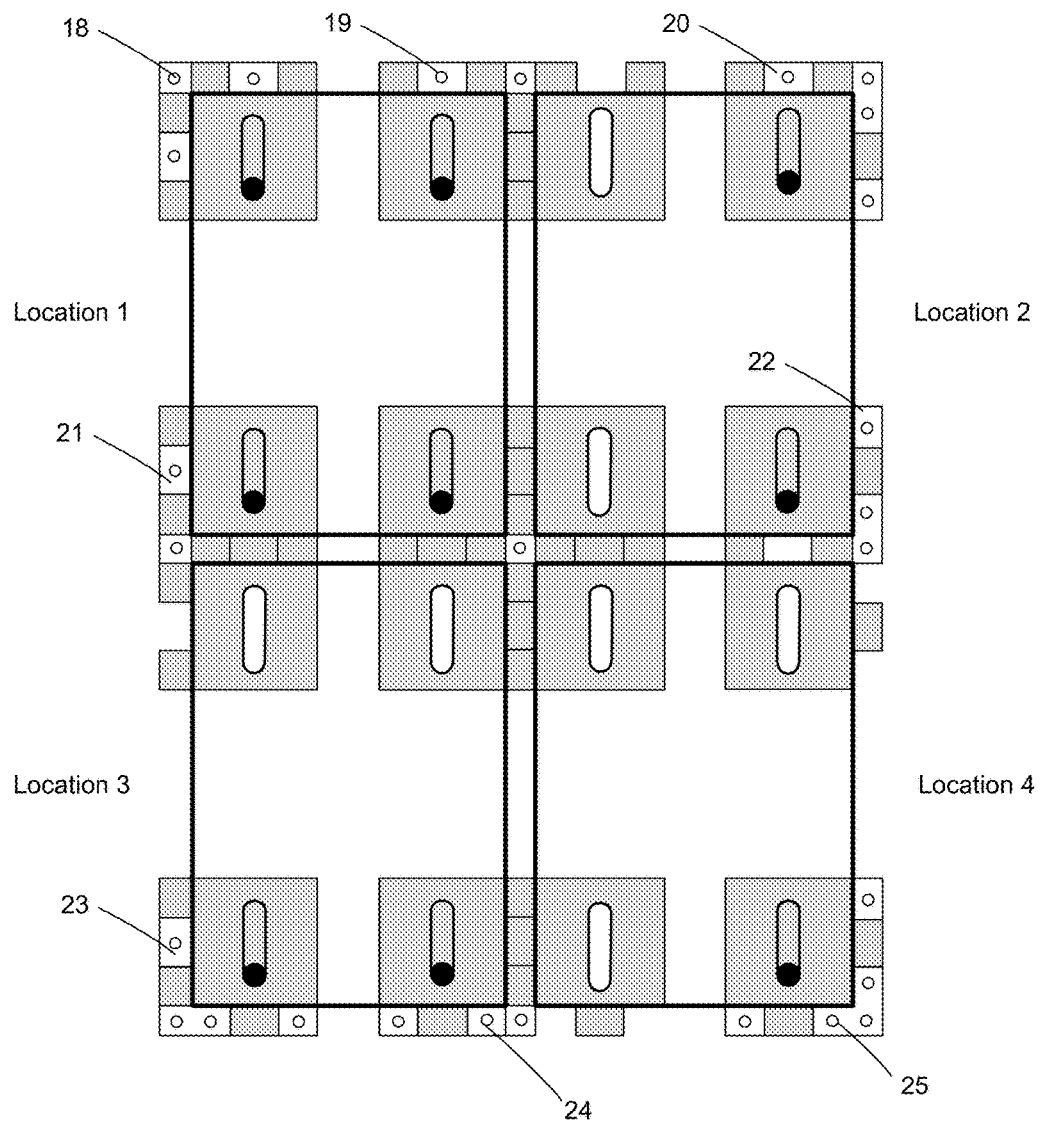
FIG. 6 illustrates an embodiment including a Composite Shingle Roof application including an array of four modules, interleafed and interlocked with corresponding adjacent modules at location 1, 2, 3 and 4, with anchoring feet in standard position.

FIG. 6 schematically illustrates a composite shingle roof application. An array of 4 modules, interleafed and interlocked with corresponding adjacent modules at location 1, 2, 3 and 4, with anchoring feet in standard position are included in the embodiment illustrated schematically in FIG. 6.

In this case, the anchoring mounting feet [18, 19, 20, 21, 22, 23, 24, 25] are disposed in standard position aligned with exposed shingle courses, and without adjustment of the mounting feet.

Figure 7:
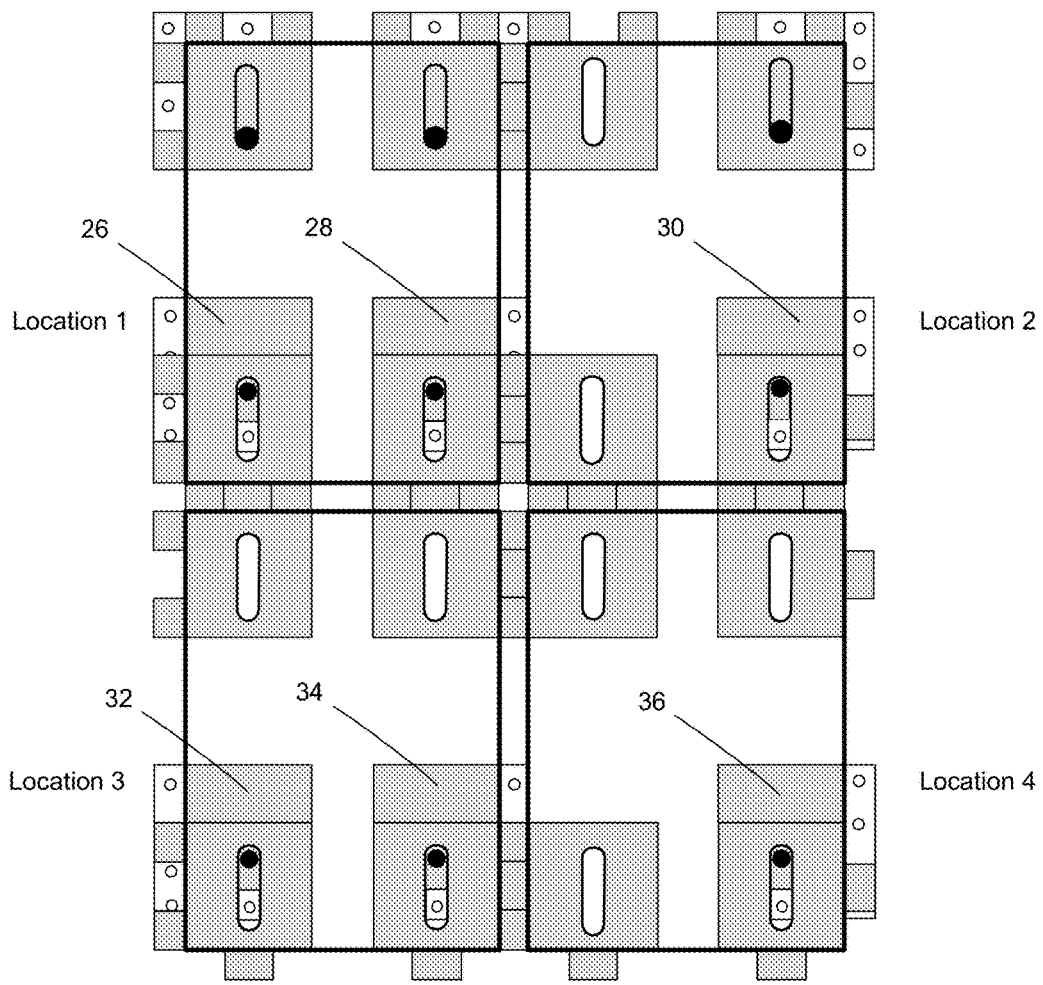
FIG. 7 illustrates an embodiment including a Composite Shingle Roof application including an array of 4 modules, interleafed and interlocked with corresponding adjacent modules at location 1, 2, 3 and 4 with anchoring feet in adjusted position.

FIG. 7 illustrates a composite shingle roof application. An array of four (4) modules is illustrated in FIG. 7. The modules are interleafed and/or otherwise interlocked with corresponding adjacent modules at location 1, 2, 3 and 4 with anchoring feet in adjusted position.

FIG. 7 shows a composite shingle roof application with an array of 4 modules, interleafed or otherwise interlocked with corresponding adjacent modules at locations 1, 2, 3 and 4, with anchoring feet in adjusted positions to align with variations in dimensions of exposed shingle courses of composite shingle type roofing materials.

In this case, anchoring mounting feet disposed in standard positions do not align well with the exposed shingle courses. The embodiments illustrated in FIG. 7 includes adjustments of the relative positions of the mounting brackets and the mounting feet in the plane of the solar panel in the obverse dimension to align with the roof coursing. [26, 28, 30, 32, 34, 36] Different manufacturers or different models of coursed roofing systems, including composite shingle roofs, shake roofing, and flat tile roofing, e.g., offer a variability in the size of their exposed courses. This adjustment in the up slope and down slope dimension allows the mounting feet to sit in the center of the exposed roofing course. This mounting foot adjustment in the up slope and down slope dimension may be utilized in certain embodiments to fit the mounting foot in the center of the exposed roof course to increase the reliability of the waterproofing between the mounting foot and the flashing or roofing system. This ability to adjust the variability of the roof coursing ensures that the mounting feet lay evenly on the roof flashing for a secure waterproofing seal under each mounting foot.

FIG. 8 schematically illustrates a mounting bracket assembly in accordance with certain embodiments.

FIG. 8 illustrates a mounting bracket assembly that includes a number of specific components, including three mounting brackets 100, 102 and 104, and connection mechanisms A 40 and B 50, among other features that will be described. Mounting Brackets 100 and 102 are configured to connect using connection mechanism A [40] which employs a hinged mechanism with an external locking pin [42] and connecting pin [44] which feeds through the positive or protruding connector feature [46] in mounting bracket 100 and negative or recess connector feature [47] in mounting bracket 102 to secure both brackets together.

Mounting bracket connection mechanism B [50] includes a hinged mechanism with connecting pins [51] internally housed in the positive or protruding connector feature. The connecting pin is spring loaded to remain in the closed position shown [50]. These connecting pins can be opened using the pull tabs [52] at the top of the positive or protruding connector feature of mounting bracket 102. In operation, the connecting pins may be fed through the negative or recessed connector feature [54] in mounting bracket 104 to create a secure connection between the adjacent mounting brackets.

A quick release mechanism in accordance with certain embodiments as illustrated in FIG. 8 includes a quick release adjustment lever [56], an adjustment lever spring [58], a quick release plate [60], and a quick release latch [62]. This mechanism makes it possible for the mounting foot to adjust with respect to the mounting bracket and to release during installation or during operations for maintenance. The ability for the Mounting Bracket to Mounting Foot connection to quickly connect and easily release provides an important feature for service workers or facility managers to easily remove a frameless interlocking module without removing or adjusting or compromising an adjacent frameless module. Mounting bracket 104 is shown with a de-tented slot [64] that allows for the quick release latch [62] to precisely adjust the quick release plate [60] (which is attached to a mounting foot). This adjustment enables the mounting feet to align and maintain a specific relationship with the roof or fixed structure.

Figure 9:
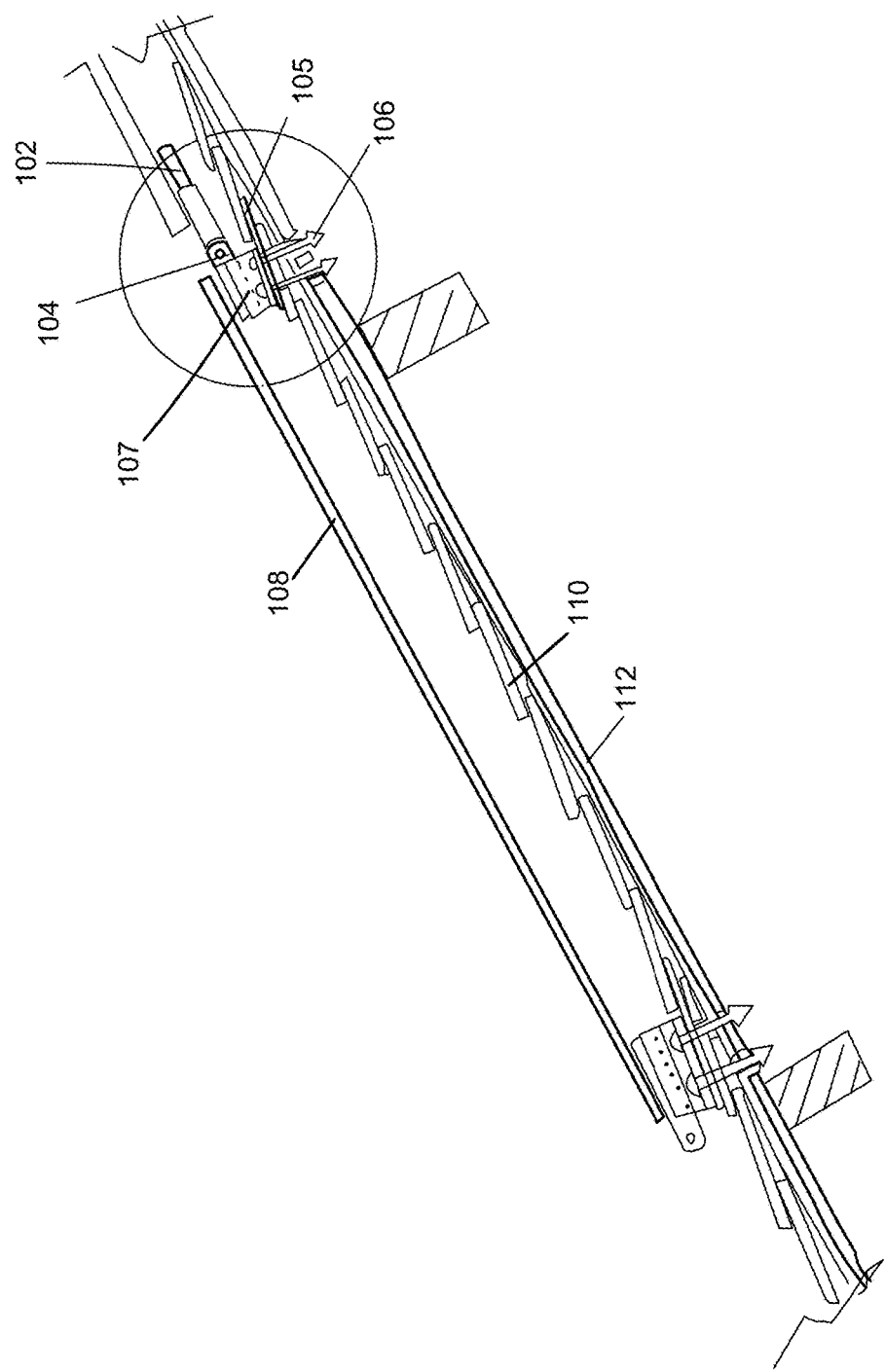
FIG. 9 illustrates an embodiment including a Side view of solar panel module.

FIG. 9 illustrates a side view of solar panel assembly in accordance with certain embodiments.

FIG. 9 illustrates a side view of a solar panel assembly setting forth an overall environment for a full assembly that is particularly configured for installation on a composite shingle roofing system.

The embodiment of FIG. 9 includes mounting brackets 102 and 104, roof flashing 105, anchors through anchoring mounting feet 106, mounting foot 107, solar panel (typical) 108, roofing material (, e.g., composite shingle or shake) 110, and roof sheeting (e.g., plywood or the like) 112. The assembly (in the circle in FIG. 9) is mounted on the roofing material with the flashing [105] serving as a base for the mounting foot [107] and the mounting brackets [102] and [104]. The solar panel [108] is adhered to the top of the mounting bracket [104]. The anchors
are securing the mounting foot [107] by penetrating the flashing [105], the roofing material
and roof sheeting [112].

Figure 10:
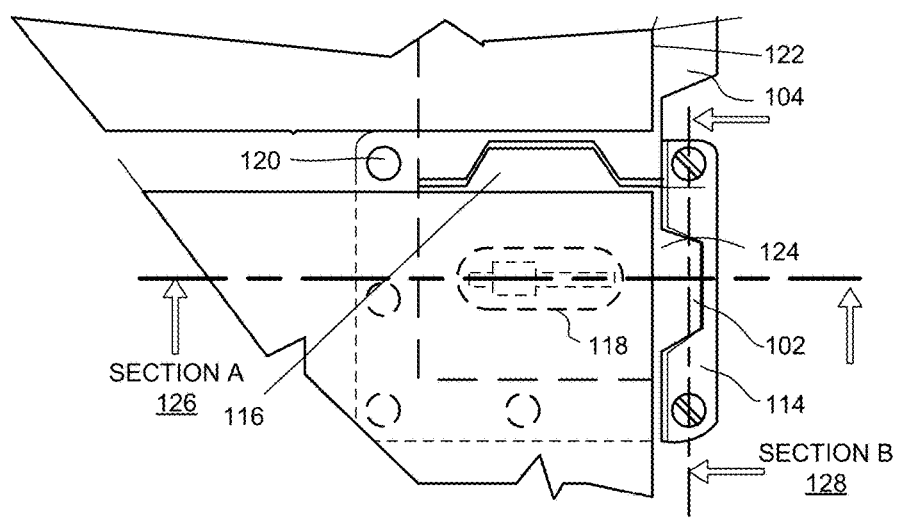
FIG. 10 illustrates an embodiment including a Plan view of solar panel module assembly.

FIG. 10 illustrates a plan view of solar panel assembly in accordance with certain embodiments. FIG. 10 illustrates a mounting bracket and a mounting foot assembled under a solar panel in accordance with certain embodiments.

The mounting bracket and mounting foot assembly illustrated in FIG. 10 includes a solar panel [122] and adjacent solar panel [124], and mounting brackets [104 and 102] that are interlocked at bracket connection point [116].

Mounting foot [114] is shown in FIG. 10 under solar panel [124] with dashed lines indicating shape and features of a mounting foot not otherwise visible from above the solar panel.

Quick release assembly [118] is shown under solar panel [124] with dashed lines indicating shape and features of a mounting foot not otherwise visible from above the solar panel.

Through hole anchor point [120] is shown visible between the solar panels 122 and 124.

SECTION A [126] cuts through the assembly in the midpoint.

SECTION B [128] cuts through the assembly through the anchor points of mounting foot [114].

Figure 11:
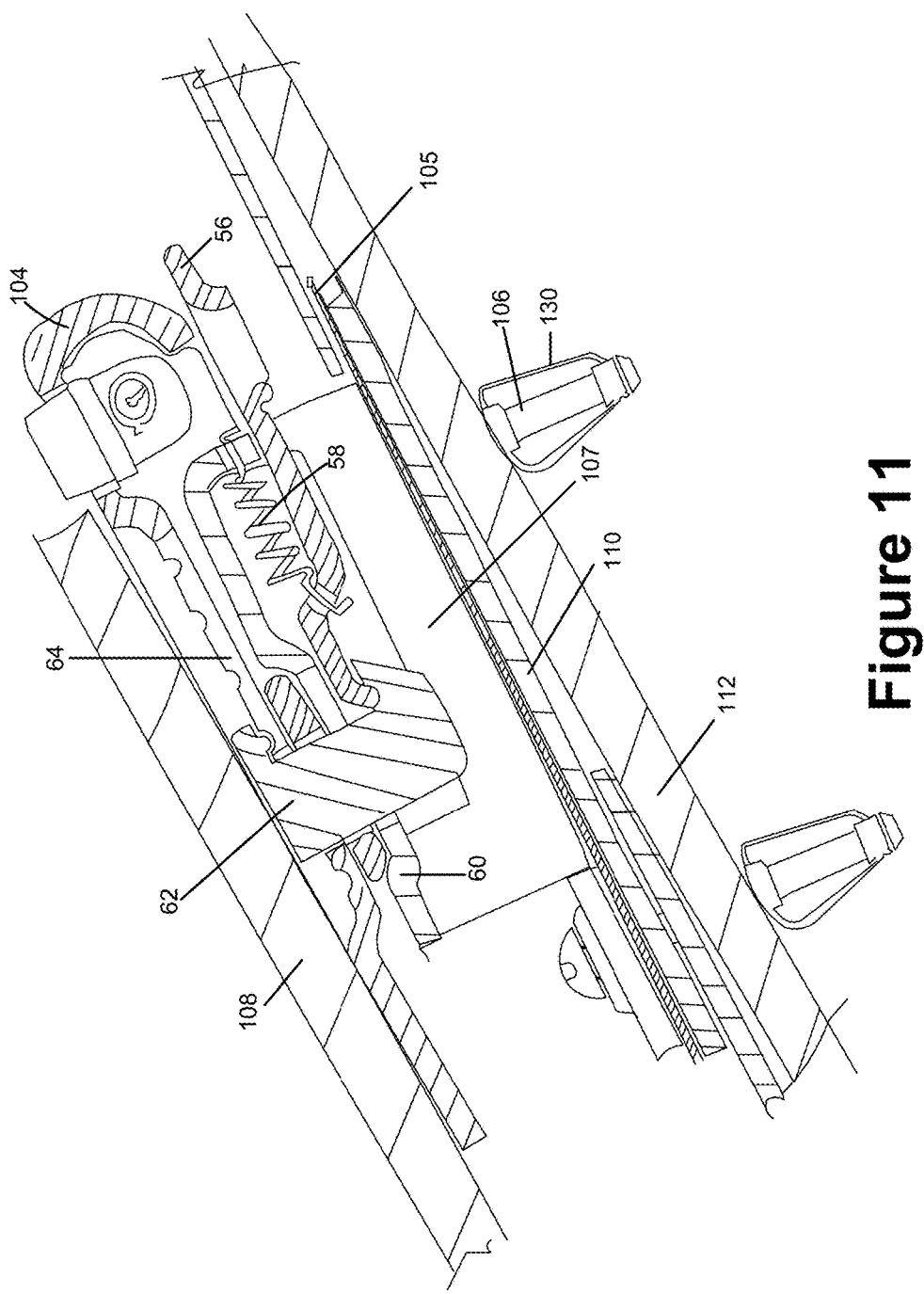
FIG. 11 illustrates an embodiment including a cross section view Section A—Section through Full Assembly.

FIG. 11 illustrates a cross-sectional view along section A of FIG. 10. FIG. 11 illustrates mounting bracket 104, roof flashing 105, anchors through anchoring mounting feet 106, mounting foot 107, solar panel 108, roofing material (e.g., composite shingle or shake) 110, and roof sheeting (e.g., plywood or the like) 112, The assembly is mounted on the roofing material [110] with the flashing [105] serving as a base for the mounting foot [107] and the mounting bracket [104]. The solar panel [108] is adhered to the top of the mounting bracket [104]. The anchors [106] are securing the mounting foot [107] by penetrating the flashing [105], the roofing material [110] and roof sheeting [112].

The anchors [106] may be uniquely designed to provide strong pull out resistance by employing hollow wall anchor features [130] in which the anchor expands due to force exerted on the head of the anchor by the installation tool (e.g. a drill, screwdriver or other such device). The anchors [106] may also have features on the tip of the anchor to automatically drill a starter or pilot hole as the anchor is being rotated by the installation tool.

The section illustrated by FIG. 11 also includes a quick release mechanism including the quick release adjustment lever [56], the adjustment lever spring [58], the quick release plate [60], and the quick release latch [62]. This mechanism makes it possible for the mounting foot to adjust with respect to the mounting bracket and to optionally release during installation or during operations for maintenance.

The mounting bracket 104 includes a de-tented slot [64] that allows for the quick release latch [62] to precisely adjust the quick release plate [60] (which is attached to a mounting foot). This adjustment enables the mounting foot to align and maintain a specific relationship with the roof or fixed structure.

Figure 12:
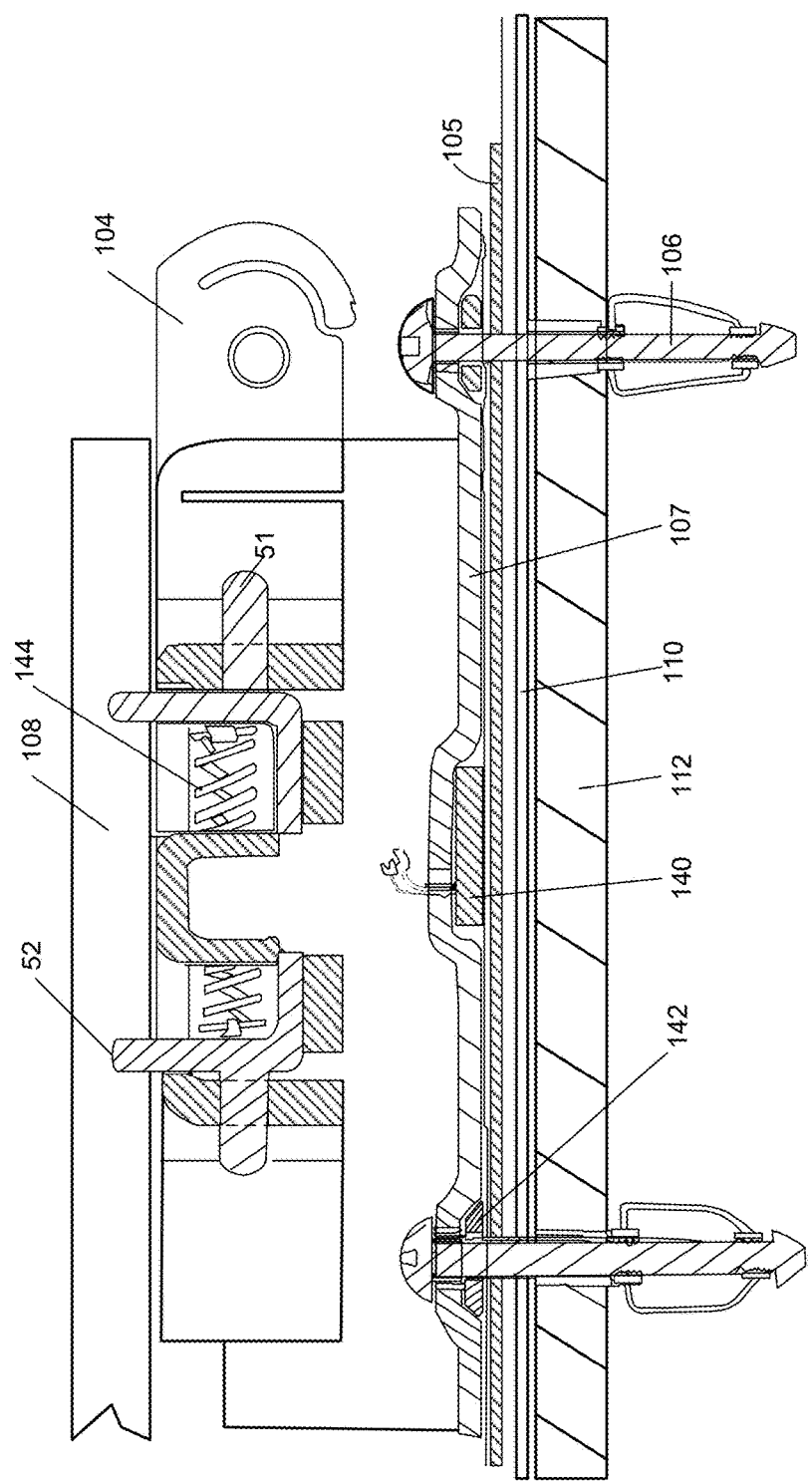
FIG. 12 illustrates an embodiment including a cross section of a solar panel module, Section B—Section through Full Assembly.

FIG. 12 illustrates a cross sectional view through Section B of FIG. 10. FIG. 12 includes mounting bracket 104, roof flashing 105, anchors through anchoring mounting feet 106, mounting foot 107, solar panel 108, roofing material (e.g., composite shingle or shake) 110, and roof sheeting (e.g., plywood or the like) 112.

The solar panel assembly is shown in FIG. 12 mounted on the roofing material [110] with the flashing [105] serving as a base for the mounting foot [107] and the mounting bracket [104]. The solar panel [108] is adhered to the top of the mounting bracket [104]. The anchors [106] are securing the mounting foot [107] by penetrating the flashing [105], the roofing material [110] and roof sheeting [112].

The section illustrated in FIG. 12 includes mounting connection B (from FIG. 8) which is a hinged mechanism with connecting pins [51] internally housed in the positive or protruding connector feature. The connecting pin is spring loaded [144] to remain in the closed position shown. These connecting pins [51] can be opened using the pull tabs [52] at the top of the positive or protruding connector feature of mounting bracket 102. In operation, the connecting pins will feed through the negative or recessed connector feature in an adjacent mounting bracket to create a secure connection between adjacent mounting brackets.

FIG. 12 also details the waterproofing material [142] that protects the holes penetrating the flashing [105] and the roofing material [110] from water infiltration. The waterproofing material is installed or adhered under each attachment point on the mounting foot [107] in the factory as a gasket or ring or reservoir of sealing material. Sealing material may be EPDM, butyl, butyl rubber, neoprene or the like formed into a geometry that seals around the hole in the flashing created by the anchor.

FIG. 12 also describes an optional mounting foot radio frequency transmitter and sensor assembly [140]. These "mounting sensors" 140 are electronic measuring devices that measure one or more physical characteristics of the bottom surface of the mounting foot (such as compressive pressure) and transmit that information along with other relevant information using wireless radio frequencies to a receiver. These mounting sensors [140] are attached under the mounting feet such that they may read the compressive force between a mounting foot and a roof flashing.

A mounting sensor [140] may be located on the bottom of, or otherwise below, a mounting foot, adjacent to an anchor point holding the mounting foot to the structure. The sensor 140 may be a ring-shaped sensor (e.g., round with an open middle area) that is positioned such that the anchor penetrates through the opening, like a bolt through a washer. The water proofing material sealant gasket (EPDM, butyl or buytl rubber, neoprene) may be disposed interior or exterior to the sensor ring. The mounting foot may be located under the solar panel. Alternatively, the mounting sensor [140] may be located adjacent to the anchor points but not as a ring around each anchor.

Each sensor may be passive, i.e., without an internal power source, e.g., without a battery, or may include a battery-assisted passive circuit, i.e., having a battery to increase the signal strength of the sensors.

The mounting sensors 140 may use advanced radio frequency identification (RFID) technology including but not limited to ultra high frequency (UHF), high frequency, Bluetooth standard or other applicable communications protocol for transmitting their pressure (or other readings) and their unique identifier.

Figure 13:
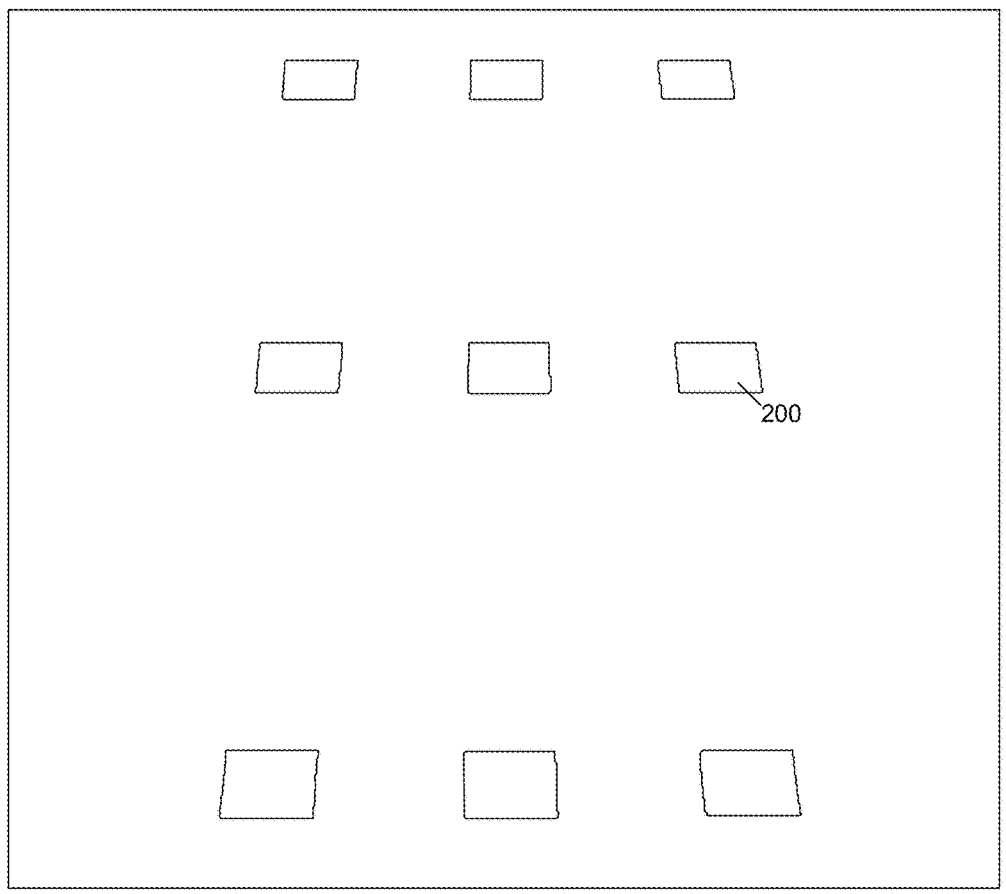
FIGS. 13-30 illustrate an embodiment including an Interlocking Module system installation process.

FIG. 13 illustrates an interlocking module system installation process, wherein an initial step, or step 0, involves installing or exposing flashing areas for securing mounting feet. Certain installation work-flows are advantageously provided for solar panels in accordance with certain embodiments including "Process One" (P1).

The assembly of a solar module, an integral mounting bracket and attached mounting feet (with or without a micro-inverter) may be referred to herein as an "interlocking module".

At Step 0: install appropriate flashing [200] at the attachment points for the interlocking modules using a provided guide with dimensioned flashing locations depending on the type of fixed structure and roofing type.

Figure 14:
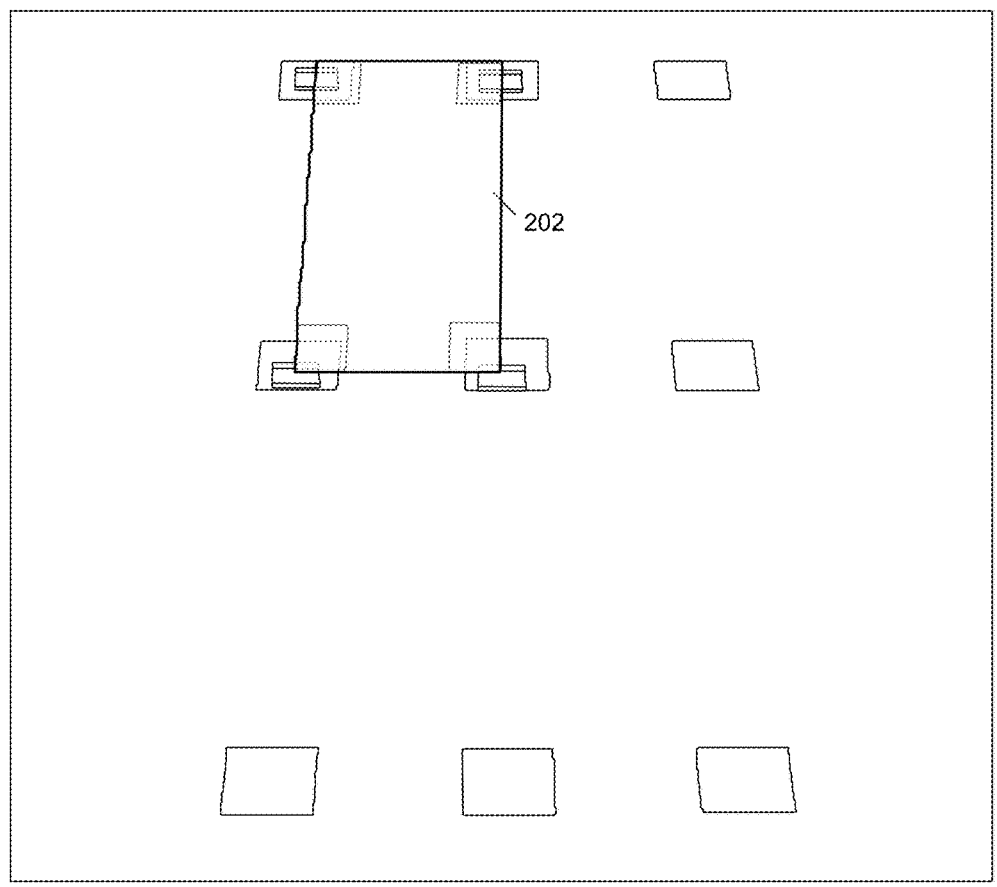

FIG. 14 illustrates Interlocking module system installation process—Step 1.

Step 1: Install first interlocking module in the first row [202]. Be sure to install in a location which allows for future expansion. Once in the correct location, anchor each mounting foot with the provided anchors.

Figure 15:
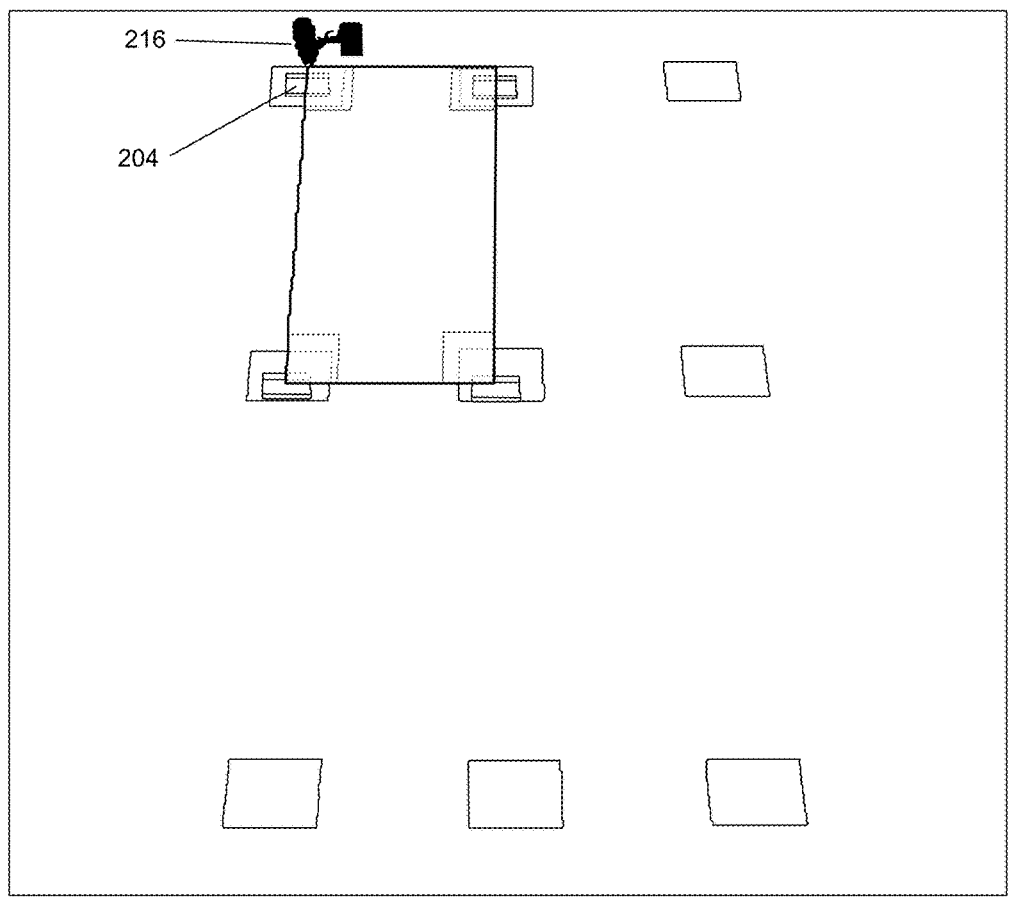

FIG. 15 illustrates Step 1a of the process.

Step 1a includes installing an anchor through mounting foot A [204] with the provided anchors [216].

Figure 16:
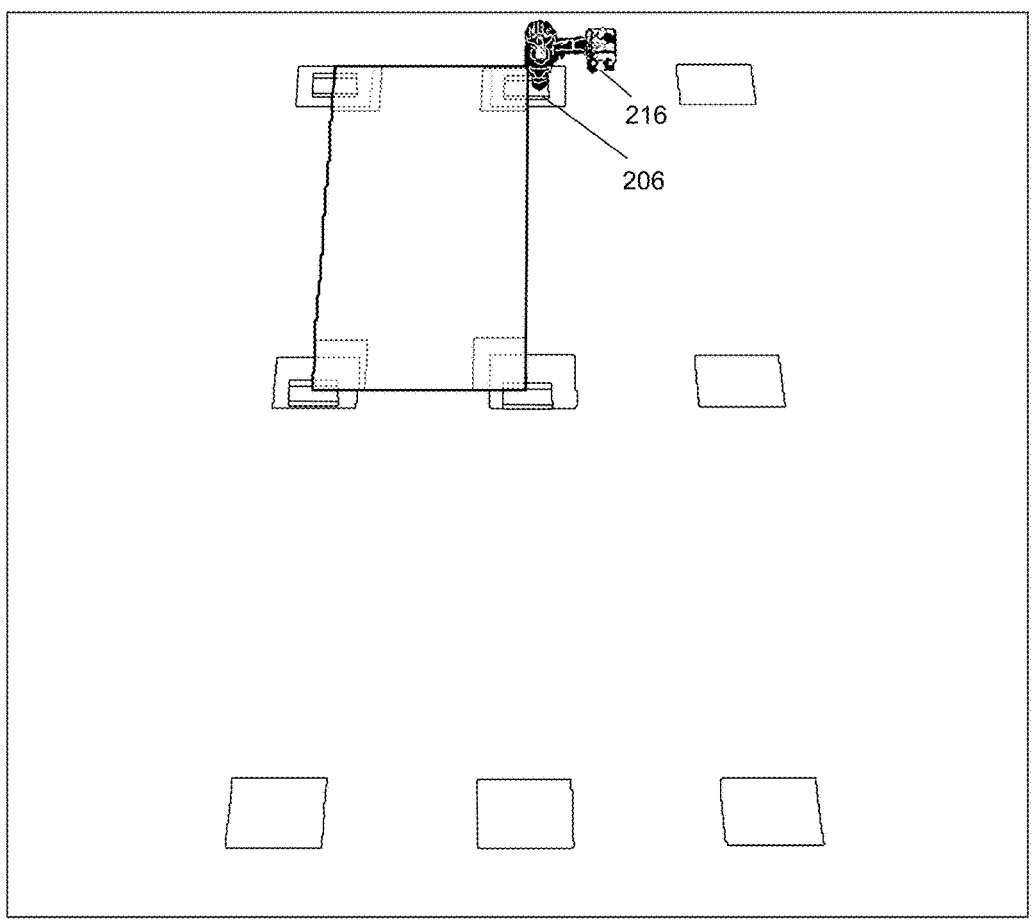

FIG. 16 illustrates Step 1b of the process.

Step 1b includes installing an anchor through mounting foot B [206] with the provided anchors [216].

Figure 17:
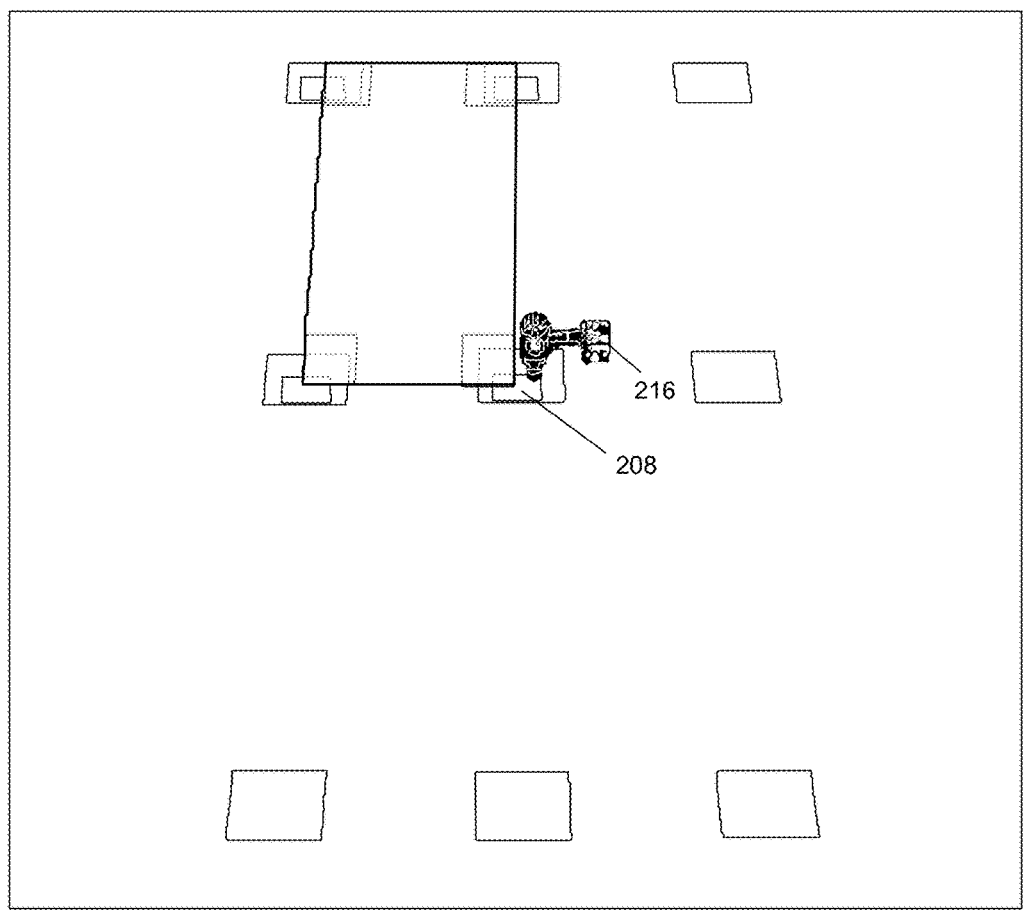

FIG. 17 illustrates Step 1c of the process.

Step 1c includes installing an anchor through a mounting foot D [208] with the provided anchors [216].

Figure 18:
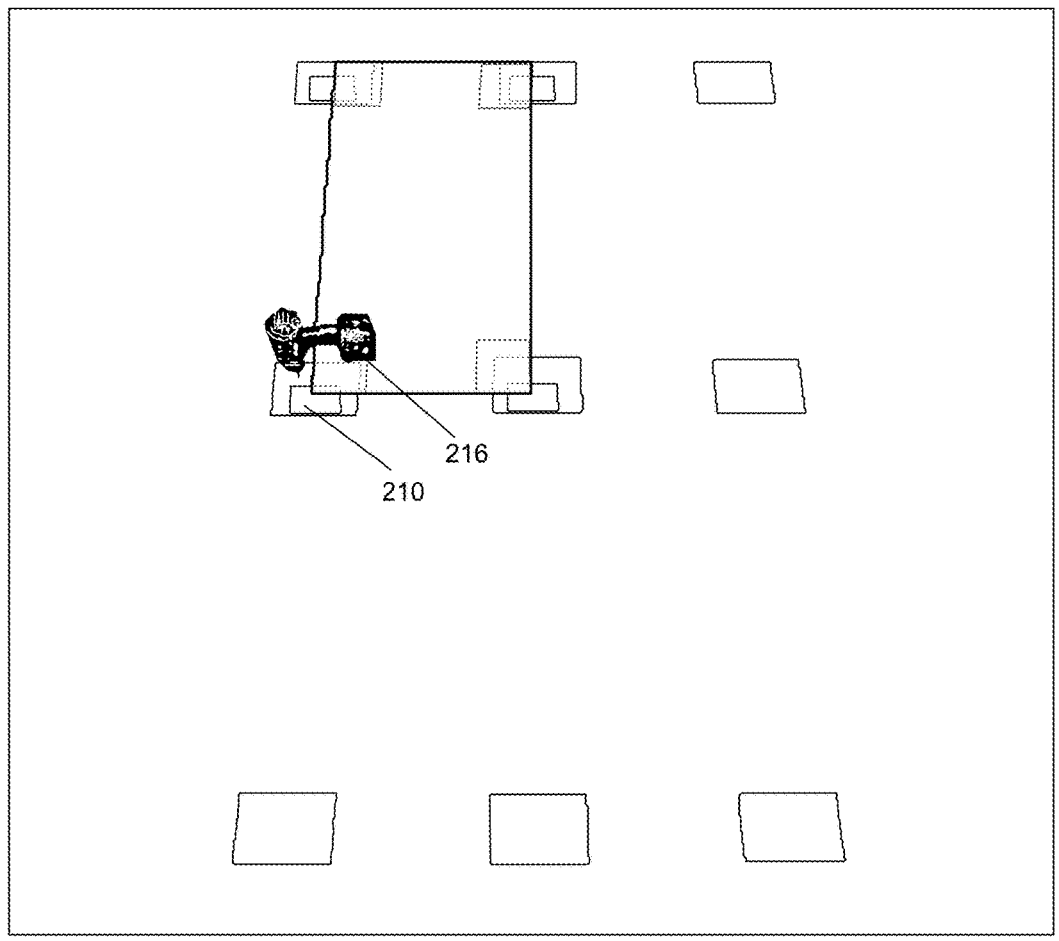

FIG. 18 illustrates Step 1d of the process.

Step 1d includes installing an anchor through mounting foot C [210] with the provided anchors [216].

Figure 19:
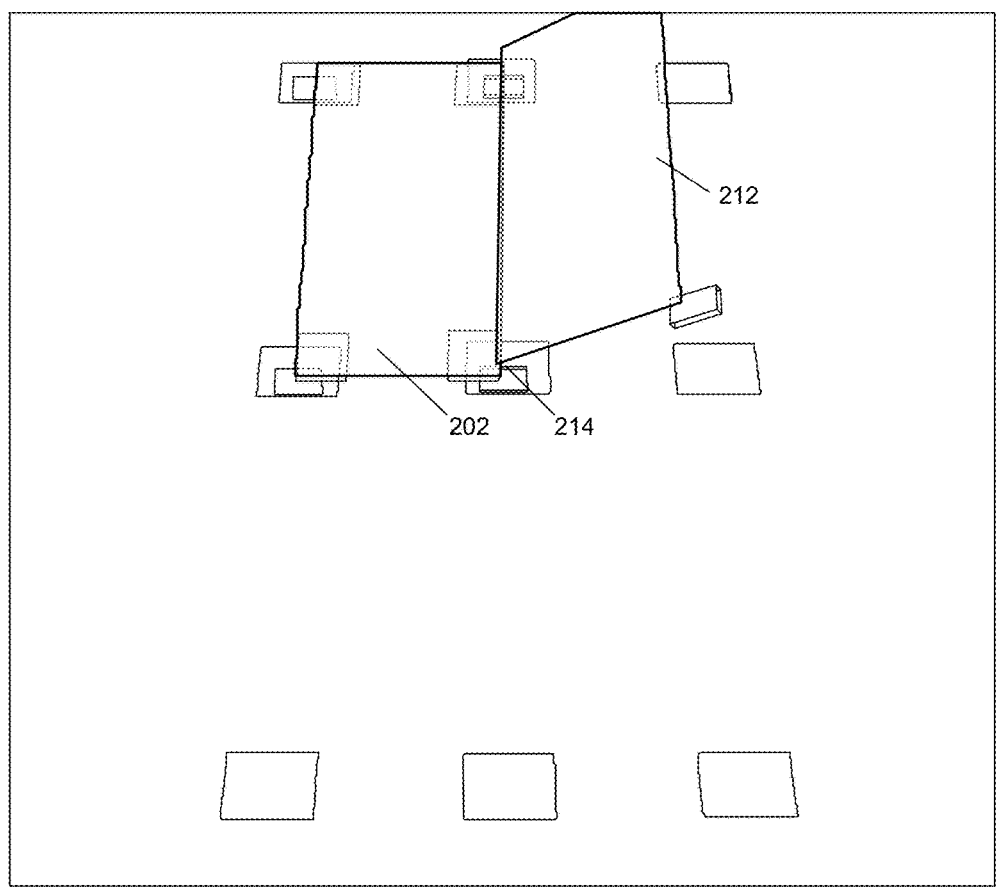

FIG. 19 illustrates Step 2a of the process.

Step 2a includes installing second interlocking module [212] in the first row. Step 2a may involve inserting one edge of interlocking module two [212] into mounting bracket connection point [214] in interlocking module one [202] and connecting the solar panel electrical conductors (not shown) from the first interlocking module and the second interlocking module.

Figure 20:
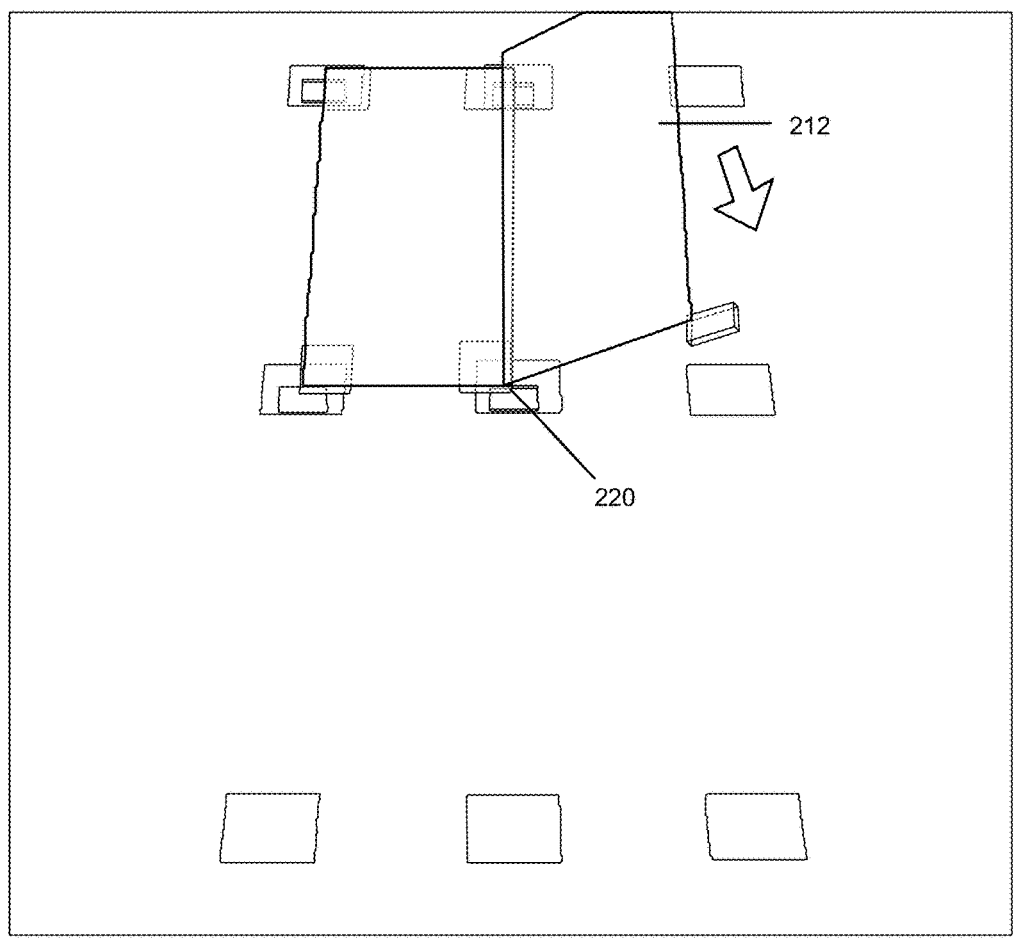

FIG. 20 illustrates Step 2b in the process.

Step 2b includes lowering the other edge of the second interlocking module [212] for the mounting feet to rest on the flashing, and pivoting at the connection point [220] between the two pair of mounting brackets.

Figure 21:
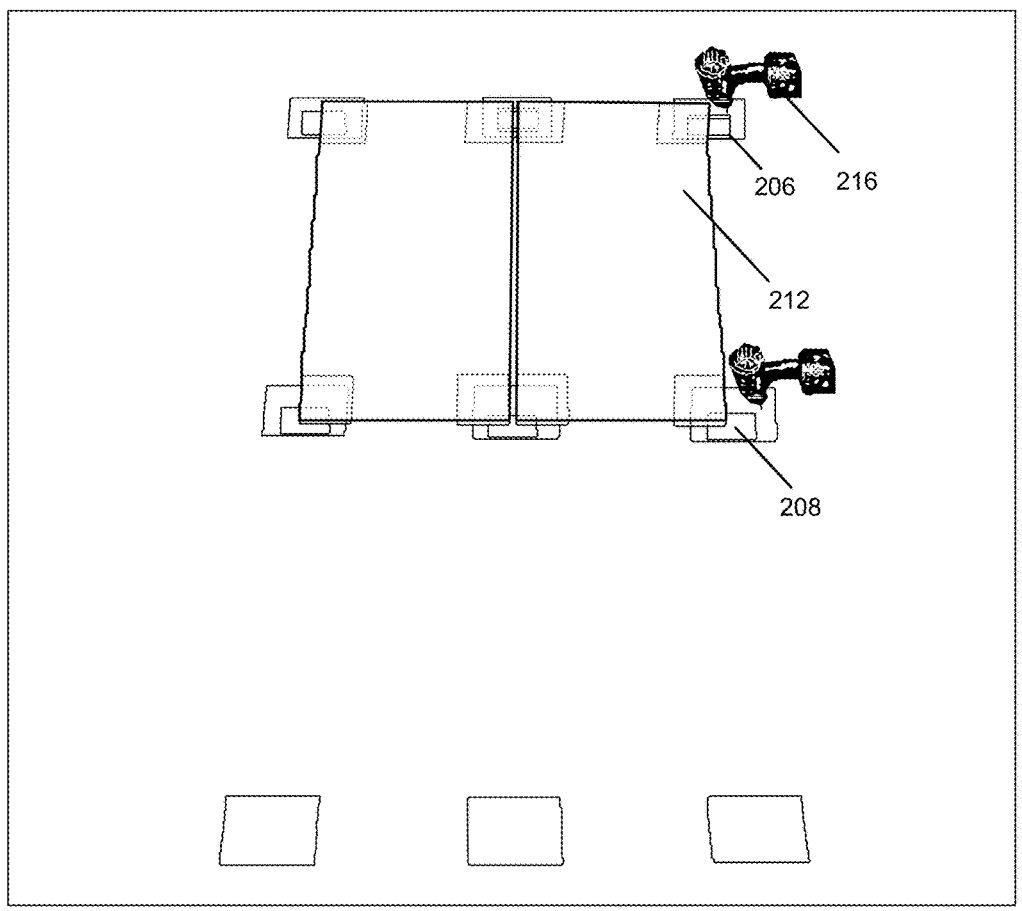

FIG. 21 illustrates Step 2c of the process.

Step 2c illustrates anchoring two mounting feet on the opposite edge of the module 212 from the first interlocking module with the provided anchors [216], and Installing an anchor through mounting foot B [206] and installing an anchor through mounting foot D [208] as shown.

Figure 22:
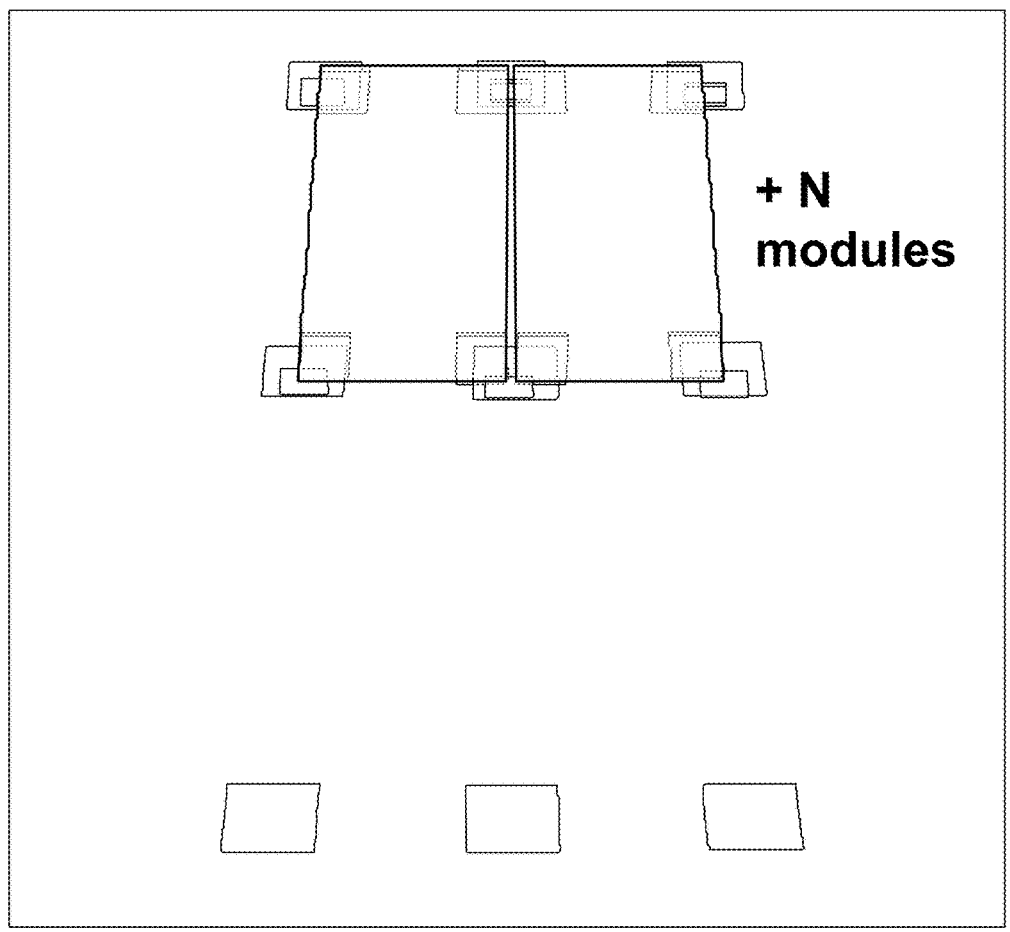

FIG. 22 illustrates Step 3 of the example solar panel installation process.

Step 3 includes repeating Step 2 N times, where N=the number of modules to install along the horizontal direction (e.g., the first row of modules or those adjacent modules spanning to the right of interlocking module 2).

Figure 23:
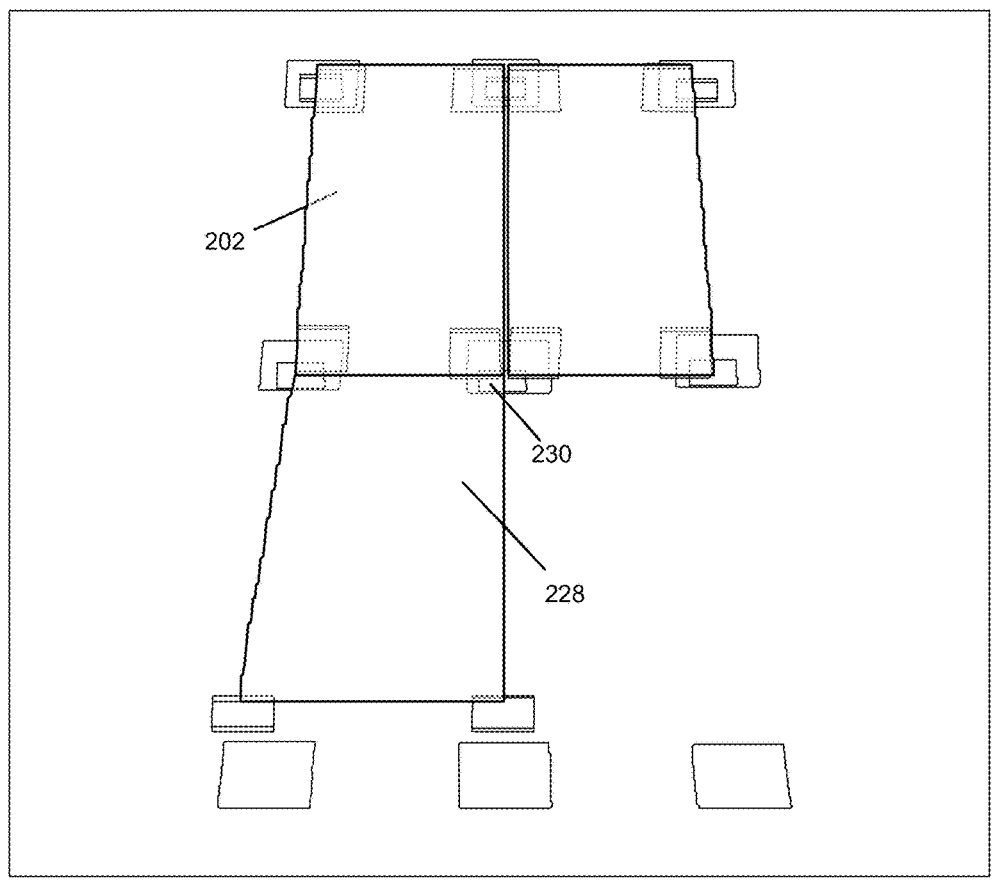

FIG. 23 illustrates Step 4a of the process.

Step 4a includes installing a first interlocking module [228] in the second row.

Step 4a may include inserting one edge of interlocking module three [228] into the mounting bracket connection point [230] in the first interlocking module [202].

Figure 24:
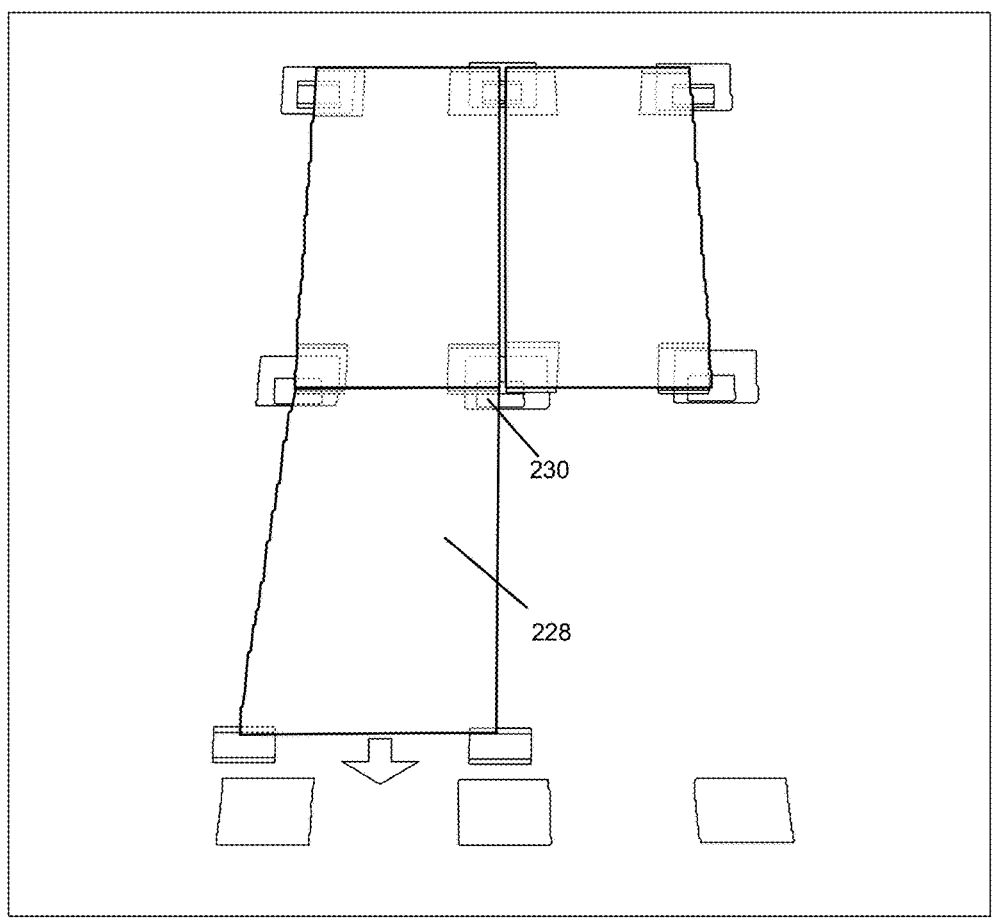

FIG. 24 illustrates Step 4b of the process.

Step 4b includes lowering the other edge of interlocking module three [228] for the mounting feet to rest on the flashing and pivoting at the connection point between the two pair of mounting brackets [230].

Figure 25:
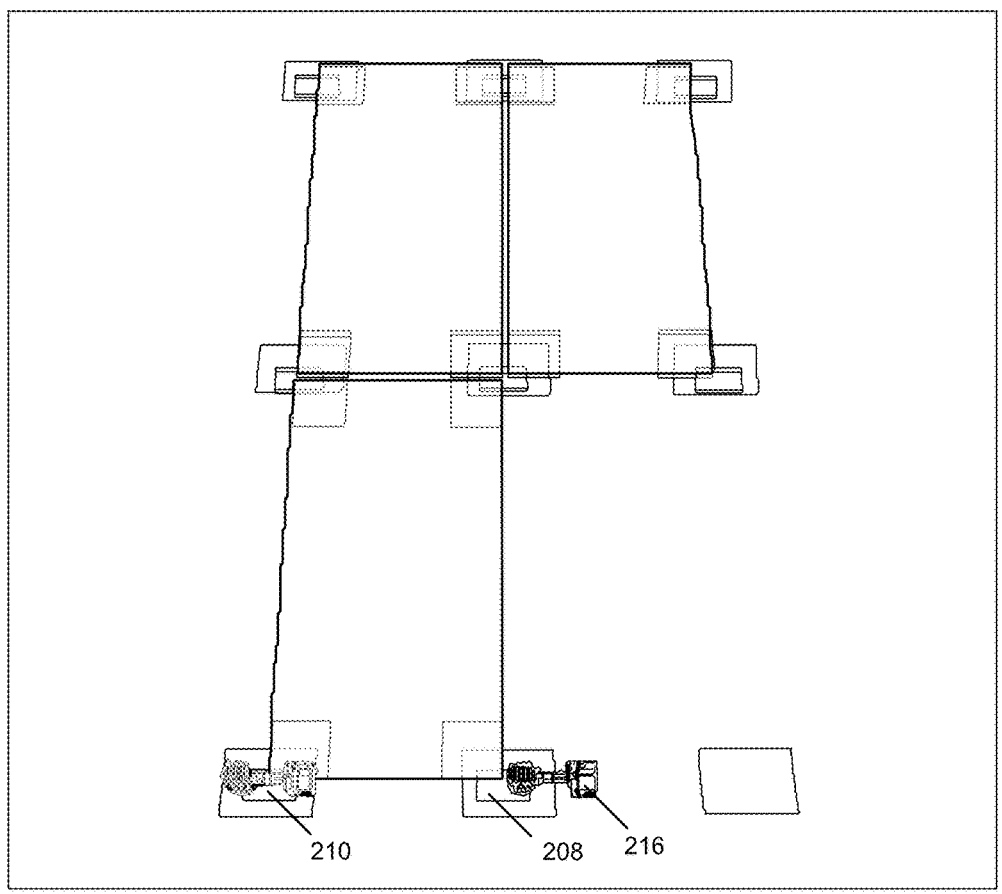

FIG. 25 illustrates Step 4c in the example process.

Step 4c may include installing anchors through mounting foot C [210] and anchoring through mounting foot D [208] with the provided anchors [216].

Figure 26:
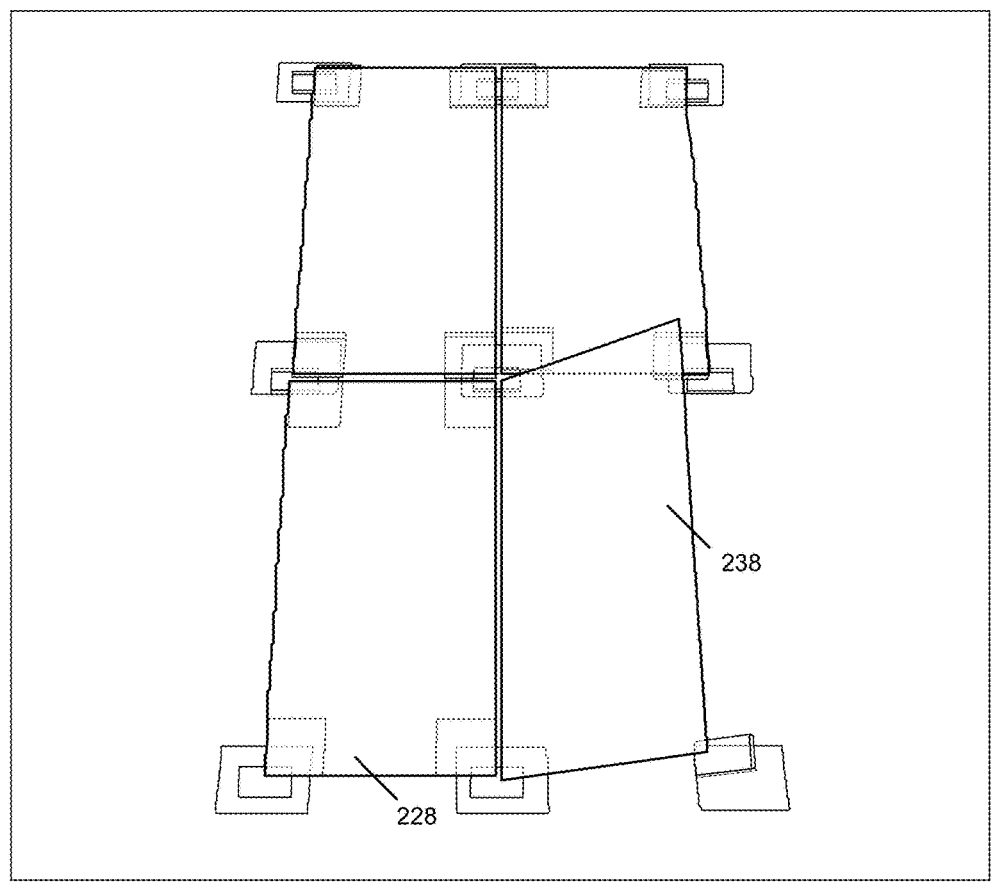

FIG. 26 illustrates Step 5a of the process.

Step 5a includes installing the second interlocking module [238] in the second row. Step 5a may include inserting one edge of interlocking module four [238] in the mounting bracket connection point in the first interlocking module [228], then connecting the electrical conductors (not shown) from the first interlocking module [228] and the second interlocking module [238] in the second row.

Figure 27:
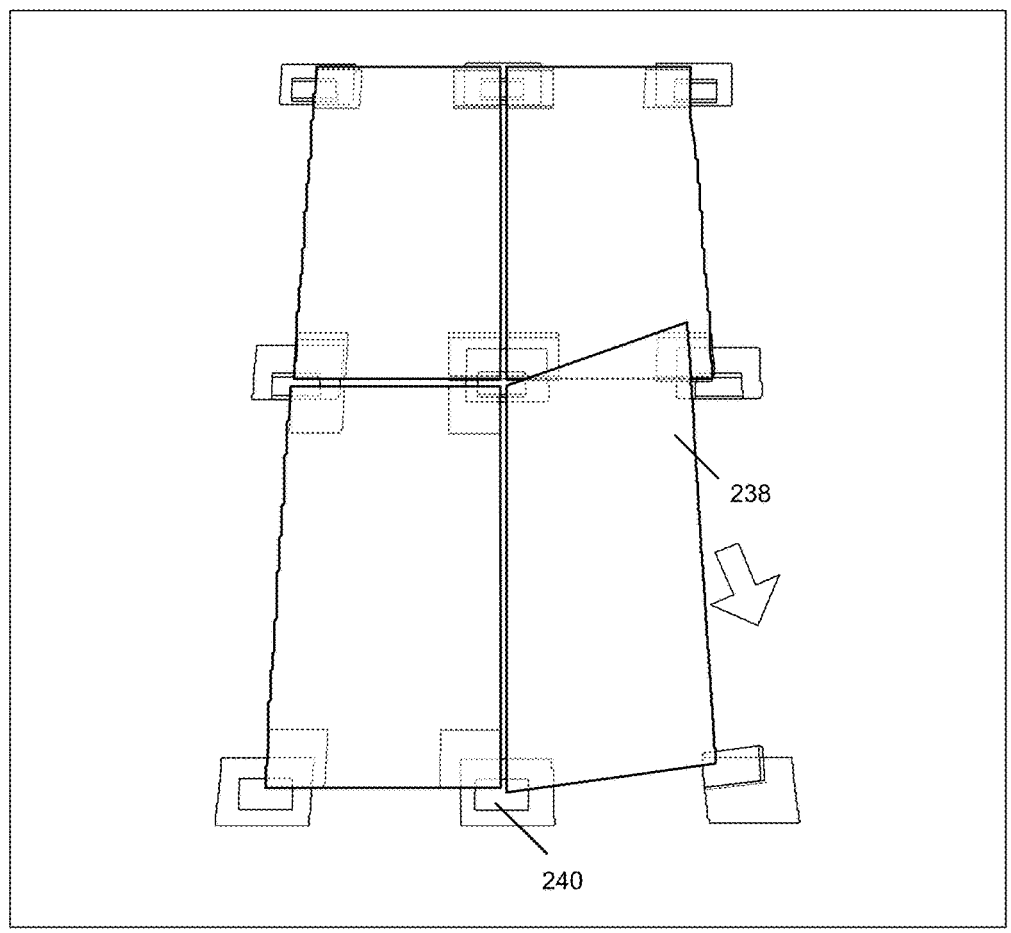

FIG. 27 illustrates Step 5b of the process.

Step 5b includes lowering the other edge of the interlocking module four [238] for the mounting feet to rest on the flashing, including pivoting at the connection point [240] between the two pair of mounting brackets.

Figure 28:
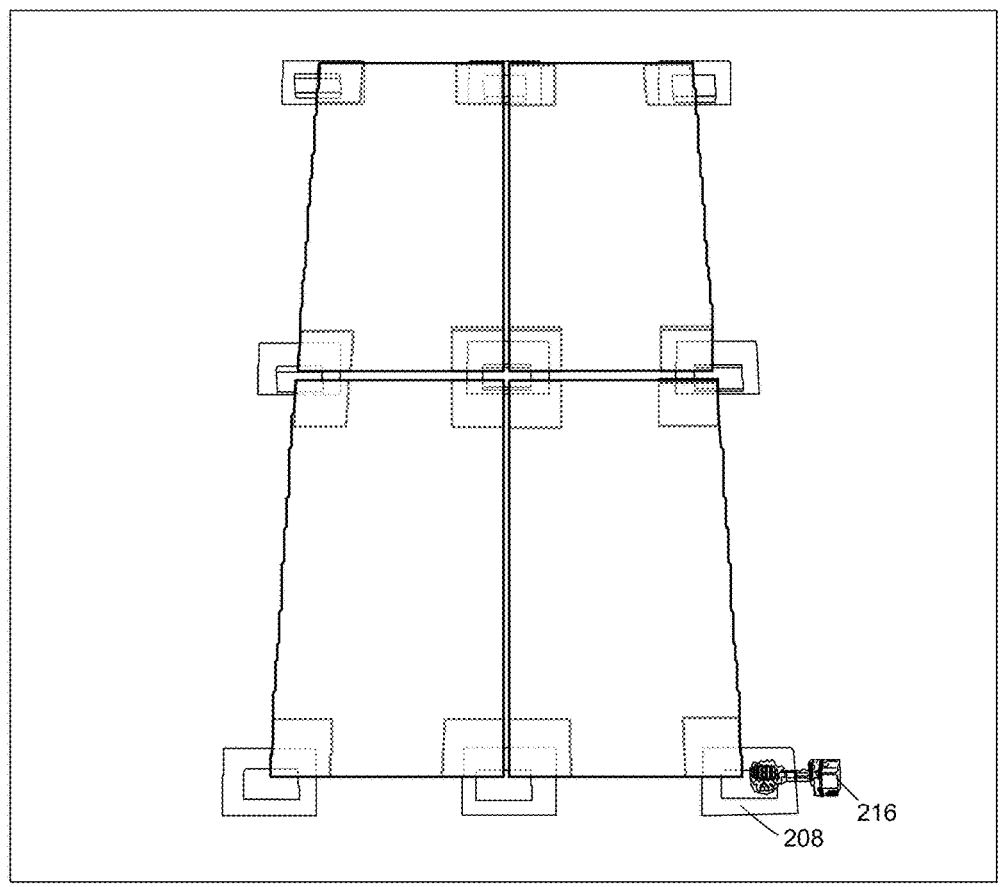

FIG. 28—illustrates Step 5d of the process.

Step 5d includes anchoring the bottom mounting foot D [208] with the provided anchor [216].

Figure 29:
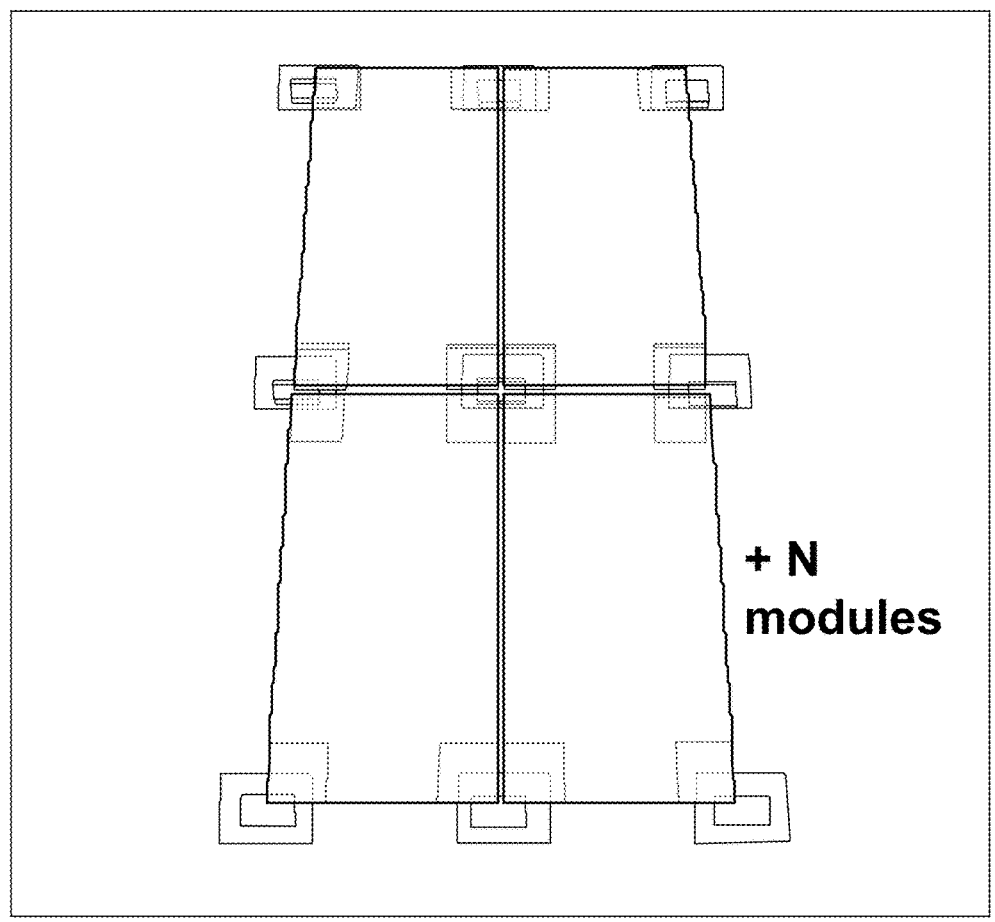

FIG. 29 illustrates Step 6a of the example process. Step 6a includes repeating Step 4 N times, where N=the number of modules to install along the second row of modules.

Figure 30:
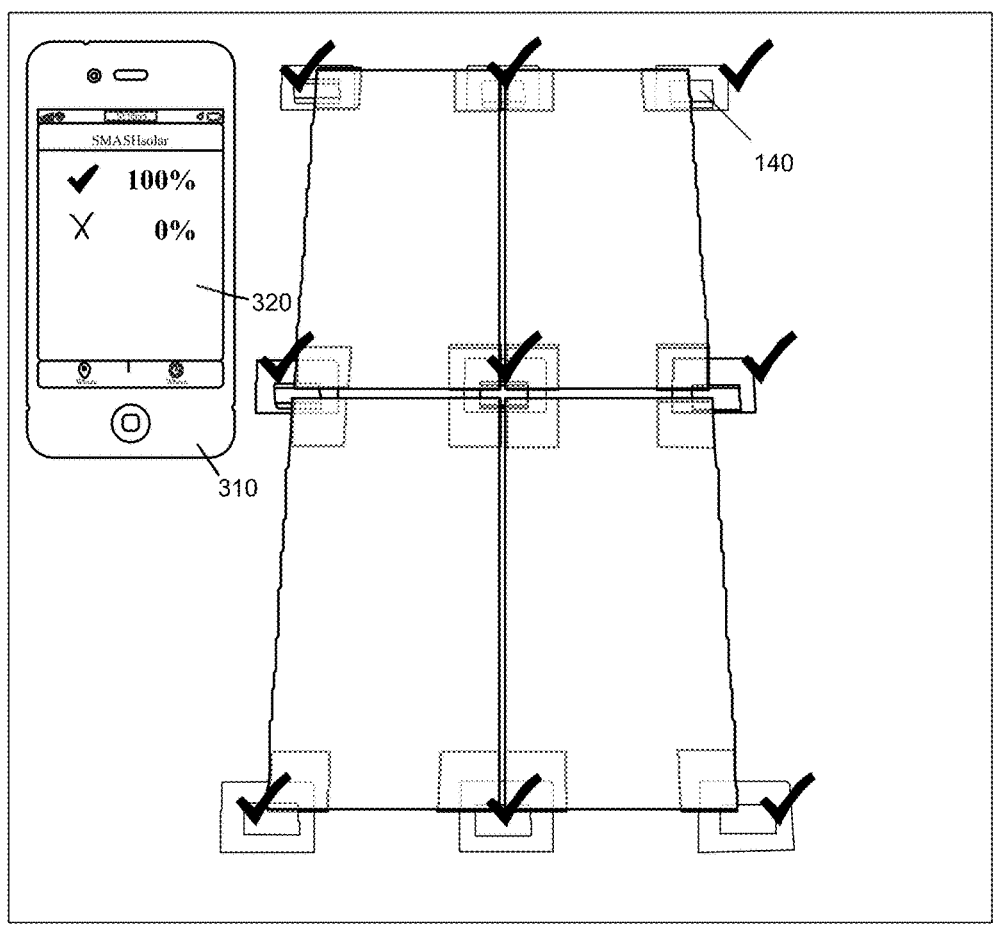

FIG. 30 illustrates Step 7 of the process.

Step 7 includes verifying the mechanical compliance of mounting feet to the flashing.

Mounting foot radio frequency transmitters and sensors may be used in this step as described above with reference to FIG. 12.

Mounting sensor reader [310] may include a mobile electronic device, e.g., such as a mobile phone, tablet or specialty radio frequency reader, that is capable of reading each transmitter and confirming the compressive pressure meets a minimum value for the specific application. The sensors and mobile devices can use one communication protocol or a plurality of communication protocols including but not limited to high frequency (HF), ultra-high frequency (UHF) or Bluetooth standards. The software code or application on the mobile device will collect user entered information, photographic images, the longitudinal and latitudinal location from the mobile device global positioning system sensor, the radio frequency transmitter signals including compressive pressure compliance, a unique identifier for each transmitter and/or other relevant information. If a specialty radio frequency reader is employed, the reader may communicate using one of a plurality of communication protocols with a mobile phone or other mobile device which supports such protocols.

Mobile reader application [320] may include a receiver that can include a commercially available mobile phone or other mobile device running a standard operating system such as Android, Windows Mobile or iOS. An application running on such a device would manage connecting to the radio transmitters and sensors and collecting the sensor information and other information. The information collected by the mobile device may be communicated to remote computing devices and machines using Internet protocols, e.g., in real-time if a network signal exists on the mobile device and/or at a later time when the network signal is available or when the mobile device is connected to an Internet connected computer.

Many more embodiments are advantageously provided within the scope and spirit of these detailed descriptions. A frameless solar power module system is provided that includes at least four mounting feet configured to be coupled to a surface that receives effective amounts of sunlight; multiple solar panels each preassembled with a front surface configured to collect and convert solar radiation for use as a source of energy and a back surface configured at four locations for coupling with any of:
  i. a mounting foot before or after installation of the mounting foot to said sunlight receiving surface,
  ii. another solar panel,
  iii. two other solar panels,
  iv. a mounting foot before or after installation of the mounting foot to said sunlight receiving surface and one other solar panel, or
  v. a mounting foot and two other solar panels.

Another frameless solar power module system is provided that includes multiple spaced-apart mounting feet coupling, before or after coupling each with a mounting bracket integrated with a preassembled solar panel, at four respectively spaced-apart locations to a surface that receives effective amounts of sunlight; and multiple such preassembled solar panels each including four mounting brackets integrated therewith that are each configured for coupling to any of:
  i. one of the mounting feet or
  ii. one or two other mounting brackets of one or two respectively adjacent preassembled solar panels, or
  iii. one of the mounting feet and one or two other mounting brackets of one or two respectively adjacent preassembled solar panels.

Upon installation, the system may include at least one installed preassembled solar panel of each of the following three configurations:
  a. one mounting bracket coupled only to a mounting foot and three mounting brackets coupled each to at least one mounting bracket of each of one or two adjacent solar panels;
  b. two mounting brackets coupled each to one of two respectively spaced-apart mounting feet and two mounting brackets coupled each to at least one mounting bracket of each of one or two adjacent solar panels; and
  c. four mounting brackets coupled each to one of four respectively spaced-apart mounting feet.

Mounting brackets are configured to couple to other frameless solar panels with mounting brackets that are configured with spring-loaded pins to lock into receiving holes on adjoining mounting brackets resulting in a secure connection.

Mounting feet are configured to structurally attach to a roof surface at any location without first locating roof structural members such as rafters.

The preassembled solar panels comprise integrated mounting brackets such that installation at a work site is vastly simplified and involves fewer loose parts.

Upon installation, a first frameless module (anchor module) may be anchored to the roof with four mounting feet securing the anchor module to a pitched roof, and then the solar array may be expanded by coupling additional frameless modules (expansion modules) up slope from the anchor module, down slope from the anchor module, toward the left side of the anchor module and/or toward the right side of the anchor module without first installing separate hardware or connectors on the roof before the expansion modules, are configured to be installed in any direction. Each expansion module includes one (1) or two (2) mounting feet to anchor to the pitched roof.

A mounting foot may be configured to adjust in at least one dimension between itself and the mounting bracket (or group of coupled mounting brackets), such as an adjustment in the upslope and downslope dimension. A second adjustment may be the height of each mounting bracket (or group of interlocked mounting brackets) normal to the pitched roof plane. Another adjustment may allow variability in the axis where the plane of the pitched roof and the plane of the exposed roofing course intersect.

The mounting feet and or anchors may be configured with sensors which electronically measure the compressive pressure exerted by the mounting foot onto the fixed structure or exerted by the anchor head against the mounting foot. Sensors may interface with an active or passive transmitter that can be read by a wireless radio signal-enabled mobile device.

A frameless solar power module system is also provided including at least four mounting feet configured for coupling to a surface that receives effective amounts of sunlight. Multiple solar panels may be each preassembled with four mounting brackets coupled to a back surface that are each configured for coupling to one of the mounting feet and to one or two mounting brackets of one or two adjacent solar panels.

A movable connector may be configured such that an installed disposition of a mounting bracket may be adjustable in at least one dimension relative to a mounting foot to which said bracket is coupled.

A frameless solar power module system is also provided that includes at least four mounting feet coupled to a surface that receives effective amounts of sunlight. Multiple solar panels are each preassembled with a front surface configured to collect and convert solar radiation for use as a source of energy and a back surface configured at four locations for coupling with any of: an installed mounting foot, another solar panel, two other solar panels, a mounting foot and one other solar panel, or a mounting foot and two other solar panels.

A frameless and modular solar power system is also provided that includes multiple spaced-apart mounting feet coupled, before or after coupling with solar panels each at one of said location at the back surface thereof, at respectively spaced-apart locations of a surface that receives effective amounts of sunlight. The mounting feet may be installed with the solar panel prior to installation at said solar radation receiving surface. Multiple preassembled solar panels each include four mounting brackets that are each configured for coupling to any of the mounting feet or to one or two other mounting brackets of one or two respectively adjacent preassembled solar panels, or combinations thereof.

Upon installation, the system may include at least one installed preassembled solar panel in each of the following configurations: (i) only one mounting bracket coupled to a mounting foot; (ii) only two mounting brackets coupled respectively to two spaced-apart mounting feet; and (iii) four mounting brackets coupled respectively to four spaced-apart mounting feet.

A frameless and modular solar power system is also provided that includes multiple spaced-apart mounting feet coupling at four respectively spaced-apart locations to a surface that receives effective amounts of sunlight. The mounting feet are also coupled to mounting brackets integrated with solar panels. The mounting feet may coupled to the solar panels before or after installation on the sunlight receiving surface. Multiple preassembled solar panels are installed in the solar power system that each include four mounting brackets are each configured for coupling to any of: (i) one of the mounting feet or (ii) one or two other mounting brackets of one or two respectively adjacent preassembled solar panels, or (iii) one of the mounting feet and one or two other mounting brackets of one or two respectively adjacent preassembled solar panels.

Upon installation, the system includes at least one installed preassembled solar panel of each of the following three configurations: (a) one mounting bracket coupled only to a mounting foot and three mounting brackets coupled each to at least one mounting bracket of each of one or two adjacent solar panels; (b) two mounting brackets coupled each to one of two respectively spaced-apart mounting feet and two mounting brackets coupled each to at least one mounting bracket of each of one or two adjacent solar panels; and (c) four mounting brackets coupled each to one of four respectively spaced-apart mounting feet.

A frameless and modular solar power system is also provided that includes at least three columns and two rows of spaced-apart mounting feet configured for coupling at six respective locations to a surface that receives effective amounts of sunlight and for coupling to mounting brackets that are coupled to back surfaces of solar panels. The coupling of the mounting feet may be performed in either order. Multiple preassembled solar panels each include four mounting brackets that are each configured for coupling to one of the mounting feet or to one or two other mounting brackets of one or two respectively adjacent preassembled solar panels, or to one of the mounting feet and to one or two other mounting brackets of one or two respectively adjacent preassembled solar panels.

Upon installation, the system may include at least one installed preassembled solar panel in each of the following three configurations: (i) one mounting bracket coupled to a mounting foot and three mounting brackets each coupled to one or two mounting brackets of adjacent solar panels; (ii) two mounting brackets coupled each to one of two spaced-apart mounting feet and two mounting brackets coupled each to one or two mounting brackets of one or two adjacent solar panels; and (iii) four mounting brackets coupled each to one of four spaced-apart mounting feet.

A frameless and modular solar power system is also provided that includes at least four spaced-apart mounting feet configured for coupling at four locations to a surface that receives effective amounts of sunlight. one or more preassembled solar panels each include four mounting brackets that are each configured for coupling to one of the mounting feet or to one or two other mounting brackets of one or two respectively adjacent preassembled solar panels, or to one of the mounting feet and to one or two other mounting brackets of one or two respectively adjacent preassembled solar panels. Upon installation, the system may include an installed preassembled solar panel that has all four of its mounting brackets coupled each to one of four spaced-apart mounting feet.

At least one installed preassembled solar panel may have two mounting brackets coupled to two respective mounting feet and two mounting brackets coupled to two respective mounting brackets of an adjacent solar panel.

At least one installed preassembled solar panel may have one mounting bracket that is coupled to a mounting foot and three mounting brackets coupled each to one or two mounting brackets of one or two respectively adjacent solar panels.

A frameless and modular solar power system is also provided. At least six spaced-apart mounting feet are configured for coupling at six locations to a surface that receives effective amounts of sunlight. Two or more preassembled solar panels may each include four mounting brackets that are each configured for coupling to one of the mounting feet or to one or two other mounting brackets of one or two respectively adjacent preassembled solar panels, or combinations thereof. Upon installation, the system includes at least one installed preassembled solar panel that has all four of its mounting brackets coupled each to one of four respective mounting feet that are installed on the sunlight receiving surface before of after coupling to the solar panels. At least one installed preassembled solar panel may have two of its mounting brackets coupled each to one of two spaced-apart mounting feet and two mounting brackets coupled each to one of two mounting brackets of an adjacent solar panel.

One or more installed preassembled solar panel may have two of its mounting brackets coupled each to a respective mounting foot and the other two mounting brackets may be coupled each to a respective mounting bracket of an adjacent solar panel.

One or more installed preassembled solar panel may have one mounting bracket that is coupled to a mounting foot and its other three mounting brackets coupled each to one or two mounting brackets of one or two respectively adjacent solar panels.

A frameless module array is provided that may be mounted to a sunlight receiving structure includes integrated module-mounted brackets that attach to other frameless modules with integrated module-mounted brackets by using interlocking bracket-to-bracket connections. The module mounted brackets also attach to mounting feet specifically configured for coupling to the sunlight receiving surface. Interlocking mating connections between brackets of adjacent solar panel modules are spring-loaded with pins or shaped for passive alignment or have mating pairs of complementary protrusions and recesses.

A frameless module may be installed directly onto the pitched roof with flashing and screw anchors to complete the rooftop installation. A frameless module may include an integrated assembly of frameless solar panel, brackets, mounting connectors or feet, supports, wire clips, wire conductors, and optionally a module-mounted inverter that allows the installation of a system of integrated frameless modules directly onto a pitched roof with flashing and screw anchors to complete the installation.

A frameless module system of frameless modules is provided that are interlocked through integrated module-mounted brackets that enable a first module to be installed to the roof with four mounting connectors or feet securing the first module to the pitched roof and then the array may be expanded by interlocking additional modules up slope from the anchor module, down slope from the anchor module, toward the left side of the anchor module and or toward the right side of the anchor module without any separate hardware or connectors necessary to be installed on the roof before the expansion in any direction. Each expanded frameless module would only have one (1) or two (2) mounting connectors or feet to secure to the pitched roof A frameless module system may be made up of integrated frameless modules interlocked through integrated module-mounted brackets with integral mounting connectors or feet that connects to a pitched roof without separate connectors being first anchored or attached to the pitched roof structure.

Each preassembled solar panel may include four integrated mounting brackets that are each configured to couple to a mounting foot or to at least one mounting bracket of an adjacent preassembled solar panel, or both, and wherein upon installation, fewer mounting feet are installed directly to the roof structure than the number of mounting brackets that are each coupled to a mounting foot or to at least one mounting bracket of an adjacent preassembled solar panels or both.

A frameless module system made up of frameless modules interlocked through integrated module-mounted brackets that couple to a fixed structure, ground area, roof system or temporary structure through a specific set of mounting connectors or feet that have sensors which electronically measure the compressive pressure exerted by the mounting connector or foot on to the fixed structure or exerted by the anchor head against the mounting connector or foot. Sensors may be coupled with an active or passive transmitter that can be read by wireless radio signal-enabled mobile devices, A frameless module with integrated module-mounted brackets that attaches to other frameless modules with integrated module-mounted brackets by using interlocking bracket-to-bracket connections made at any angle between zero and a maximum angle that is as high as 90 degrees in certain embodiments and may be 45 degrees in still advantageous embodiments for ease of installation and removal.

Figure 31:
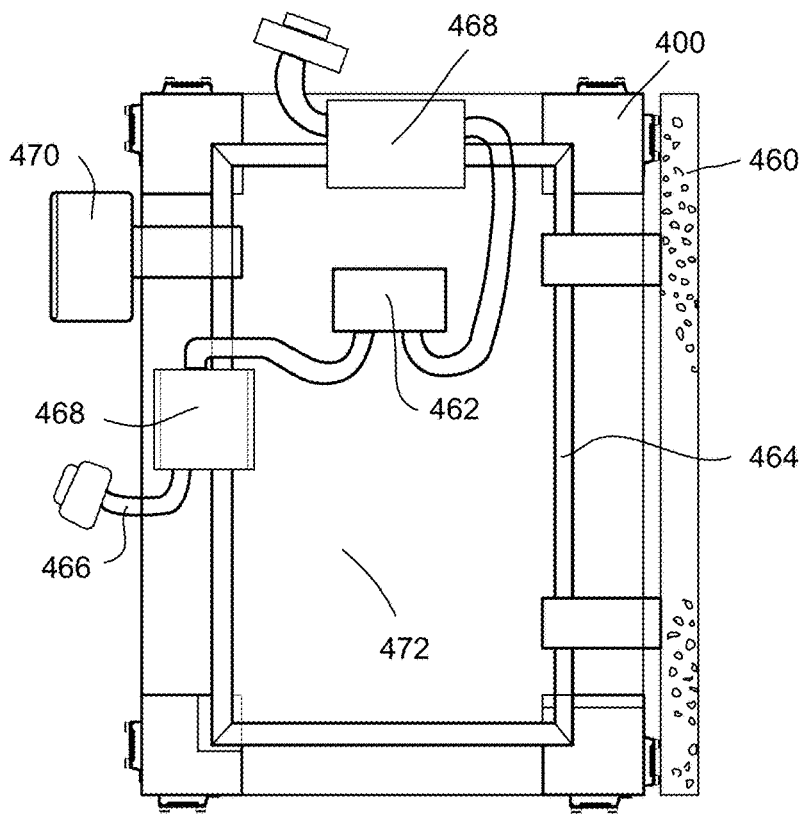
FIG. 31 illustrates an embodiment including an Interlocking Mounting System for Solar Panels (Back View).

FIG. 31 illustrates a back view or bottom view or view from the other side of a preassembled solar panel than the previously illustrated embodiments in accordance with additional embodiments. An interlocking mounting system for solar panels in accordance with certain embodiments may include a platform to facilitate the reliable and quick installation of integrated solar modules. The interlocking mounting system illustrated in FIG. 31 includes an integrated solar panel [472], four mounting brackets [400], mounting feet [not shown, but see 415 at FIG. 32], panel rails [464] and various accessories to create an "Interlocking Module."

These accessories may include:
a. Cable Trays [468] designed to secure, hold and convey AC cables [466] running from a panel-mounted inverter [462].
b. Panel-mounted inverter [462] which converts direct current power produced by the Solar Panel to alternating current power.
c. Transition box [470] which connects the AC cables [466] from the panel-mounted inverter to the branch circuit running to an AC disconnect (not shown) and the building's electrical panel (not shown).
d. A set of wind deflectors [460] serves to deflect wind and protect the array from debris buildup under the array and preventing rodent or bird nesting under the array while allowing ventilation under the Solar Panel [472].

Figure 32:
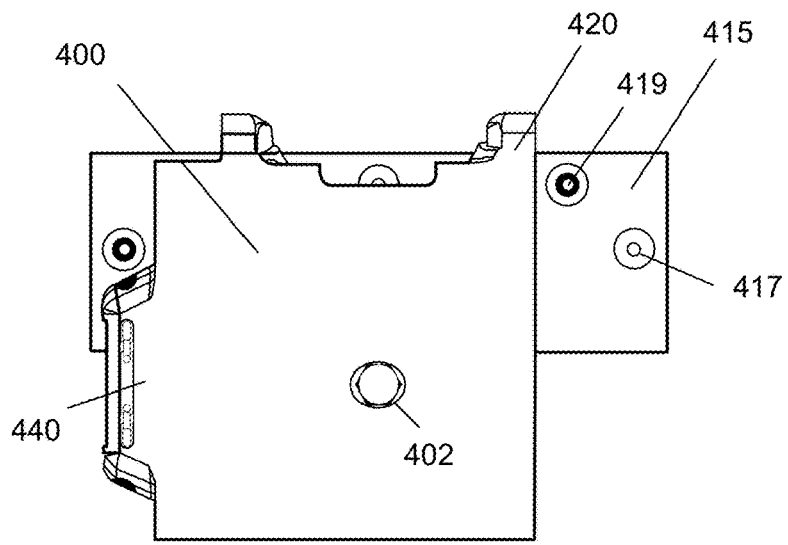
FIG. 32 illustrates an embodiment including a Mounting Bracket and Foot Assembly for solar panel module in Top View.

Each mounting bracket [400], e.g., as illustrated in one embodiment in FIG. 32, is attached to a Solar Panel [472] and has a female or recessed connector tab [420] and a male or port ruding connector tab [440] that interconnect and interlock with corresponding Connector Tabs on adjacent Mounting Brackets on Interlocking Modules. This interlocking of adjacent Interlocking Modules occurs without separate or additional hardware.

On each module, the Interlocking Mounting System may include an assembly of Mounting Brackets [400], Panel Rails [464] and/or accessories attached to the Panel Rail. Panel Rails, cable trays and/or transition boxes may be made of extruded or molded non-conductive material.

A preliminary configuration step for this Interlocking Mounting System for Solar Panels will be performed in a controlled, manufacturing environment and involves using a chemical adhesive to attach a set of four (4) Mounting Brackets [400], and Panel Rails [464] to the back of a Solar Panel [472]. A secondary configuration step may include attaching Mounting Feet [415 —see FIG. 32] to Mounting Bracket [400] and attaching accessories to the Panel Rail [464]. This secondary configuration step can be performed in a controlled, manufacturing environment or on the project site or both.

Accessories may include:
a. Cable Trays [468] which can be clipped on to the Panel Rails and be moved along the Panel Rail.
b. Panel-mounted inverter [462] which can be adhered to the backsheet of the Solar Panel (as shown) or attached to the Panel Rail (see FIG. 39).
c. Transition box [470] which can be attached to the Panel Rail (as shown) or to a Mounting Bracket Male or protruding Connector Tab or Female or recessed Connector Tab.
d. A set of wind deflectors [460] along the perimeter of the array can be connected to the Panel Rail as shown here, or connected directly to each Mounting Bracket (see FIG. 39) on the perimeter of the array.

FIG. 32 Mounting Bracket and Foot Assembly—Top View

FIG. 32 shows a top view of an assembly of a Mounting Bracket and a Foot Assembly in an embodiment (note the solar panel is not shown for clarity).

Four (4) Mounting Brackets [400] are factory attached to the back of Solar Panel at each corner (not shown) using chemical adhesives. The Female Connector Tab [420] and the Male Connector Tab [440] interconnect and interlock with adjacent Female Connector Tab [420] and the Male Connector Tab [440] installed on adjacent Solar Modules (not shown) with no separate or additional hardware. The Mounting Foot [415] may be especially designed for composite shingle applications and may be configured to connect to the Mounting Bracket [400]. The Mounting Bracket [400] can accept and connect to various compatible Mounting Feet designed for different mounting applications, several of which are described in this application. Each Mounting Foot [415] will have defined points of attachment [417] to accommodate mounting anchors [419] into the pitched roof structure.

The Mounting Brackets [400] and Mounting Feet [415] are in certain embodiments manufactured from non-conductive, UV resistant and structural materials using a molded or stamped process. These parts may contain components or assemblies of corrosion-resistant metal.

The Mounting Bracket [400] may include a Mounting Bracket Female Connector Tab [420] and a Mounting Bracket Male Connector Tab [440]. The Mounting Foot [415] which is below the Mounting Bracket [400] in FIG. 32 is connected to the Mounting Bracket through a corrosion-resistant bolt [402] or other connecting mechanism.

Figure 33:
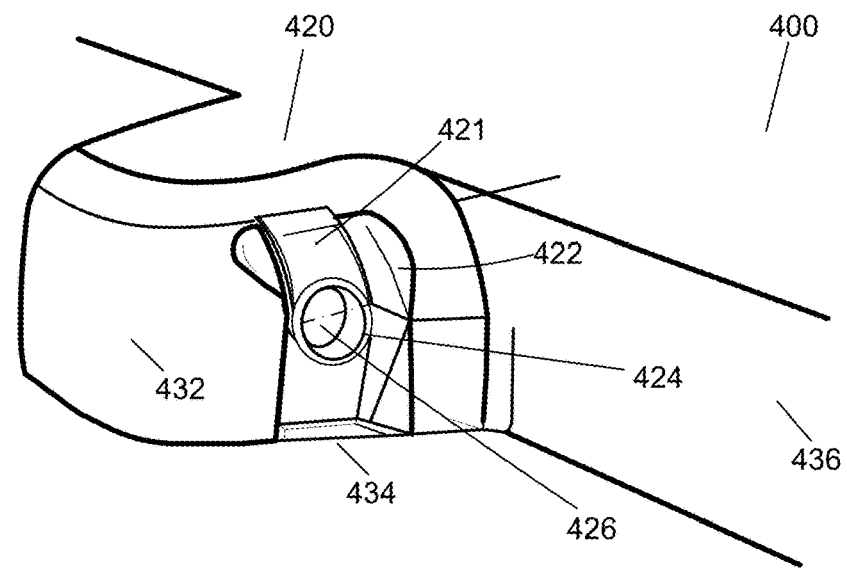
FIG. 33 illustrates an embodiment including a Mounting Bracket for solar panel module—Female Connector Lead.

FIG. 33 illustrates a Mounting Bracket—Female Connector Lead 420 in accordance with certain embodiments.

Figure 34:
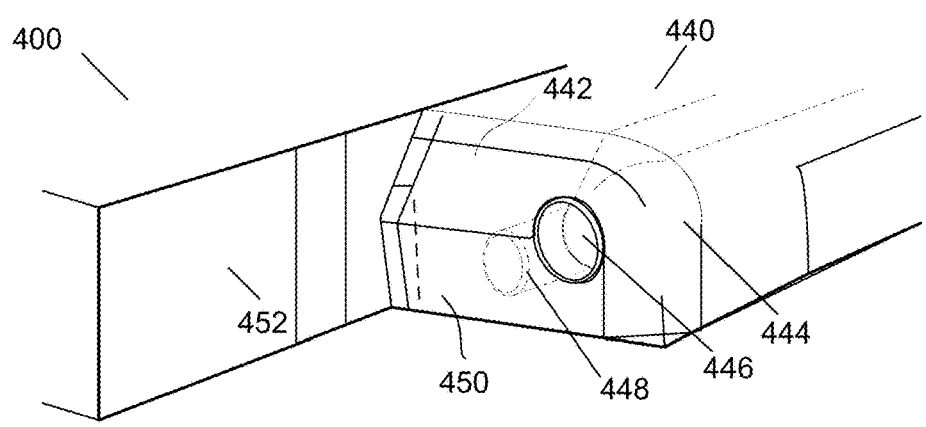
FIG. 34 illustrates an embodiment including a Mounting Bracket for solar panel module—Male Connector Lead.

This Female or recessed Connector Tab [420] on the Mounting Bracket [400] is designed to accept a pin from the Male or protruding Connector Tab [see FIG. 34] on an adjacent Mounting Bracket. The lead in detail is designed to guide the Male Connector pin into the Female Connector pin hole [426]. The Lead In includes lead in ramps [421] (e.g., at about forty (40) degrees in certain embodiments and located above and below the pin hole [426]). Additional lead in ramp walls [422] have been flared out ten (10) degrees in certain embodiments on either side of the lead in ramps [420] above and below the pin hole [426]. The pin hole [426] has an approximately 0.5 mm to 1 mm 'landing area' [424] in FIG. 33 around its circumference. The inside edge of the Female Connector Tab [420] has an approximately 6 mm radius rounded front edge [432] to prevent interference with the Mounting Bracket Male Connector Tab [see FIG. 34]. The Female Connector Tab [420] inside edge [434] has an overall lead in angle to the edge face [436] of the Mounting Bracket of approximately 115 degrees.

The Female Connector Tab is in certain embodiments made up of a non-conductive, UV resistant and structural material formed or molded as part of or one part of the Mounting Bracket [400].

The Female Connector Tab [420] is configured within a Mounting Bracket [400] or as part of or as a component of a Mounting Bracket, or is an integrated portion of a mounting bracket.

FIG. 34 Mounting Bracket—Male Connector Lead-In Detail

In FIG. 34, a Mounting Bracket—Male Connector Tab [440] is detailed.

This Male Connector Tab [440] on the Mounting Bracket [400] is designed to deliver a pin to the Female Connector Tab [see FIG. 33] on an adjacent Mounting Bracket. The lead in detail is designed to interface with the Female Connector Tab [420] without interference and guide in the pin into the pin hole.

The Male Connector Tab is made up of a non-conductive, UV resistant and structural material formed or molded as part of or one part of the Mounting Bracket [400] with an internal sprung pin assembly with locking and unlocking features. The Male Connector Tab lead in may include an approximately 35 degree chamfer angle [442] on either side of the Male Connector Tab [440] located above and toward the inside of the pin hole [446]). The Male Connector Tab [440] may have an approximately 6 mm radius rounded front edge [444] to prevent interference with the adjacent Female Connector Tab [see FIG. 33]. The pin hole [446] will support a pin assembly [438] ghosted for clarity. The Male Connector Tab [440] inside edge [450] has an overall lead in angle to the edge face [452] of the Mounting Bracket of approximately 115 degrees.

The Male Connector Tab [420] is configured as a component of a Mounting Bracket [400] or is coupled or integrated therewith in alternative embodiments.

Figure 35:
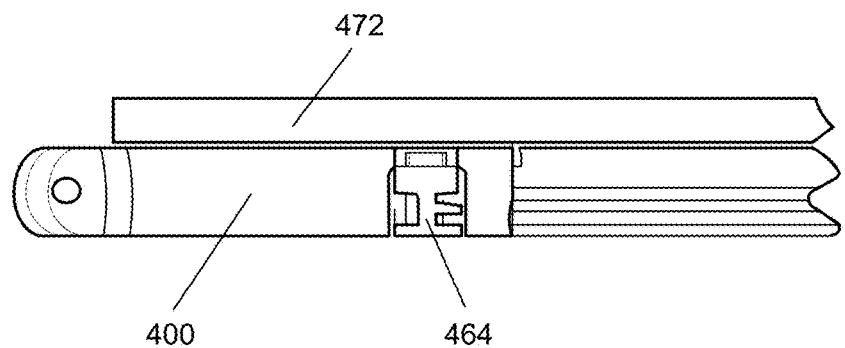
FIG. 35 illustrates an embodiment including a cross-sectional view of Panel Rail with Mounting Bracket beyond for a solar panel module.

FIG. 35 Section of Panel Rail with Mounting Bracket beyond.

FIG. 35 shows a section through a Panel Rail [464]

Panel Rails [464] may serve to support the Solar Panel [472] between Mounting Brackets [400] in certain embodiments. Panel Rails also serve as attachment points for accessories as found in FIG. 31.

Panel Rails [464] may be extruded non-conductive, UV resistant and structural material designed to withstand the dynamic forces on a Solar Panel and the torque exerted by the accessories attached (as shown in FIG. 31). Each Panel Rail [464] may be connected into a Mounting Bracket [400] as illustrated in the example embodiment of FIG. 35. The Panel Rail can be isolated or chemically bonded with an adhesive to the solar panel [472] which it supports.

Figure 36:
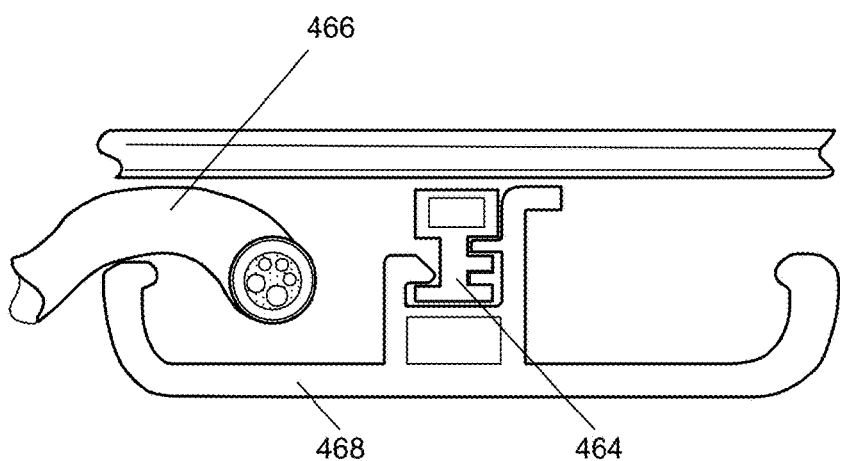
FIG. 36 illustrates an embodiment including a cross-sectional view through Cable Tray hanging on Panel Rail for a solar panel module.

FIG. 36 illustrates a Section through Cable Tray hanging on Panel Rail.

FIG. 36 illustrates a section through a Panel Rail [464] and a Cable Tray [468].

The Cable Tray [468] serves to guide and manage solar panel cables [466] to keep them organized, secure and off the roof surface.

Cable Tray [468] is manufactured from non-conductive, UV resistant and structural materials extruded into a specific profile to provide the structural and mechanical properties involved in securing cables [466].

Cable Trays [468] may be mounted to the Panel Rail [464], held by an interconnecting profile details of the Cable Tray [468] and of the Panel Rail [464] to interlock and give the trays a secure connection to the Panel Rail [464].

Figure 37:
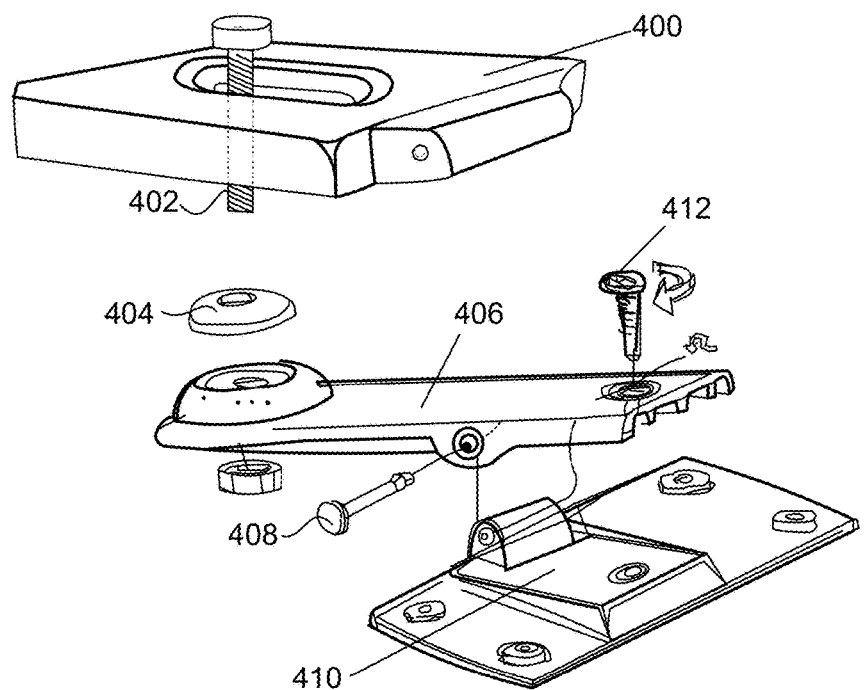
FIG. 37 illustrates an embodiment including a Mounting Bracket and adjustable Mounting Foot Assembly of a solar panel module for pitched roof applications.

FIG. 37 Mounting Bracket and adjustable Mounting Foot Assembly for pitched roof applications.

In FIG. 37, the Mounting Bracket [400] is shown attaching to an adjustable Mounting Foot Assembly for pitched roof applications.

The function of the Mounting Foot for pitched roof applications is to provide a connection between the fixed pitched roof structure and the Mounting Bracket. In this embodiment, the adjustable Mounting Foot Assembly allows for height adjustment of the Mounting Bracket and therefore height adjustment of the solar panel. This Mounting Foot height adjustment will realize an increase or decrease in the dimension (normal to the roof plane) between the roof and the module face.

The Mounting Foot Assembly may include several molded, non-conductive, UV resistant and structural parts and corrosion-resistant metal hardware including the molded foot [410] which may be connected to the molded pivoting arm [406] through a metal pin [408]. The Mounting Bracket may be connected to the Mounting Foot Assembly through a corrosion-resistant bolt [402] or other connecting mechanism running through a compliant grommet interface [404] that allows the Mounting Bracket and the Mounting Foot Assembly to lie in different planes (as the plane of a roof and the plane of exposed courses of roof shingles vary due to the overlapping of shingle courses.) The Mounting Foot Assembly [404 through 414] are designed for composite shingle, pitched roof applications, but the molded foot [410] can be modified to support other pitched roof applications including but not limited to corregated metal roofing, standing seam metal roofing, concrete tile roofing, slate or shake roofing.

The Mounting Foot Assembly has a height adjustment which is employed in this embodiment through the turning of a metal adjustment screw [412]. This adjustment mechanism allows the height above the roof of the Mounting Bracket [400] and the Solar Panel (not shown) to be adjusted and locked in place Intentionally hidden for clarity is the solar panel that would be attached to the Mounting Bracket [400] in an installed system.

Figure 38:
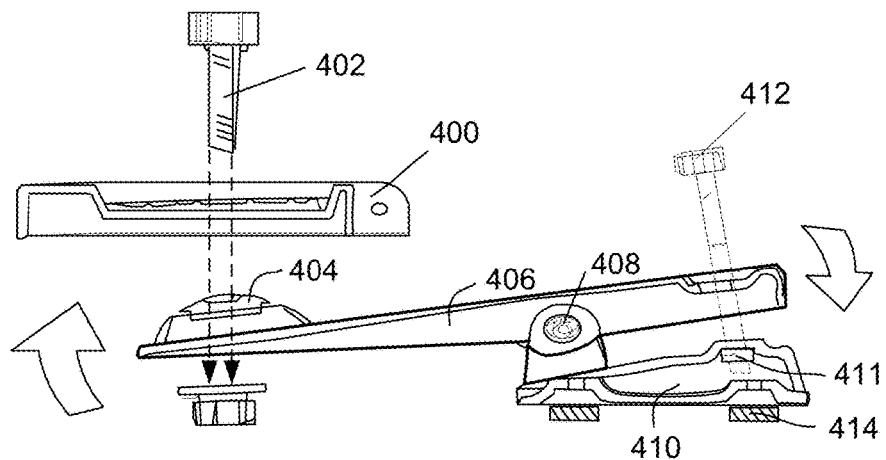
FIG. 38 illustrates an embodiment including a cross-sectional view of a Mounting Bracket and adjustable Mounting Foot Assembly of a solar panel module for pitched roof applications.

FIG. 38 Section of Mounting Bracket and adjustable Mounting Foot Assembly for pitched roof applications.

In FIG. 38, a section of molded Mounting Bracket [400] is shown with the adjustable Mounting Foot Assembly for pitched roof applications. The Mounting Foot Assembly may include several molded plastic parts and metal hardware including a molded foot [410] that is connected to a molded pivoting arm [406] through a metal pin [408].

The Mounting Bracket is connected to the Mounting Foot Assembly for pitched roof applications through a corrosion-resistant bolt [402] running through a compliant grommet interface [404] that allows the Mounting Bracket and the Mounting Foot Assembly to lie in different planes (e.g., as the plane of a roof and the plane of exposed courses of roof shingles vary due to the overlapping of shingle courses.) The function of this Mounting Foot Assembly is to allow for height adjustment of the Mounting Bracket and therefore height adjustment of the solar panel.

The Mounting Foot Assembly [404 through 414] is manufactured with a majority or plurality of non-conductive, UV resistant and structural molded materials and corrosion-resistant metal connectors, pins, and screws. The Mounting Foot Assembly [404 through 414] may be designed for composite shingle, pitched roof applications, but the molded foot [410] can be modified to support other pitched roof applications including but not limited to corregated metal roofing, standing seam metal roofing, concrete tile roofing, slate or shake roofing.

As the corrosion-resistant metal adjustment screw [412] lowers the short end of the molded pivoting arm, the longer end of the pivoting arm is raised (thus raising the Mounting Bracket and the attached solar panel.) The through-hole sealant [414] is shown below the formed holes [411] in the Mounting Foot molded foot [410]. The Mounting Bracket is connected to the Mounting Foot Assembly through a bolt [402], or other connecting mechanism running through a compliant rubber grommet interface [404]. Intentionally hidden for clarity is the solar panel that would be attached to the top of the Mounting Bracket [400]. Also, intentionally hidden in FIG. 38 is the flashing and roof structure which would both reside below the molded foot [410].

Figure 39:
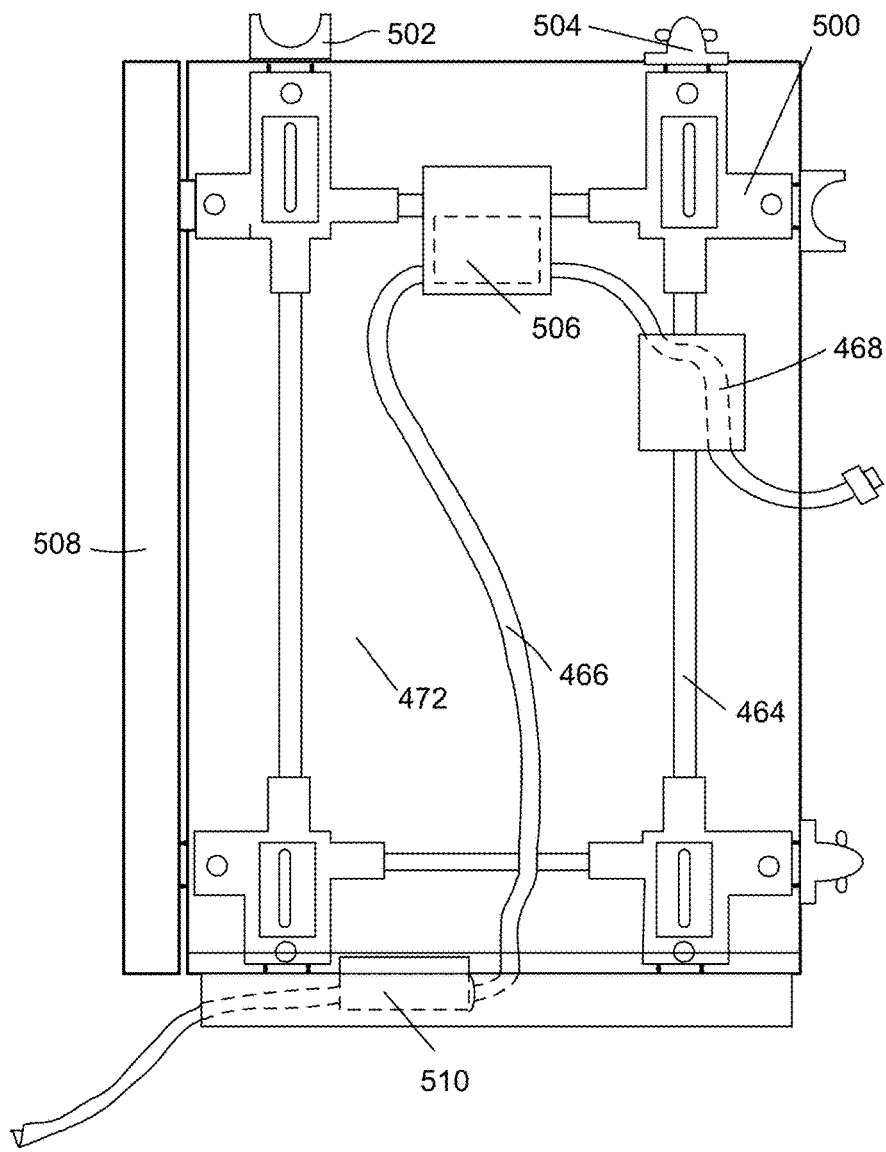
FIG. 39 illustrates an embodiment including an Interlocking Mounting System for Solar Panels with configurable Mounting Brackets (Back View).

FIG. 39 shows an Interlocking Mounting System for Solar Panels with configurable Mounting Brackets (Back View).

The Interlocking Mounting System integrates the Solar Panel [472], Mounting Brackets, Bases, Female Connector Tabs [502] and detachable Male Connector Tabs [504] [500], Mounting Feet [415—see FIG. 32], Panel Rails [464] and various accessories to create an "Interlocking Module".

The function of this Interlocking Mounting System for Solar Panels with configurable Mounting Brackets draws on same or similar functionality as described in FIG. 31 and provides a flexible configuration of Mounting Brackets due to each Mounting Bracket having a detachable Female Connector Tab [502] and detachable Male Connector Tab [504]. With respect to interconnecting and interlocking Solar Panels together, the functionality of the detachable Female Connector Tab [502] and detachable Male Connector Tab [504] may be identical or similar to the a Female Connector Tab [420] and Male Connector Tab [440] described in FIG. 33 and FIG. 34. Like in FIG. 31, a number of accessories can be attached to the interlocking Mounting System, including the, the rail-installed inverter [506], the wind deflector [508], the cable tray [468] and the transition box [510].

Each Mounting Bracket Base [500] may be attached to a Solar Panel [472] and may have a detachable Female Connector Tab [502] and a Male Connector Tab [504] that interconnect and interlock with corresponding Connector Tabs on adjacent Interlocking Modules. This interlocking of adjacent Interlocking Modules occurs without separate or additional hardware.

The Panel Rails [464], Mounting Bracket Bases [500], detachable Female Connector Tab [502] and a detachable Male Connector Tab [504] are all manufactured from non-conductive, UV resistant and structural materials using an extruded, molded or stamped process. These parts may contain components or assemblies of corrosion-resistant metal.

A preliminary configuration step for this Interlocking Mounting System for Solar Panels may be performed in a controlled, manufacturing environment involving use of a chemical adhesive to attach a set of four (4) Mounting Bracket Bases [500], and Panel Rails [464] to the back of a Solar Panel [472]. A secondary configuration step may involve attaching detachable Female Connector Tabs [502], detachable Male Connector Tabs [504] and Mounting Feet [415—see FIG. 32] to Mounting Bracket Bases [500] and attaching accessories to the Panel Rail [464]. This secondary configuration step can be performed in a controlled, manufacturing environment or on the project site or both.

One or more accessories can be attached to the Panel Rail [464] as follows:
 a. Cable Trays [468] which can be clipped on to the Panel Rails and be moved along the Panel Rail.
 b. Rail-installed inverter [506] which can be attached to the Panel Rail.

One or more accessories can be attached to the Mounting Bracket Base [500] as follows:
 a. A transition box [510] can be attached to the Mounting Bracket base and/or to inside of the wind deflector [508].
 b. A set of wind deflectors [508] can be connected directly to each Mounting Bracket Base [500] on each perimeter side of an array.

Figure 40:
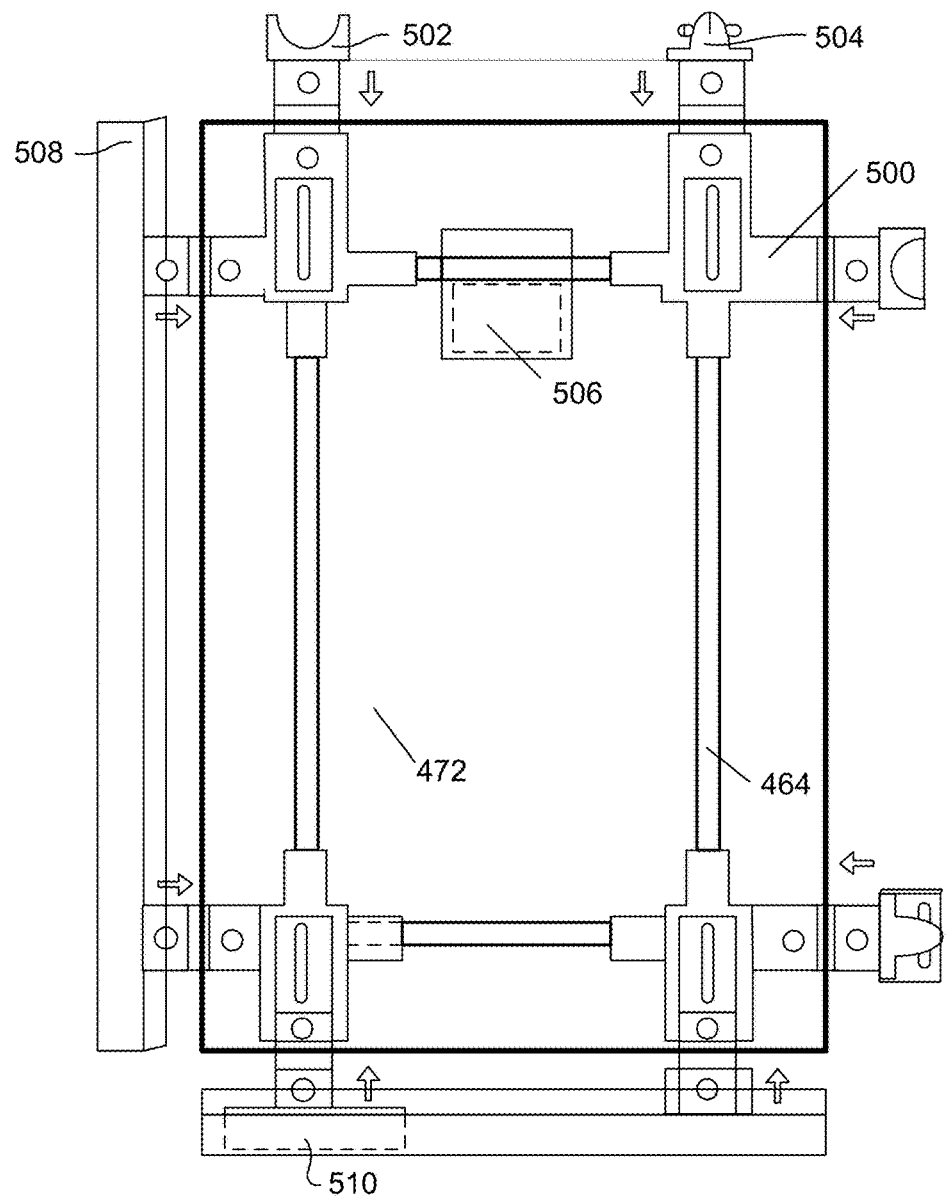
FIG. 40 illustrates an embodiment including an Interlocking Mounting System for Solar Panels with configurable Mounting Bracket components in use (Back View).

FIG. 40 illustrates a back or bottom view of an Interlocking Mounting System for Solar Panels—with configurable Mounting Bracket components in use.

See FIG. 39, but in this FIG. 40, the attachment of Mounting Bracket Base-attached components may include attachment of a detachable Female Connector Tab [502] and a detachable Male Connector Tab [504] that may be locked into the Mounting Bracket Base [500]. In addition, the wind deflectors [508] and the Transition Box [510] can be connected directly to each Mounting Bracket Base [500].

The Panel Rails [464], Mounting Bracket Bases [500], detachable Female Connector Tab [502] and a detachable Male Connector Tab [504] are all manufactured from non-conductive, UV resistant and structural materials using an extruded, molded or stamped process. These parts may contain components or assemblies of corrosion-resistant metal.

A preliminary configuration step for this Interlocking Mounting System for Solar Panels may be performed in a controlled, manufacturing environment involving use of a chemical adhesive to attach a set of four (4) Mounting Bracket Bases [500], and Panel Rails [464] to the back of a Solar Panel [472]. A secondary configuration step may include attaching detachable Female Connector Tabs [502], detachable Male Connector Tabs [504] and Mounting Feet [415]—see FIG. 32] to Mounting Bracket Bases [500] and attaching accessories to the Panel Rail [464]. This secondary configuration step can be performed in a controlled, manufacturing environment or on the project site or both.

Accessories can be attached to the Panel Rail [464]:
  a. Cable Trays [468] which can be clipped on to the Panel Rails and be moved along the Panel Rail.
  b. Rail-installed inverter [506] which can be attached to the Panel Rail.

Accessories can be attached to the Mounting Bracket Base [500] as required:
  a. Transition box [510] which can be attached to the Mounting Bracket base and or attached to inside of the wind deflector [508].
  b. A set of wind deflectors [508] can be connected directly to each Mounting Bracket Base [500] on each perimeter side of an array.

Figure 41:
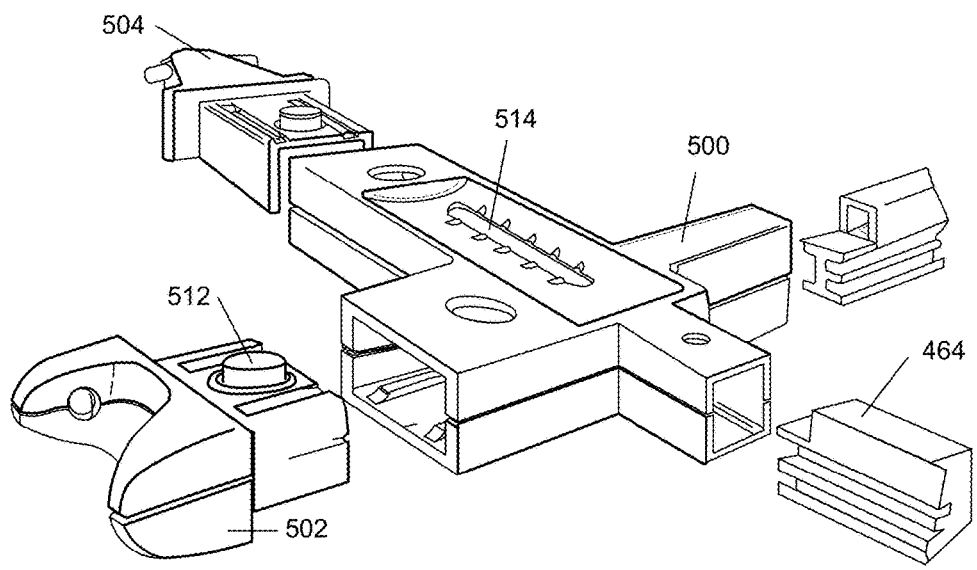
FIG. 41 illustrates an embodiment including a Configurable Mounting Bracket Assembly for a solar panel module—Exploded Component Diagram.

FIG. 41 illustrates a further embodiment or second embodiment of a Configurable Mounting Bracket Assembly in an exploded view.

The Configurable Mounting Bracket in this further embodiment includes a detachable Female Connector Tab [502] and detachable Male Connector Tab [504]. With respect to interconnecting and interlocking Solar Panels together, the functionality of the detachable Female Connector Tab [502] and detachable Male Connector Tab [504] are identical to the a Female Connector Tab [420] and Male Connector Tab [440] described in FIG. 33 and FIG. 34, in that they allow for two adjacent Solar Panels to interconnect and interlock without separate hardware. In addition each detachable Female Connector Tab [502] and detachable Male Connector Tab [504] includes a sprung pin [512] mechanism that holds them secure to the Mounting Bracket Base [500], yet allows workers in the field to easily detach or attach the Connector Tabs [502, 504]. The Mounting Bracket Base [500] can accept and connect to various compatible Mounting Feet designed for different mounting applications, several of which are described in this application.

The Mounting Bracket Base [500] may include or couple to or be configured to integrate with a detachable Female Connector Tab [502] and a detachable Male Connector Tab [504], e.g., as illustrated in the example of FIG. 41, which are manufactured from non-conductive, UV resistant and structural materials using an extruded, molded or stamped process. These parts may contain components or assemblies of corrosion-resistant metal or non-conductive, UV resistant and structural materials. The detachable Female Connector Tab [502] and detachable Male Connector Tab [504] may have similar features as a Female Connector Tab [420] and Male Connector Tab [440] of the embodiments described with reference to FIG. 33 and FIG. 34, e.g., regarding their core functionality of achieving reliable pinned connections between Connector Tabs.

The Female Connector Tab [502] and detachable Male Connector Tab [504] have a sprung pin [512] which secures these Connector Tabs to the Mounting Bracket Base [500]. The Panel Rails [464] also connect to the Mounting Bracket Base [500] at two locations to bridge between Mounting Bracket Bases and support the Solar Panel [472] which is not shown in FIG. 41. The Mounting Bracket Base [500] includes a special connector slot [514] to support an adjustable Mounting Foot connection and a compliant material of various Mounting Feet These parts can be assembled in a controlled, manufacturing environment or in the field. The embodiments described with reference to FIG. 39 and FIG. 40 may be incorporated here for more on configuring these parts with adjacent components.

Figure 42:
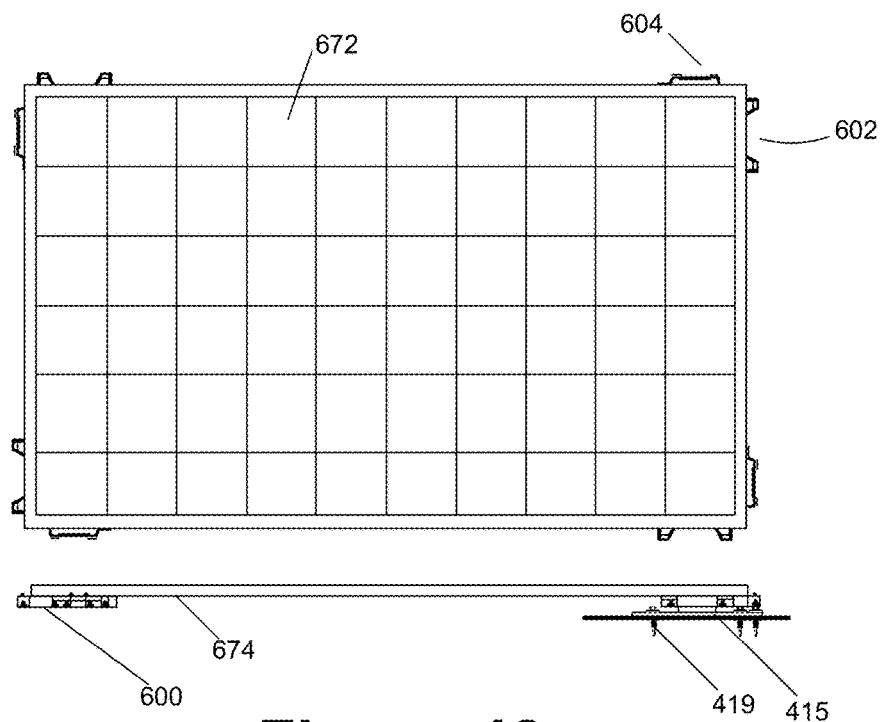
FIG. 42 illustrates an embodiment including a View of an Interlocking Mounting System on Framed Solar Panels.

FIG. 42 illustrates front and side views of an Interlocking Mounting System on Framed Solar Panels in accordance with certain embodiments.

In addition to adhering to the back of a frameless solar panel [472], a framed Mounting Bracket [600] can be adhered to a framed Solar Panel [672] in each of the four (4) corners of the panel. The framed Mounting Bracket [600] would deliver the same functionality as the previously described Mounting Bracket [400] (e.g., of FIG. 31, FIG. 32, FIG. 33 and/or FIG. 34) and Mounting Bracket Base [500] & detachable Connecting Tabs [502, 504] (in FIG. 39, FIG. 40 and FIG. 41) in their ability to reliably interconnect and interlock without separate or additional hardware. The Mounting Foot [415] may attach to a framed Mounting Bracket [600] using the same connection as the Mounting Foot [415] uses to attach to Mounting Bracket [400] and Mounting Bracket Base [500].

The framed Mounting Bracket [600] may be manufactured from non-conductive, UV resistant and structural materials using an extruded, molded or stamped process or may be manufactured using extruded or formed corrosion-resistant metals. The framed Mounting Bracket [600] may contain components or assemblies of corrosion-resistant metal or non-conductive, UV resistant and structural materials.

The framed Mounting Bracket [600] may attach to the back face edge [674] of the frame of a framed Solar Panel [672]. This attachment may be achieved using chemical adhesive in liquid, tape or other form or may be achieved using a mechanical connection in which the framed Mounting Bracket [600] would slide onto and clip to the back face edge [674] of the frame of a framed Solar Panel [672]. These parts can be assembled in a controlled, manufacturing environment or in the field.

Figure 43:
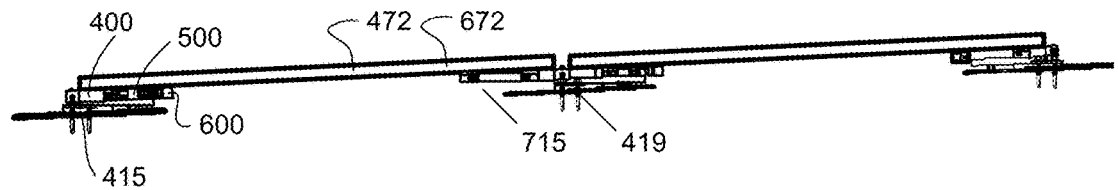
FIG. 43 illustrates an embodiment including a View of an Interlocking Mounting System on Solar Panels (side view) showing shared feet.

FIG. 43 illustrates in a side view an Interlocking Mounting System on Framed Solar Panels showing shared feet.

These may include functions described with reference to FIG. 31, FIG. 32, FIG. 33, FIG. 39, FIG. 40, FIG. 41 and FIG. 42. FIG. 43 further illustrates an Interlocking Mounting System that shares Mounting Feet at locations where 2 or more frameless Solar Panels [472] or framed Solar Panels [672] interconnect and interlock.

The parts making up the Interlocking Mounting System composed of materials, parts and mechanisms as described previously in this document.

At locations of interconnection where two (2) or more frameless Mounting Brackets [400], Mounting Bracket Base [500] with detachable Connector Tabs [502, 504] and or framed Mounting Brackets [600] interlock together, one (1) Mounting Foot [415] may be used to attach to one of the Mounting Brackets (as listed above). The remaining one (1) or more Mounting Brackets may have no Mounting Foot [415] connected [715]. Thus at points in which two (2) or more frameless Solar Panels [427] and/or framed Solar Panels [672] interlock, the panels in this embodiment share a Mounting Foot [415] and still other interlocked Solar Panels have no Mounting Foot attached [715]. These parts can be assembled in a controlled, manufacturing environment or in the field, as required.

Figure 44:
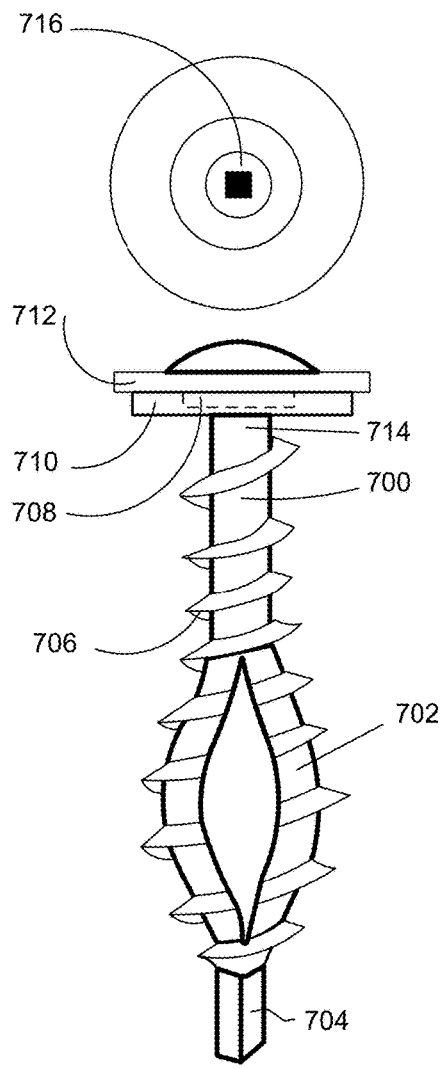
FIG. 44 illustrates an embodiment including a Self-drilling, split wood anchor with tamper resistant head.

FIG. 44 illustrates a self-drilling, split wood anchor [700] made with corrosion-resistant materials and tamper resistant head for attaching the Interlocking Mounting System through pitched roof applications. As noted in FIG. 9 (item: 106), FIG. 11 (item: 106 and 130), FIG. 12 (item: 106) and FIG. 32 (item: 419), anchors may penetrate the Mounting Foot [415] to secure the Interlocking Mounting System to the roof structure. In FIG. 11, these anchors may have special features [130] for securing through the plywood sheathing into the hollow area below a pitched roof system. This self-drilling, split wood anchor [700] may (in a single action or in a reduced number of steps) drill through materials to create its own pilot hole, drive the remaining wood anchor into the hole, seal against the Mounting Foot and lock with its own split shank. Placing conventional hollow-wall anchors typically involves at least a two or three step process (e.g., drilling pilot hole, inserting plastic anchor and then inserting a metal screw into the anchor which will expand once the screw is driven into it. The process can be reduced to combining a hollow wall lock like the pre-expanded split shank in a wood screw anchor designed for exterior (corrosion-resistant) exposure.

The self-drilling, split wood anchor [700] is used in certain embodiments to provide a secure anchor for a Mounting Foot [415] of an Interlocking Mounting System. Even if a worker applies too much torque and over tightens the split wood anchor, damaging the pitched roofing underlayment material (e.g., plywood or other sheet material composed of wood and resin), the split wood anchor [700] would maintain significant pullout strength.

In such a case of a worker over-tightening a standard anchor driven into plywood, the spinning of the anchor would strip the wood of its compressive strength against the anchor reducing the available pull-out force for that anchor. The self-drilling, split wood anchor [700] avoids that problem by using its pre-expanded split shank [702] to compress during installation and then expand after penetrating the roof sheathing creating strong compressive resistance to pullout which is independent of the quality of the grip of the anchor threads [706] through the wood sheathing material.

The self-drilling, split wood anchor [700] of FIG. 44 is used in certain embodiments to seal against water infiltration by using a synthetic rubber bonded washer [710] such as EPDM (ethylene propylene diene monomer) or other elastomer or other waterproofing material bonded to the head washer [712].

The self-drilling, split wood anchor [700] may be driven by a worker using an electric powered screw driver, an electric drill or a manual screwdriver.

The self-drilling, split wood anchor [700] may be made from corrosion-resistant materials such as stainless steel, galvanized steel or other corrosion-resistant materials using molding, casting, machining or other fabrication processes. The self-drilling, split wood anchor [700] has threads [706] designed for driving into wood materials. The self-drilling, split wood anchor [700] has in certain embodiments a pre-expanded split shank [702] which compresses during installation and then expands after penetrating the roof structure creating a strong compressive resistance to pullout. The self-drilling, split wood anchor [700] has in certain embodiments an integral drill tip [704] to cut a hole to help drive the remainder of the anchor. The self-drilling, split wood anchor [700] may use a rubber ring [710] bonded to the head washer [712] made of EPDM (ethylene propylene diene monomer) or similar elastomer, synthetic rubber or other waterproofing material bonded to the head washer [712]). To ensure that the rubber washer [710] is not overly compressed during installation, the anchor [700] in certain embodiments has an integral head washer [712] and has a washer stop [708] extending from the head washer [712] toward the shank [714]. The self-drilling, split wood anchor [700] may have a tamper resistant head such as the square screw drive [716] illustrated in FIG. 44 for securely attaching the Interlocking Mounting System through pitched roof applications.

Figure 45:
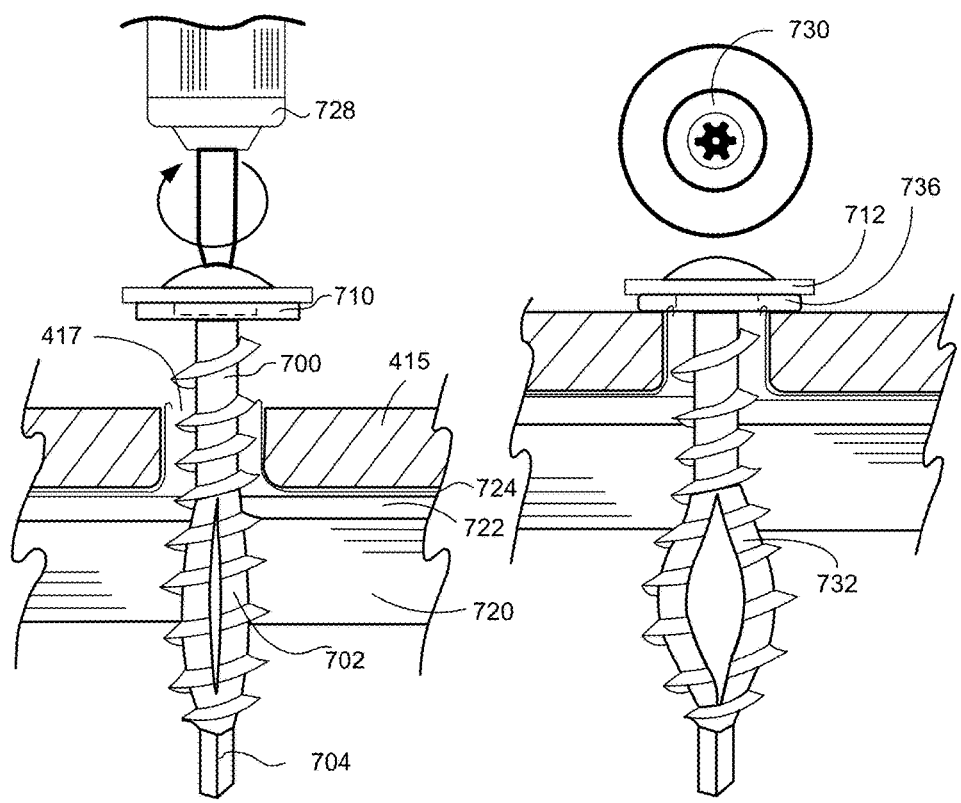
FIG. 45 illustrates an embodiment including an Installation of self-drilling, split wood anchor with tamper resistant head for mounting a solar panel module.

FIG. 45 illustrates the installation of a self-drilling, split wood anchor [700] made with corrosion-resistant materials and tamper resistant head for attaching the Interlocking Mounting System through pitched roof applications.

As noted in FIG. 44, this self-drilling, split wood anchor [700] will (in a single action or in a reduced number of steps) drill through materials to create its own pilot hole, drive the remaining wood anchor into the hole, seal against the Mounting Foot [415] and lock with its own split shank [702].

The self-drilling, split wood anchor's [700] main function after application is to provide a secure anchor for the Mounting Foot [415] of the Interlocking Mounting System. Even if a worker applies too much torque and over tightens the split wood anchor, damaging the pitched roofing underlayment material (plywood or other sheet material composed of wood and resin), the split wood anchor [700] would maintain significant pullout strength. In such a case of a worker over tightening a standard anchor driven into plywood, the spinning of the anchor would strip the wood sheathing [720] of its compressive strength against the anchor reducing the available pull-out force for that anchor. The self-drilling, split wood anchor [700] avoids that problem by using its pre-expanded split shank [702] to compress during installation and then expand after penetrating the wood sheathing [720]. This expanded split shank [732] will create a strong compressive resistance to pullout after the self-drilling split wood anchor is fully installed.

The self-drilling, split wood anchor [700] seals against water infiltration by using a synthetic rubber bonded washer [710] such as EPDM (ethylene propylene diene monomer) or other elastomer or other waterproofing material bonded to the head washer [712].

The self-drilling, split wood anchor [700] may be driven by a worker using an electric powered screw driver [728], an electric drill or a manual screwdriver.

The composition of the anchor 700 is the same or similar to that described regarding FIG. 44.

The split wood anchor [700] may be installed in the following process:

1. Insert the split wood anchor [700] into one of the Mounting Feet [415] at anchor points [417] as defined on FIG. 32.
2. The Mounting Foot anchor points [417] are lined by a flashing material [724] which forms a waterproof barrier under the Mounting Foot [415].
3. By rotating the split wood anchor [700] clockwise using an electric powered screw driver [728] or other tool, the split wood anchor's [700] drill bit tip [704] will penetrate the roofing material [722].
4. As the split wood anchor [700] continues to rotate, the split wood anchor's [700] drill bit tip [704] will penetrate the wooden sheathing [720] causing the anchor's threads to engage the wood sheathing material [720] and drive the split wood anchor [700] into the hole which will compress the split shank [702].

5. Once the split wood anchor head washer [712] is fully seated against the Mounting Foot [415], the compressed rubber washer [736] will exert a compressive seal. Also the compressed split shank [702] will return to its expanded split shank [732] for creating a strong compressive resistance to pull out.

Figure 46:
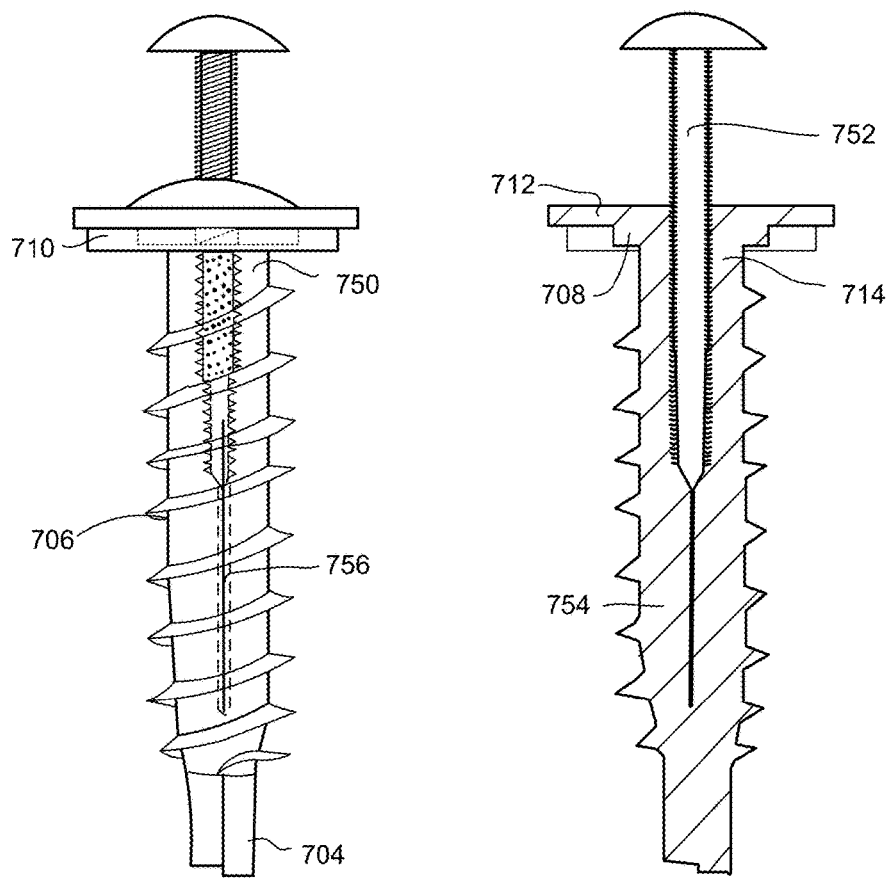
FIG. 46 illustrates an embodiment including a Self-drilling, expanding shank wood anchor with tamper resistant head for mounting a solar panel module.

FIG. 46 illustrates a self-drilling, expanding shank wood anchor [750] made with corrosion-resistant materials and tamper resistant head for attaching the Interlocking Mounting System through pitched roof applications.

As noted in FIG. 9 (item: 106), FIG. 11 (item: 106 and 130), FIG. 12 (item: 106) and FIG. 32 (item: 419), anchors may penetrate the Mounting Foot [415] to secure the Interlocking Mounting System to the roof structure. In FIG. 11, these anchors are shown with special features [130] for securing through the plywood sheathing into the hollow area below a pitched roof system. This self-drilling, expanding shank wood anchor [750] will (in a single action or in a reduced number of steps) drill through materials to create its own pilot hole, drive the remaining wood anchor into the hole, seal against the Mounting Foot [415] and lock with its own expanding shank [0146]. The self-drilling, expanding shank wood anchor [750] functions after application to provide a secure anchor for the Mounting Foot [415] of the Interlocking Mounting System. Even if a worker applies too much torque and over tightens the anchor, damaging the pitched roofing underlayment material (plywood or other sheet material composed of wood and resin), the expanding shank wood anchor [800] would maintain significant pullout strength. In such a case of a worker over tightening a standard anchor driven into plywood, the spinning of the anchor would strip the wood of its compressive strength against the anchor reducing the available pull-out force for that anchor. The self-drilling, expanding shank wood anchor [750] avoids that problem by using its compound shank that combines an inner machine screw [752] and an outer wood screw [754] with its core drilled out and tapped to accommodate the inner machine screw [752]. When the expanding shank wood screw [750] penetrates the roofing membrane and wood sheathing, and the head seats against the Mounting Foot (not shown), the inner screw [752] will begin to turn, driving down deeper into the outer wood screw [754]. The action of driving the inner screw [752] into the outer screw [754] will force the outer screw [754] to split along a longitudinal cut [756] which bisects the center line of the outer screw [754]. This action of splitting the outer screw [754] creates a strong compressive resistance to pullout which is independent of the quality of the grip of the anchor threads [706] through the wood sheathing material.

The self-drilling, expanding shank wood anchor [750] seals against water infiltration by using a synthetic rubber bonded washer [710] such as EPDM (ethylene propylene diene monomer) or other elastomer or other waterproofing material bonded to the head washer [712].

The self-drilling, expanding shank wood anchor [750] may be driven by a worker using an electric powered screw driver, an electric drill or a manual screwdriver.

The self-drilling, expanding shank wood anchor [750] may be made from corrosion-resistant materials such as stainless steel, galvanized steel or other corrosion-resistant materials using molding, casting, machining or other fabrication processes. The self-drilling, expanding shank wood anchor [750] has threads [706] designed for driving into wood materials. The self-drilling, expanding shank wood anchor [750] has an outer screw [754] which expands after penetrating the roof structure creating a strong compressive resistance to pullout. The self-drilling, expanding shank wood anchor [750] has an integral drill tip [704] to cut a hole to help drive the remainder of the anchor. The self-drilling, expanding shank wood anchor [750] may use a rubber ring [710] bonded to the head washer [712] made of EPDM (ethylene propylene diene monomer) or similar elastomer, synthetic rubber or other waterproofing material bonded to the head washer [712]). To ensure that the rubber washer [710] is not overly compressed during installation, the anchor [750] has an integral head washer [712] and has a washer stop [708] extending from the head washer [712] toward the shank [714].

Figure 47:
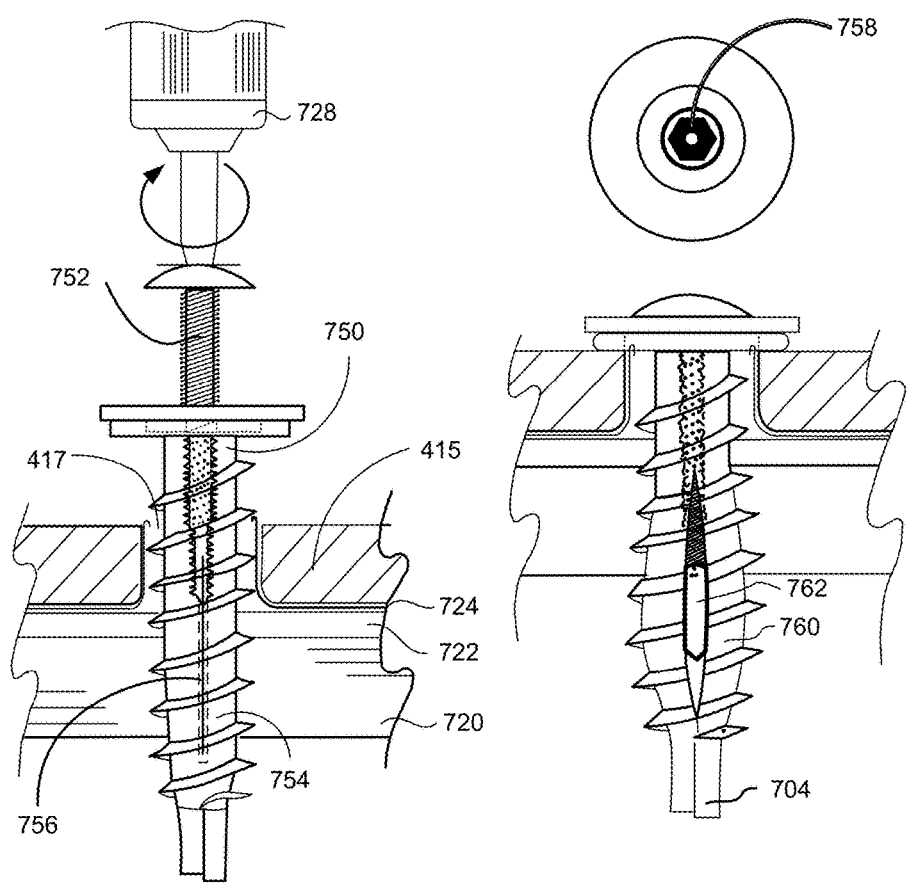
FIG. 47 illustrates an embodiment including an Installation of self-drilling, expanding shank wood anchor with tamper resistant head for mounting a solar panel module.

FIG. 47 illustrates the installation of a self-drilling, expanding shank wood anchor [750] made with corrosion-resistant materials and tamper resistant head for attaching the Interlocking Mounting System through pitched roof applications.

As noted in FIG. 46, this self-drilling, expanding shank wood anchor [750] will (in a single action or in a reduced number of steps) drill through materials to create its own pilot hole, drive the remaining wood anchor into the hole, seal against the Mounting Foot [415] and lock with its own expanding shank.

The self-drilling, expanding shank wood anchor's [750] main function after application is to provide a secure anchor for the Mounting Foot [415] of the Interlocking Mounting System. Even if a worker applies too much torque and over tightens the anchor, damaging the pitched roofing underlayment material (plywood or other sheet material composed of wood and resin), the expanding shank wood anchor [800] would maintain significant pullout strength. In such a case of a worker over tightening a standard anchor driven into plywood, the spinning of the anchor would strip the wood of its compressive strength against the anchor reducing the available pull-out force for that anchor. The self-drilling, expanding shank wood anchor [750] avoids that problem by using its compound shank that combines an inner machine screw [752] and an outer wood screw [754] with its core drilled out and tapped to accommodate the inner machine screw [752]. When the expanding shank wood screw [750] penetrates the roofing membrane and wood sheathing, and the head seats against the Mounting Foot (not shown), the inner screw [752] will begin to turn, driving down deeper into the outer wood screw [754]. The action of driving the inner screw [752] driving into the outer screw [754], will force the outer screw [754] to split along a longitudinal cut [756] which bisects the center line of the outer screw [754]. This action of splitting the outer screw [754] creates an expanded outer screw [760] that exerts a strong compressive resistance to pullout.

The self-drilling, expanding shank wood anchor [750] seals against water infiltration by using a synthetic rubber bonded washer [710] such as EPDM (ethylene propylene diene monomer) or other elastomer or other waterproofing material bonded to the head washer [712].

The self-drilling, expanding shank wood anchor [750] may be driven by a worker using an electric powered screw driver [728], an electric drill or a manual screwdriver.

Refer to FIG. 46. The self-drilling, expanding shank wood anchor [750] may have a tamper resistant head such as a hex screw drive [758] for securely attaching the Interlocking Mounting System through pitched roof applications.

The self-drilling, expanding shank wood anchor may be installed through the following example process:
1. A worker inserts the expanding shank wood anchor [750] into one of the Mounting Feet [415] anchor points [417] as defined in FIG. 32.
2. The Mounting Foot anchor points [417] are lined by a flashing material [724] which forms a waterproof barrier under the Mounting Foot [415].
3. By rotating the expanding shank wood anchor [750] clockwise using an electric powered screw driver [728] or other tool, the expanding shank wood anchor [750] drill bit tip [704] will penetrate the roofing material [722].
4. As the expanding shank wood anchor [750] continues to rotate, expanding shank wood anchor [750], drill bit tip [704] will penetrate the wooden sheathing [720] causing the anchor's threads to engage the wood sheathing material [720] and drive the expanding shank wood anchor [750] into the hole.
5. When the expanding shank wood screw [750] penetrates the roofing membrane and wood sheathing, and the head seats against the Mounting Foot [415], the inner screw [752] will begin to turn, driving down deeper into the outer wood screw [754]. As a result, the full penetrated inner screw [762] will be seated fully into the expanded outer screw [760].
6. The action of driving the inner screw [752] into the outer screw [754], will force the outer screw [754] to split along a longitudinal cut [756] which bisects the center line of the outer screw [754].
7. This action of splitting the outer screw [754] creates an expanded outer screw [760] that exerts a strong compressive resistance to pullout.

Figure 48:
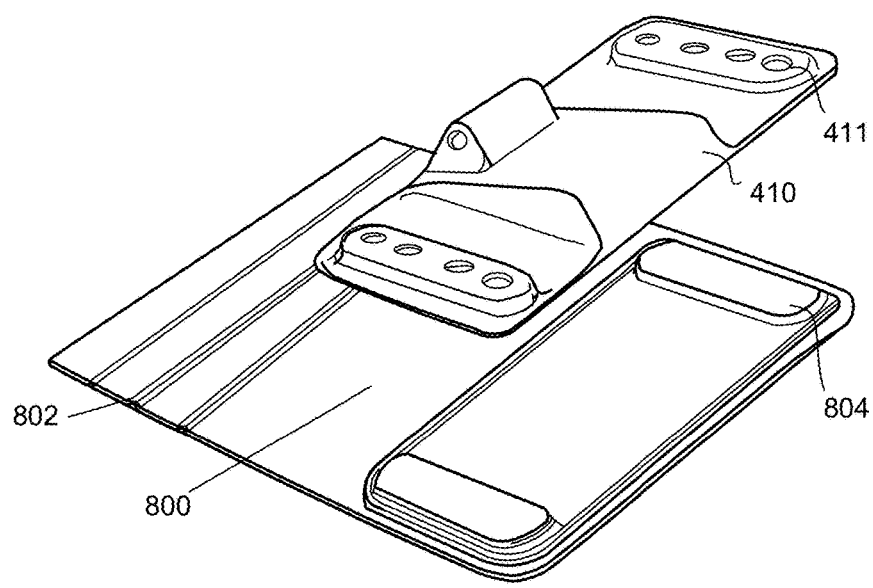
FIG. 48 illustrates an embodiment including an Adjustable Mounting Foot Assembly for a solar panel module and Flashing for pitched roof applications.

FIG. 48 Adjustable Mounting Foot Assembly and Flashing for pitched roof applications.

FIG. 48 details the adjustable Mounting Foot Assembly and Flashing for pitched roof applications.

FIG. 37 and FIG. 38 provide detail for the adjustable Mounting Foot Assembly for pitched roof applications. This FIG. 48 adds details of the molded foot [410] at the bottom of the adjustable Mounting Foot Assembly and the Fitted Flashing [800] which aligns to the bottom of the molded foot [410]. As roofing shingle exposed courses vary in size from approximately 4 inches to 8 inches, the Fitted Flashing [800] may have break off tabs [802] on the up slope edge of the flashing, allowing workers to adjust the size of the Fitted Flashing [800] to fit under the shingle course above the exposed course where the molded foot [410] will be installed. In addition, the Fitted Flashing may have raised areas [804] that align with the bottom of the molded foot [410] and prevent water runoff down the flashing to infiltrate the penetrations.

Refer to FIG. 37 and FIG. 38 for composition of the adjustable Mounting Foot Assembly and the molded foot [410]. The Fitted Flashing [800] may be manufactured using sheet metal die stampings, in stainless or aluminum or galvanized metal. The Fitted Flashing [800] may have break off tabs [802] on the up slope edge of the flashing. In addition, the Fitted Flashing may have raised areas [804] that align with the bottom of the molded foot [410]. The molded foot [410] will have attachment points or formed holes [411] in the unit to accept standard screw anchors or self-drilling wood anchors [See FIGS. 44, 45, 46 and 47].

The Fitted Flashing [800] will be placed on the pitched roof under composition shingle courses immediately above the attachment point where a Mounting Foot Assembly will be attached to the roof. After the Fitted Flashing [800] is installed on the roof, the molded foot [410] would be placed on top of the raised areas [804] of the Fitted Flashing [800]. Then a standard screw anchors or self-drilling wood anchors [See FIGS. 44, 45, 46 and 47] will be driven through the attachment points or formed holes [411] and through the Fitted Flashing [800].

Figure 49:
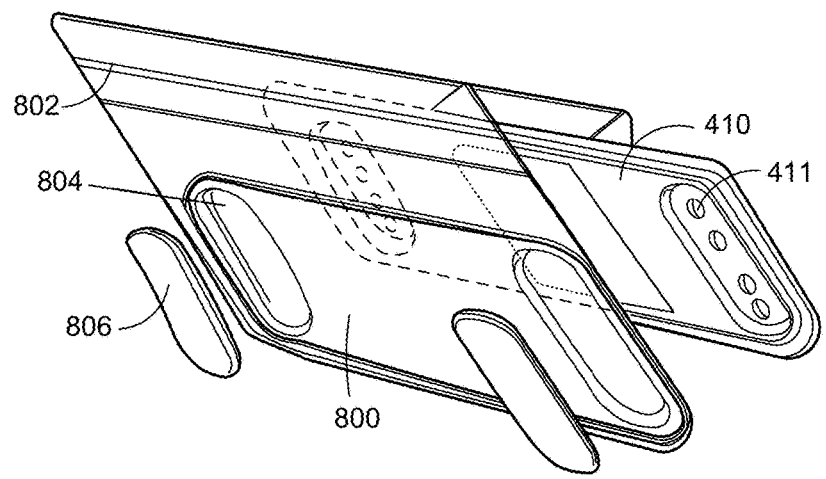
FIG. 49 illustrates an embodiment including a Bottom view of adjustable Mounting Foot Assembly for a solar panel module and Flashing for pitched roof applications.

FIG. 49 Bottom view of adjustable Mounting Foot Assembly and Flashing for pitched roof applications.

FIG. 49 details the bottom view of adjustable Mounting Foot Assembly and Flashing for pitched roof applications.

FIG. 37 and FIG. 38 provide detail for the adjustable Mounting Foot Assembly for pitched roof applications. FIG. 48 details the molded foot [410] at the bottom of the adjustable Mounting Foot Assembly and the Fitted Flashing [800] which aligns to the bottom of the molded foot [410]. This FIG. 49 details the bottom of the Fitted Flashing [800] which shows a volume of waterproofing material [806] placed below each of the raised areas [804] of the Fitted Flashing [800]. This waterproofing material [806] will serve as an additional barrier to water infiltration for any anchors installed through the attachment points or formed holes [411] in the molded foot [410].

Also, a little bead may be provided around the perimeter for an added layer of protection to prevent micro wicking.

Refer to FIG. 37 and FIG. 38 for composition of the adjustable Mounting Foot Assembly and the molded foot [410] and FIG. 48 for composition of the Fitted Flashing [800]. FIG. 49 illustrates waterproofing material [806] which may be a natural or synthetic rubber, butyl rubber, EPDM rubber, elastomer or other waterproofing material in a liquid, tape, pad or other form.

Referring to FIG. 48 for configuration of The Fitted Flashing [800] with the Mounting Foot Assembly molded foot [410], in the installation of an adjustable Mounting Foot Assembly, standard screw anchors or self-drilling wood anchors [See FIGS. 44, 45, 46 and 47] will be driven through the attachment points or formed holes [411], through the Fitted Flashing [800] and through the waterproofing material [806]. The waterproofing material [806] will coat each anchor [See FIGS. 44, 45, 46 and 47] and provide a seal against the pitched roofing material.

Figure 50:
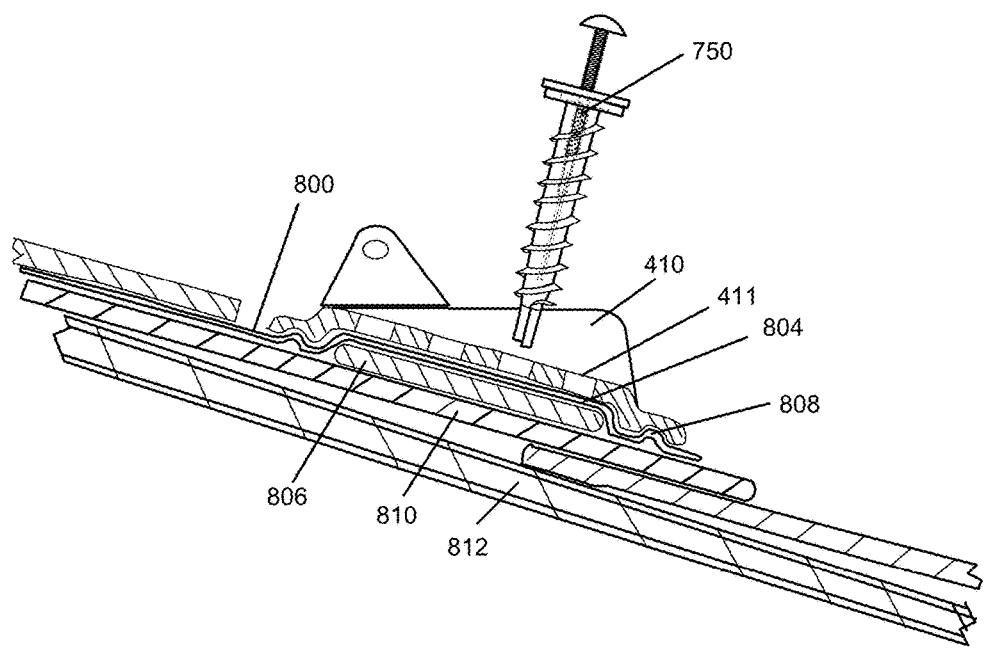
FIG. 50 illustrates an embodiment including a cross-section of adjustable Mounting Foot Assembly for solar panel module and Flashing for pitched roof applications.

FIG. 50 illustrates a cross-sectional view through an adjustable Mounting Foot Assembly and Flashing for pitched roof applications.

FIG. 37, FIG. 38, FIG. 48 and FIG. 49 provide detail for the adjustable Mounting Foot Assembly [415], Fitted Flashing [800] for pitched roof applications including the waterproofing material [806]. This FIG. 50 details an example of an entire assembly process: A self-drilling, expanding shank wood anchor [750] is set to be driven through the attachment points or formed holes [411], through the Fitted Flashing [800] and through the waterproofing material [806], through the pitched roofing material [810], which may be composite shingle, corregated metal, standing seam metal, tile or other pitched roofing systems (the Fitted Flashing may be employed in coursed roofing systems like composite shingle roofing, flat tile, shake, etc.). The Fitted Flashing [800] may have a small bead [808] around the perimeter of the raised area [804] as an added layer of protection to prevent wicking of water into the raised area [804].

Refer to FIG. 37 and FIG. 38 for composition of the adjustable Mounting Foot Assembly and the molded foot [410] and FIG. 48 for composition of the Fitted Flashing [800]. FIG. 49 illustrates waterproofing material [806] which may be a natural or synthetic rubber, butyl rubber, EPDM rubber, elastomer or other waterproofing material in a liquid, tape, pad or other form.

Referring to FIG. 48 and FIG. 49 for configuration of a Fitted Flashing [800], molded foot [410] and waterproofing material [806].

Figure 51:
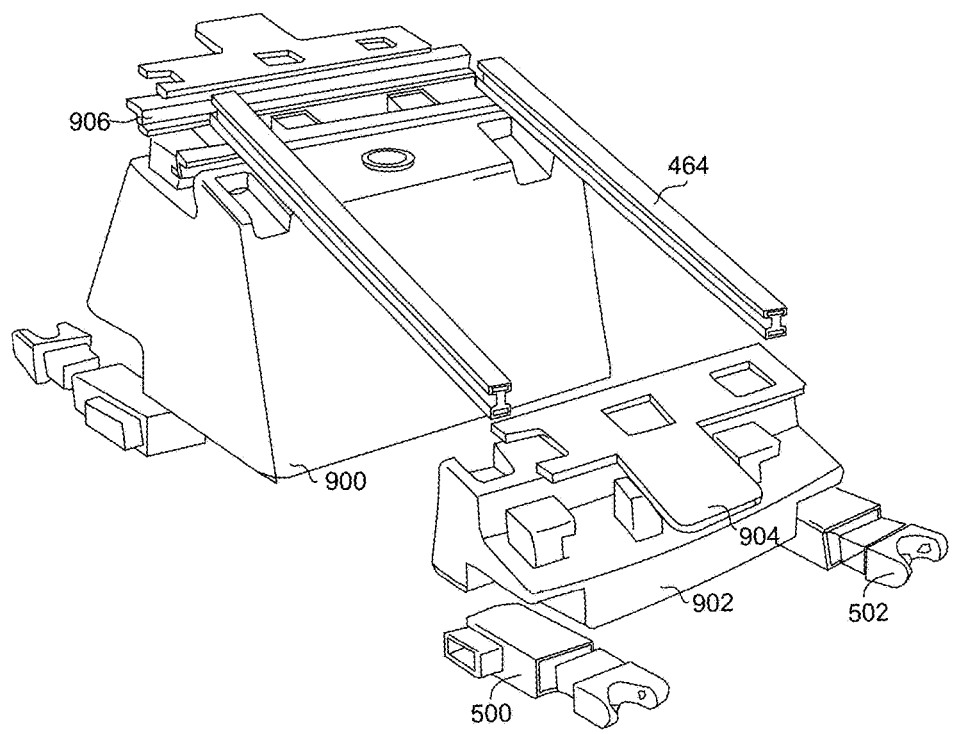
FIG. 51 illustrates an embodiment including an Isometric of Ballasted Foot (exploded view) for a solar panel module for flat roof applications.

FIG. 51 illustrates an isometric ballasted foot (exploded view) for flat roof applications In FIG. 4, a Ballasted Foot is described. In FIG. 51 an alternative ballasted foot structure of non-conductive parts is shown. The main function of this alternative ballasted foot is to provide a secure structure made of non-conductive materials that provides the ability to interlock and optionally release. The ballasted foot includes an assembly of a tall base [900] and a short base [902] which together support a frameless module using a combination of panel rails [464] and latch rails [906]. The release tabs [904] engage with the latch rails [906] to lock the frameless modules securely to the tall base [900] and the short base [902]. The tall base [900] and a short base [902] may be filled with any number of ballast materials, including but not limited to sand, gravel, and water to resist dynamic wind forces. The tall base and short base create a fixed angle relative to a flat roof which is optimized for the collection of solar energy—from 10 degrees to 25 degrees in certain embodiments. The use of Mounting Bracket Base [500], detachable Female Connector Tab [502] and a detachable Male Connector Tab [504] allow the solar modules to be easily removed from tall and short bases for repair or reconfiguration. These connectors also allow the ballasted feet to be laid out on a roof without ballast without modules attached making it easier to lay out large installations. The circle at the top of the tall base [900] is a ballast fill hole with a sealable plug to allow the ballasted feet to be filled after placing.

The Mounting Bracket Base [500], detachable Female Connector Tab [502] and a detachable Male Connector Tab [504] are all manufactured from non-conductive, UV resistant and structural materials using an extruded, molded or stamped process. These parts may contain components or assemblies of corrosion-resistant metal or non-conductive, UV resistant and structural materials. The detachable Female Connector Tab [502] and detachable Male Connector Tab [504] have similar details to the a Female Connector Tab [420] and Male Connector Tab [440] described in FIG. 33 and FIG. 34, regarding their core functionality of achieving reliable pinned connections between Connector Tabs. The tall base [900] and short base [902] may be hollow-molded or rotationally molded or manufactured in other means using a non-conductive material set. The latch rails [906], and the panel rails and release tabs [904] may be made of non-conductive, UV resistant and structural materials using an extruded, molded or stamped process. These parts may contain components or assemblies of corrosion-resistant metal.

Figure 52:
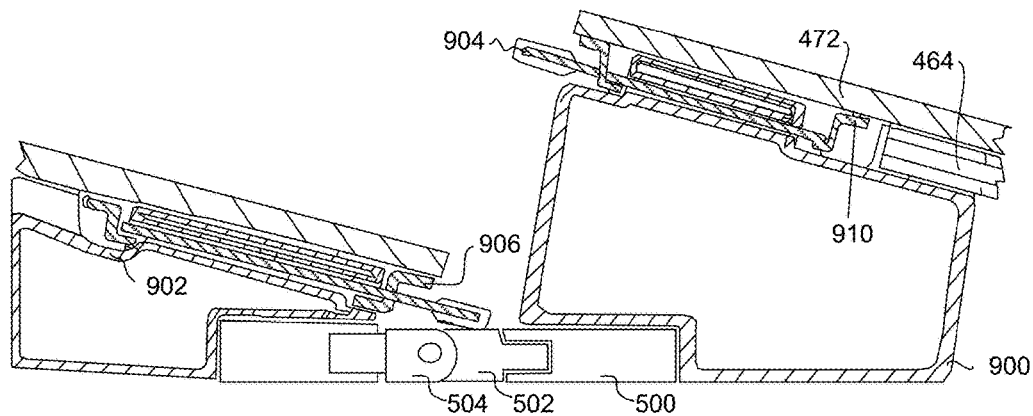
FIG. 52 illustrates an embodiment including a cross-section of Ballasted Foot for solar panel module for flat roof applications.

FIG. 52 illustrates in section view an alternative type of Ballasted Foot in for flat roof applications.

Refer to FIG. 4, for one Ballasted Foot description. An alternative Ballasted Foot description is found in FIG. 51. FIG. 52 shows a solar module [472] attached to latch rails and panel rails [464] using an adhesive tape, liquid or other form [910]. Ballast material could be secured in the bottom of either the tall base [900] or the short base [902].

See FIG. 51 for the composition of these components.

A solar module [472] may be attached to latch rails [906] and panel rails [464] using an adhesive tape, liquid or other form [910]. The tall base [900] and the short base [902] are connected to the latch rails using release tabs [904]. The short base assembly and tall base assembly are joined and locked together using a mounting bracket [500] attached to each base and a detachable Female Connector Tab [502] and a detachable Male Connector Tab [504] to complete the connection. Ballast material (not shown) could be secured in the bottom of either the tall base [900] or the short base [902].

Figure 53:
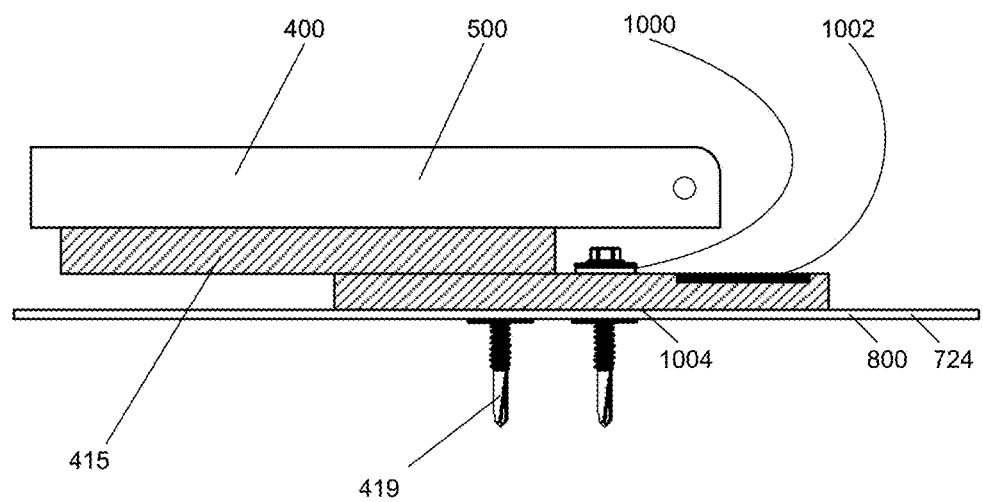
FIG. 53 illustrates an embodiment including Sensors at Mounting Feet for a solar panel module.

FIG. 53 shows the details of the optional integral sensors and transmitter at mounting feet for validating compression of mounting feet indicative of secure integrated module installation.

Function:

FIGS. 32, 37, 38, 43, 48, 49, and 50 describe the Mounting Foot [415] designed for composite shingle applications and connects to the Mounting Bracket [400] or Mounting Bracket Base [500]. FIGS. 44, 45, 46 and 47 describe self-drilling wood anchors that secure the Mounting Foot [415]. FIG. 53 describes the sensors and transmitters that may be integrated into the wood anchors and or the Mounting Foot to allow for electronic validation of the anchoring of the Mounting Foot [415]. The compressive sensor (in location A [1000] or location B [1004] will validate that the anchors were properly installed and are providing the minimum mechanical compressive pressure to meet or exceed the waterproofing and structural loading specifications. With a minimum compressive pressure at each anchor point, waterproofing and structural attachment are provided. The Mounting Foot [415] may contain a radio frequency transmitter [1002] that can be read by a remote mobile device.

COMPOSITION: The Mounting Foot assembly may contain a pressure sensor either in location A, a ring around the screw anchor [1000], or location B, integrated into the bottom of the mounting foot [1004]. The pressure sensors [1000 or 1004] may be attached adjacent to the anchor point where an anchor is driven through the mounting foot [415], into the flashing [724] or Fitted Flashing [800], roofing material (not shown) and into the roofing substrate (not shown). The anchor [419] exerts force against the mounting foot which in turn exerts force against the integral waterproofing ring and roof flashing. The pressure sensors [1000 or 1004] measure the compressive pressure between the mounting foot and the roof flashing [1004] or screw anchor head and the mounting foot [1000] to confirm the compliance to the waterproofing and structural anchor installation specifications.

The Mounting Foot [415] may contain a radio frequency transmitter [1002] located on the top or near the top of the Mounting Foot [415] that would communicate with a remote mobile device using one communication protocol or a plurality of communication protocols including but not limited to high frequency (HF), ultra-high frequency (UHF) or Bluetooth standards. These transmitters may be either passive (having no internal power source and not sending a signal on regular intervals) or active (having their own internal power source and sending a signal on regular intervals. A similar system of sensors and transmitters may be employed at other connection points including the mounting bracket to mounting bracket or the mounting bracket to mounting foot connections.

A mobile electronic device (such as a mobile phone, tablet or specialty radio frequency reader) can read signals originating from each transmitter [1002] and confirm the compressive pressure meets a minimum value for the specific application.

The software code or application on the mobile device may collect one or more of user entered information, photographic images, the longitudinal and latitudinal location from the mobile device global positioning system sensor, the radio frequency transmitter signals including compressive pressure compliance, a unique identifier for each transmitter and any other relevant information. The information collected by the mobile device may be communicated to remote computing devices and machines using Internet protocols—either in real-time (if a network signal exists on the mobile device) or at a later time (when the network signal is available or when the mobile device is connected to an Internet connected computer).

Figure 54:
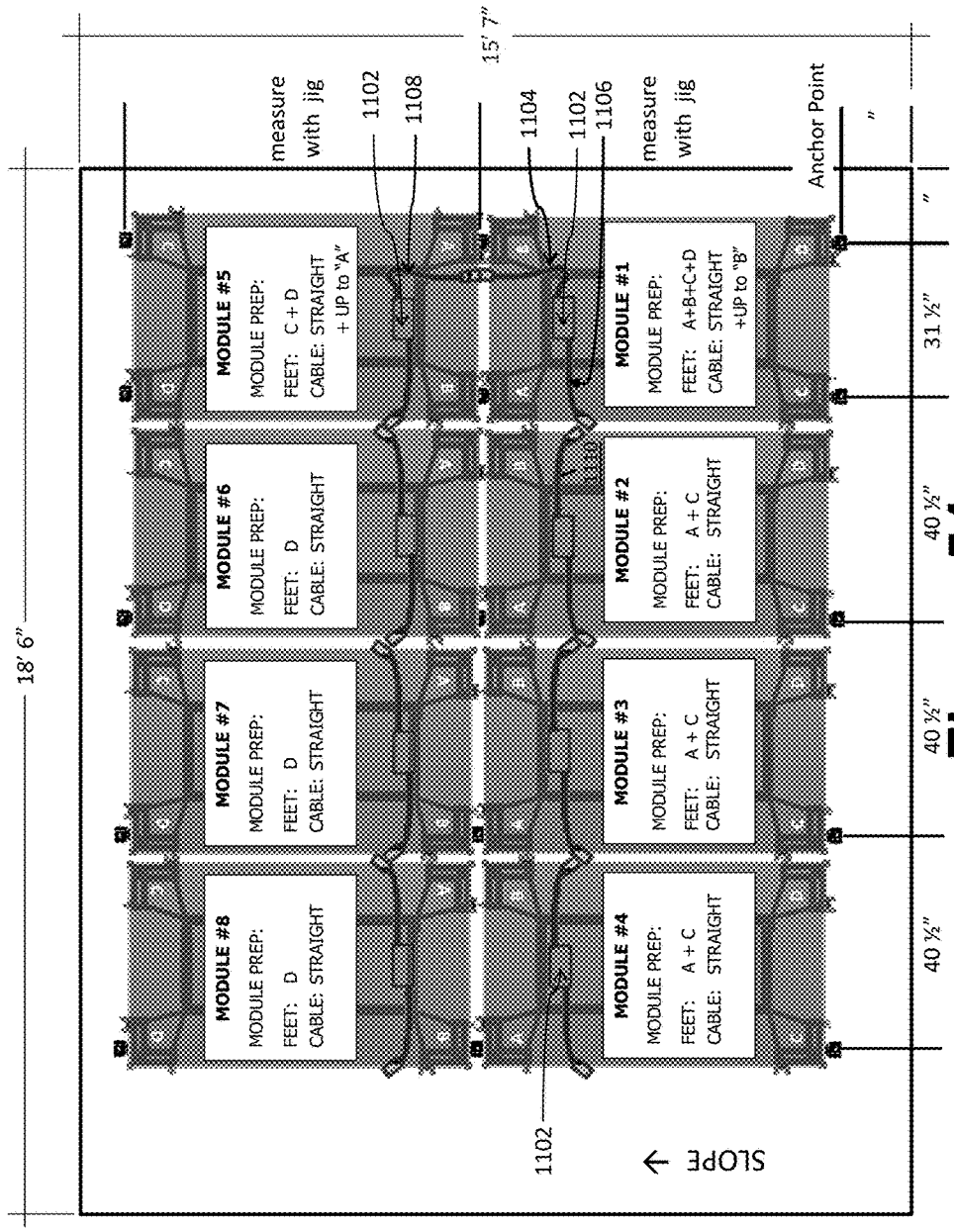
FIG. 54 schematically illustrates an embodiment including eight installed solar panels coupled together in 4×2 arrangement.

FIG. 54 schematically illustrates an embodiment including eight installed solar panels coupled together in 4×2 arrangement. Two rows of four solar modules are shown in the example of FIG. 54. Modules 1-4 are higher on the roof than modules 5-8. Various numbers of modules can be installed, including a single module or any number of multiple modules that may each be stand alone or coupled together in groups of two or more. Each preassembled solar module in accordance with certain embodiments can be coupled to another preassembled solar module at either or both long sides and/or at either or both short sides. Thus, for example, a 3×3 arrangement may be installed, where a center module is coupled to an adjacent solar module at each of its four sides.

In the example of FIG. 54, module 1 is installed to the roof by coupling each of its four preassembled mounting brackets to one or four mounting feet. The mounting feet may be coupled to the mounting brackets in preassembly or at the site prior to coupling the solar module to the roof. In another embodiment, one or more mounting feet may be coupled to the roof prior to coupling with a mounting bracket of a solar module that is being installed.

An electrical box 1102 is included with the solar module 1. The electrical box 1102 has cables 1104 and 1106 coupled electrically thereto and extending each toward an adjacent solar module. In FIG. 54, cable 1104 is turned so that it can connect to cable 1108 of module 5, while cable 1106 is a straight cable that connects to cable 1110 of module 2. Cable 1108 is also turned to connect with cable 1104, as modules 1 and 5 are end modules in the example arrangement of FIG. 54. The cables of modules 2-4 and 6-8 are each straight like cable 1106 of module 1.

The electrical box 1102 of module 1 is coupled to one of the two short stiffeners (among the four stiffeners that are arranged to form a smaller rectangular shape than the solar panels themselves: two of the four stiffeners are long and the other two stiffeners are short, the two rectangular shapes being approximately in proportion in FIG. 54). Similar electrical boxes are similarly disposed in each of modules 2-4, i.e., coupled to the short stiffeners that is lower on the roof than its counterpart. Similar electrical boxes are also disposed in each of modules 5-8, except these are coupled to the short stiffener that is higher on the roof than its counterpart. In this way, the four electrical boxes of modules 1-4 are disposed each closer to adjacent electrical boxes of modules 5-8 than they would be if the electrical boxes included with modules 5-8 were coupled to the other short stiffener that is lower on the roof than its counterpart.

Each solar module illustrated in the example of FIG. 54 has four corners labeled as A, B, C and D, wherein the electrical boxes are disposed closer to corners A and B than to corners C and D. The preassembled bracket at each of corners A, B, C and D of module 1 is coupled to a mounting foot. Only the preassembled brackets at corners A and C of modules 2-4 are coupled to mounting feet, and only the preassembled brackets at corners C and D of module 5, and only the preassembled brackets at corners D of modules 6-8 are coupled to mounting feet in preassembly either at the factory or at the site prior to being affixed, mounted, attached or otherwise connected mechanically to the roof. The mounting brackets that are not coupled to mounting feet, as just identified for the example of FIG. 54, are coupled directly to a mounting bracket of an adjacent solar module.

In the example of FIG. 54, each single mounting bracket that is not coupled to another mounting bracket is preassembled with a mounting foot. Thus, the mounting brackets at corner D of module 1, corner C of module 5, corner D of module 8 and at corner C of module 4 are coupled to mounting feet in preassembly are not coupled with any other mounting bracket in the example of FIG. 54. In addition, each of the mounting brackets at corners A and C of modules 2-4 are preassembled with mounting feet, while each of the mounting brackets B and D of modules 2-4 does not have a mounting feet coupled thereto in preassembly.

In installation, mounting brackets B and D of modules 2-4 are coupled to mounting brackets A and C of an adjacent module rather than directly to the roof via a mounting foot and flashing. Similarly, mounting brackets A and B of modules 5-8 do not have mounting feet coupled thereto in preassembly, and each couples to mounting brackets B and A, respectively, of adjacent modules 1-4. With regard to modules 5-8, module 5 has mounting brackets C and D coupled to mounting feet, while brackets A and B are instead coupled to adjacent brackets, and modules 6-8 are preassembled with mounting feet coupled only to the mounting brackets at corner D for directly coupling to the roof, while the mounting brackets at corners A-C of modules 6-8 are instead coupled to brackets of adjacent modules. In short, wherever two or four adjacent solar module corners couple together in the example of FIG. 54, one mounting bracket (of the two or four) is directly coupled to the roof via a preassembled mounting foot while the other one or three are instead coupled to adjacent mounting brackets. Among the three instances where four corners of four different solar modules meet in the example of FIG. 54, three mounting brackets at the corners A of modules 6-8 are not coupled either (i) to the roof directly via a mounting foot or (ii) to an adjacent mounting bracket that is itself coupled to the roof directly via a mounting foot.

Figure 55:
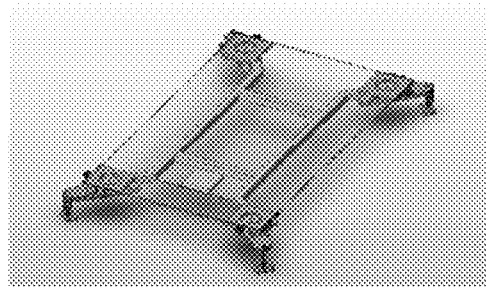
FIG. 55 schematically illustrates a preassembled solar panel including mounting brackets in accordance with certain embodiments.

FIG. 55 schematically illustrates a preassembled solar panel including mounting brackets in accordance with certain embodiments.

Figure 56:
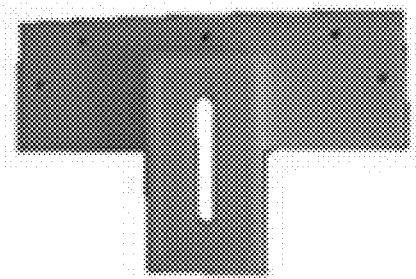
FIG. 56 schematically illustrates a mounting foot in accordance with certain embodiments.

FIG. 56 schematically illustrates a mounting foot in accordance with certain embodiments.

Figure 57:
FIG. 57 schematically illustrates an anchor including a snap toggle and machine screw in accordance with certain embodiments.

FIG. 57 schematically illustrates an anchor including a snap toggle and machine screw in accordance with certain embodiments.

Figure 58:
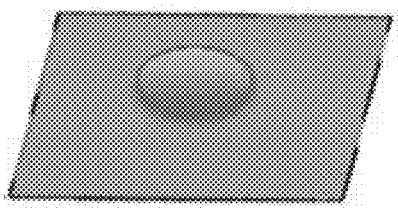
FIG. 58 schematically illustrates a flashing in accordance with certain embodiments.

FIG. 58 schematically illustrates a flashing in accordance with certain embodiments.

Figure 59:
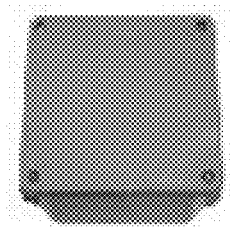
FIG. 59 schematically illustrates a junction box in accordance with certain embodiments.

FIG. 59 schematically illustrates a junction box in accordance with certain embodiments.

Figure 60:
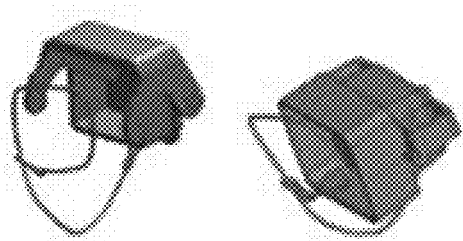
FIG. 60 schematically illustrates a pair of end caps in accordance with certain embodiments.

FIG. 60 schematically illustrates a pair of end caps in accordance with certain embodiments.

A example method of installing a set of four preassembled solar modules of a solar electric system that includes snap together modules that may be attached directly to a composite shingle roof, for example, without any prerequisite mounting structure. Steps A to D below are general steps involved in an example process in accordance with certain embodiments.

A. Layout Roof (for flashing at each foot)

Use the INSTALLATION SCHEMATIC (e.g., FIG. 54) to guide the layout of flashing. Flashing is placed under each mounting foot. Mounting feet may be shared by up to four modules as described with reference to FIG. 54.

B. Place Flashing

Place flashing at each bracket centerline location, tucking the flashing under the next roofing course up.

C. Prep Modules

In this step, feet may be installed if they have not been coupled to mounting brackets in preassembly at the factory. Cables also should be dressed if not already preassembled. Before laying the modules on the roof, each should be prepared in accordance with the general principles described with reference to FIG. 54.

D. Install Modules

Lift the modules to the roof and install.

Further examples and alternative embodiments are described below with reference to FIGS. 61-80, which schematically illustrate a method of installing a set of four preassembled solar modules on a roof surface in accordance with certain embodiments.

Figure 61:
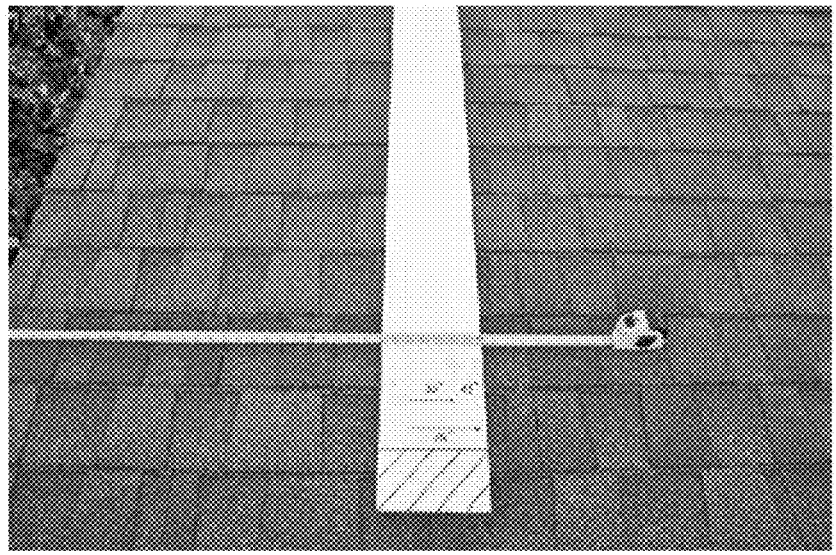

Referring to FIG. 61, set the Anchor Point on first course. An INSTALLATION SCHEMATIC may be provided that defines the dimension of the anchor point off of roof edge. FIG. 54 illustrates an example where the anchor point is set at the installation point of corner D of module 1.

Figure 62:
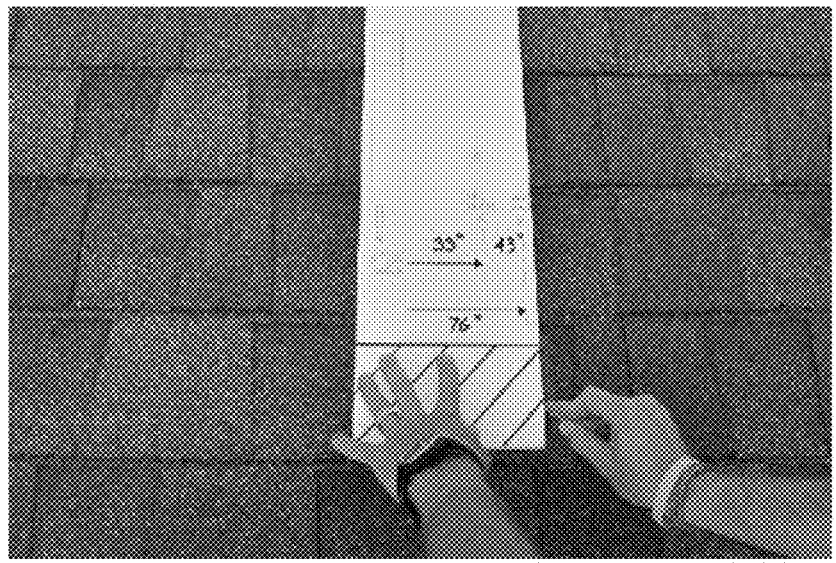

Referring to FIG. 62, mark centerline of 1st flashing on first course, e.g., where the lower left bracket, e.g., at corner C of module 1 of FIG. 54, is to be placed.

Figure 63:
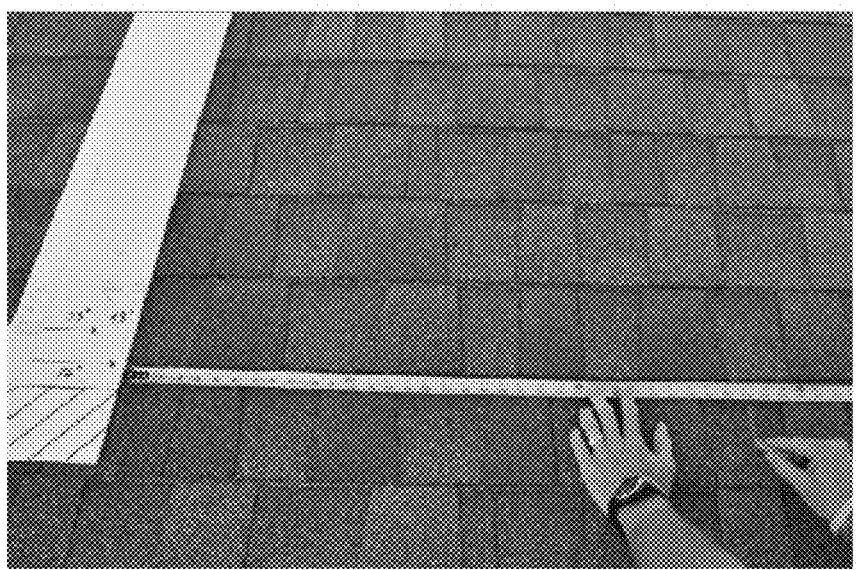

Referring to FIG. 63, Measure 31½" & mark centerline of 2nd flashing, e.g., where lower right bracket at corner B of module 1 of FIG. 54, is to be placed.

Figure 64:

Referring to FIG. 64, Measure 41¼" & mark centerline of 3rd flashing, e.g., where lower left bracket at corner C of module 2 in FIG. 54, is to be placed.

Figure 65:
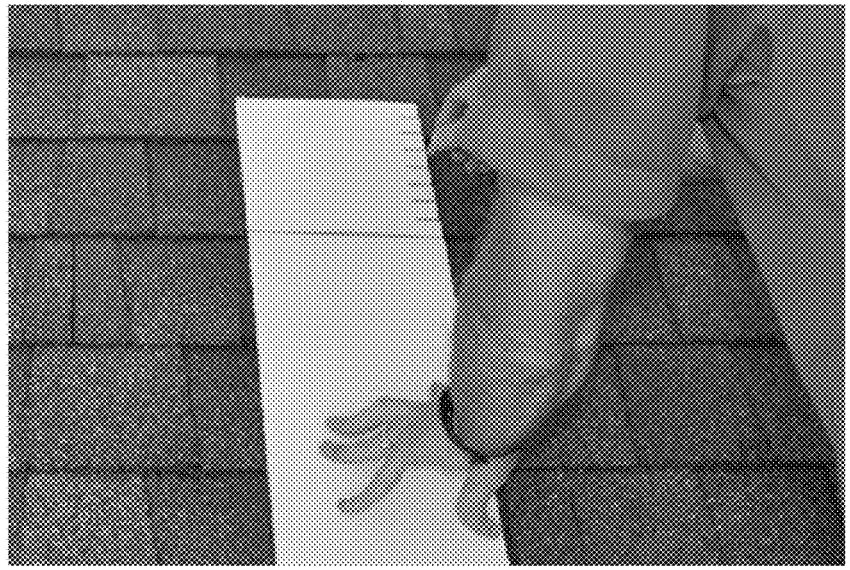

Referring to FIG. 65, Using Install Template, find & mark the open shingle course [up slope]. Use the course which aligns with 4 of the inch scale marks at the top of the template—this is the course where the next row of flashing will be placed and where the top of module 1 will be.

Figure 66:

Referring to FIG. 66, Mark the centerline of the 4th flashing, where the upper left corner A of module 1 will be placed.

Figure 67:

Referring to FIG. 67, Measure over 31½" and 41¼" and mark centerline of 5th and 6th flashing locations.

Figure 68:

Referring to FIG. 68, Install flashing at all centerline marks.

Figure 69:
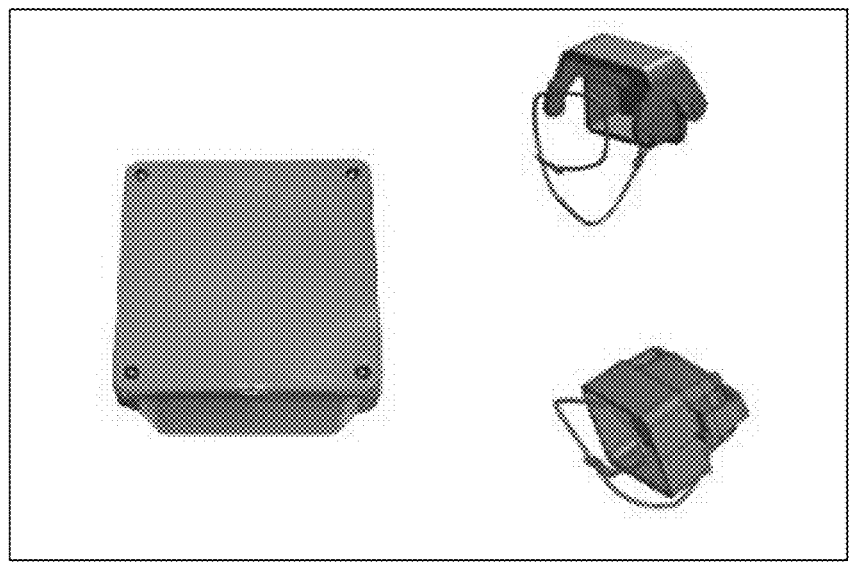

Referring to FIG. 69, Prep modules: Install Junction Box & End Caps.

Figure 70:
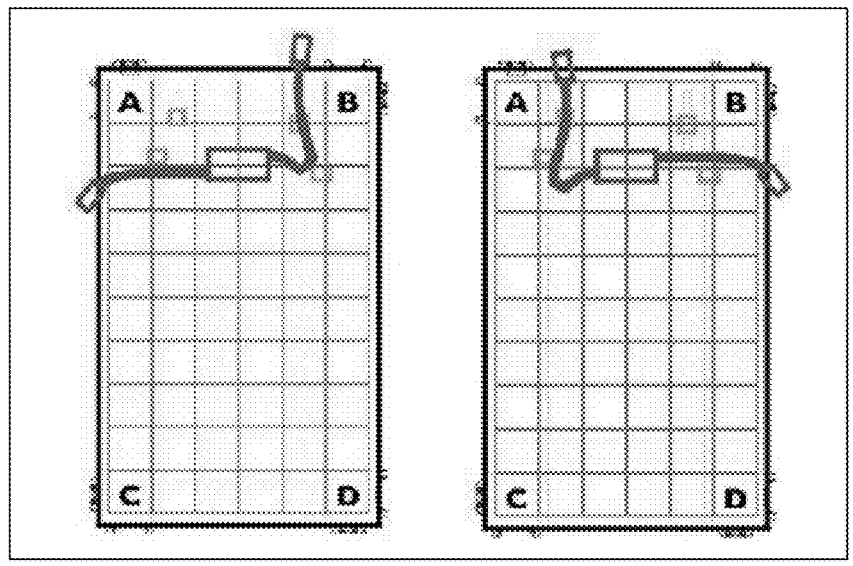

Referring to FIG. 70, Prep modules: Verify cable management (see INSTALLATION SCHEMATIC, e.g., as described above and illustrated at FIG. 54).

Figure 71:
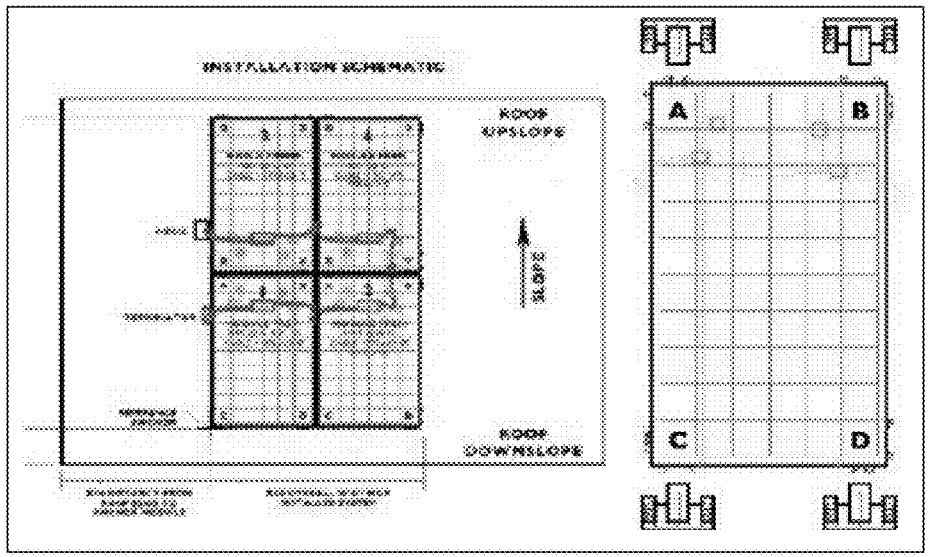

Referring to FIG. 71, Prep modules: Verify Feet locations, e.g., as described and illustrated with reference to FIG. 54.

Figure 72:
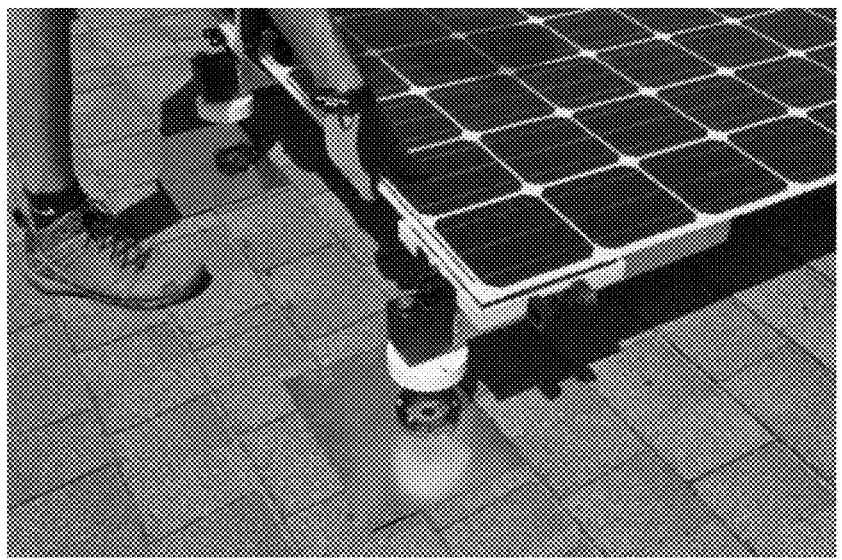

Referring to FIG. 72, Install Module 1 (aka "anchor module"). Align with flashing and secure. Adjust up slope feet as required & tighten with allen wrench.

Referring to FIG. 73, Drill ½" holes through feet (to Insert SNAPTOGGLE anchors into).

Referring to FIG. 74, DRILL 2× holes per foot. Insert SNAPTOGGLE into each ½" hole in foot. Insert toggle nut first (making sure that the toggle nut is positioned straight up and down.

Figure 75:
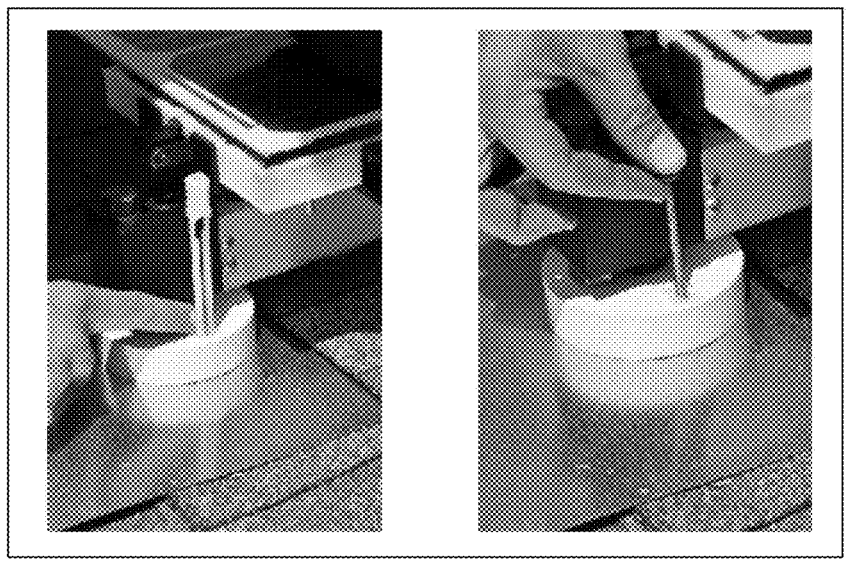

Referring to FIG. 75, SNAP off SNAPTOGGLE and insert ³⁄₁₆" screw through SNAPTOGGLE.

Figure 76:
Figure 77:
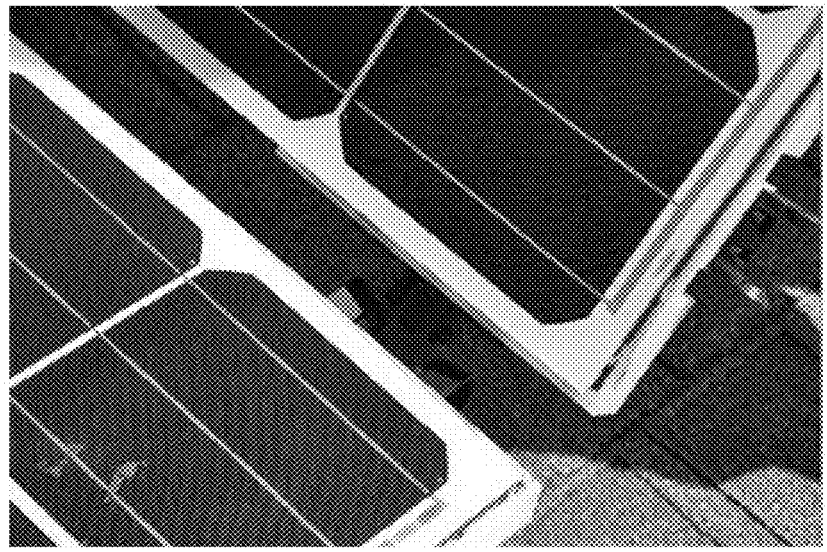

Referring to FIG. 76, Drive ³⁄₁₆" screw in SNAP-TOGGLE. It may facilitate this step if the top of SNAP is secured or held. TOGGLE to prevent spinning Referring to FIG. 77, Install Module 2: lock to Anchor Module. Hold module vertical against edge of Anchor Module. Lower & snap into the snap connectors of the anchor module.

Figure 78:

Referring to FIG. 78, Install Module 2: connect electrical cables. Connect the electrical cables and secure cables in the clips.

Referring to FIG. 79, Install Module 2: secure to roof. Rotate the panel down so that both feet are laying on roof. Adjust feet & tighten ¼ turn with wrench. Secure to the roof with two (2) SNAPTOGGLE Anchors in each foot and two (2) ³⁄₁₆ screws in each anchor.

Referring to FIG. 80, Repeat for Module 3 and Module 4. Repeat the steps illustrated at FIGS. 13-17 for Module 3. Repeat the steps illustrated at FIGS. 13-17 for Module 4.

FIG. 81 schematically illustrates a pair of uncoupled solar panel connectors in accordance with certain embodiments. A durable polymer may be used for the connectors, such that when coupling, certain components may bend and to permit a pair of male-female components, or protrusion-recess pairs, to couple together such as to snap into place at points of stable equilibrium where the protrusion just sets into the recess. When adjacent solar modules are brought together including adjacent mounting bracket connector pairs, the angular shapes of the four surfaces of the recess connector component allow imprecision that is compensated when complementary components of the protrusion connector component abut therewith to center to connectors in alignment for snapping together.

FIG. 82 schematically illustrates a pair of coupled and unlocked solar panel connectors in accordance with certain embodiments. A sliding locking latch is coupled to the recess connector component including a pair of spacer protrusions that are aligned with open spaces on the insides of the protrusion connector components (the protrusions face outward or away from each other in the example of FIGS. 81-83, but these can be reversed).

FIG. 83 schematically illustrates a pair of coupled and locked solar panel connectors in accordance with certain embodiments. After the protrusion and recess connector components are snapped into place, they are locked together securely when the sliding locking mechanism is actuated to bring the spacer protrusions in to fill the open spaces that are apparent in FIG. 82 on the insides of the protrusion connector components after they are snapped into place and thereby coupled with the complementary recess connector components. With the spaces being filled by the spacer protrusions, the protrusion connector components are unable to bend inwardly to uncoupled from the recess. In this way, the coupling of the adjacent mounting brackets is secured by actuating the locking mechanism.

Figure 84:
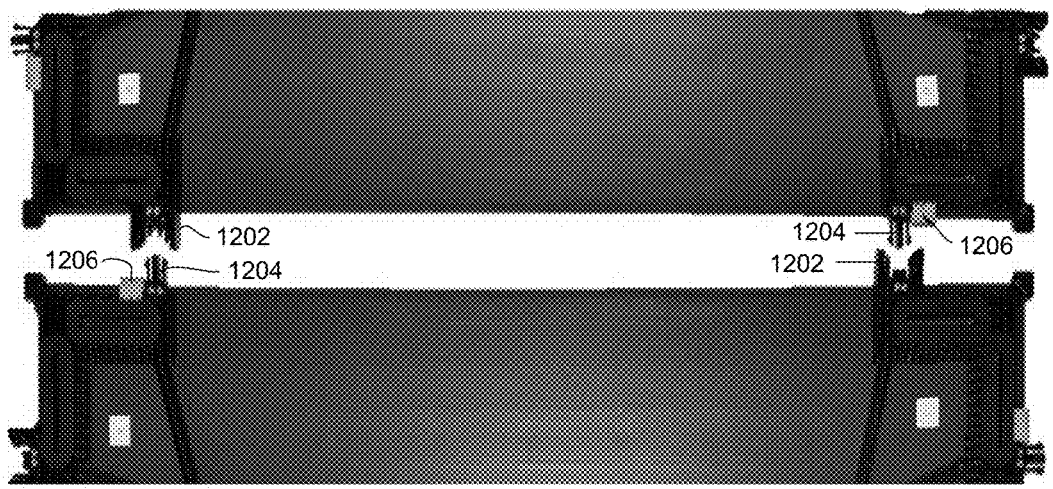
FIG. 84 schematically illustrates a pair of adjacent preassembled solar panels including two pairs of complementary bracket connectors that are not yet coupled together.

FIG. 84 schematically illustrates a pair of adjacent preassembled solar panel module including two pairs of complementary bracket connectors 1202, 1204 that are not yet coupled together. Each side of a preassembled solar module includes two bracket connectors for coupling with two bracket connectors of an adjacent preassembled solar panel module. The two bracket connectors shown along each side of the two solar panel modules illustrated at FIG. 84 include one of each complementary bracket connectors 1202 and 1204. In alternative embodiments, both can be the same on one side of one solar panel module as long as both connectors on the adjacent solar panel module are also the same and the bracket connectors that are to be coupled together, one from each adjacent solar panel module, comprise a pair of complementary bracket connectors 1202, 1204. Just to the outside of bracket connector 1204 is an alignment bumper 1206 upon which one of the outside segments of bracket connector 1202 can rest as coupling is being performed while preventing contact with the edge of the solar panel.

Figure 85:
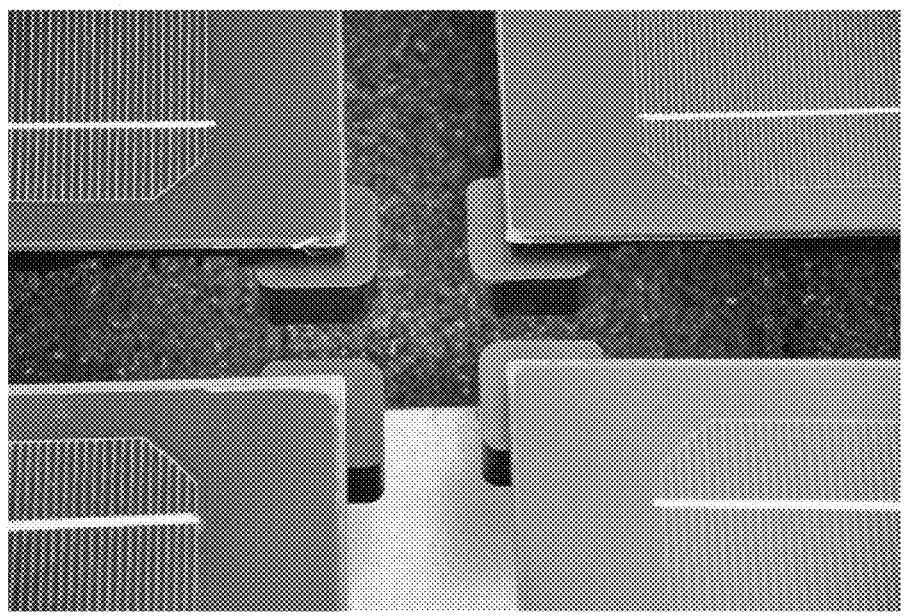
FIG. 85 schematically illustrates four solar panel corners installed as a 2×2 array or subarray that each include a corner bumper that overlaps in two dimensions.

FIG. 85 schematically illustrates four solar panel corners installed as a 2×2 array or subarray that each include a corner bumper that overlaps in two dimensions. These bumper protect the solar panels from striking the ground along its edges and corners during transport and assembly. In another embodiment, the bumpers overlap the corners both above and below the solar panel, so that preassembled solar panels can be stacked without any components contacting the solar panel surface.

Various modifications and alterations of the invention will become apparent to those skilled in the art without departing from the spirit and scope of the invention, which is defined by the accompanying claims. It should be noted that steps recited in any method claims below do not necessarily need to be performed in the order that they are recited. Those of ordinary skill in the art will recognize variations in performing the steps from the order in which they are recited. In addition, the lack of mention or discussion of a feature, step, or component provides the basis for claims where the absent feature or component is excluded by way of a proviso or similar claim language.

While various embodiments of the present invention have been described above, it should be understood that they have been presented by way of example only, and not of limitation. The various diagrams may depict an example architectural or other configuration for the invention, which is done to aid in understanding the features and functionality that may be included in the invention. The invention is not restricted to the illustrated example architectures or configurations, but the desired features may be implemented using a variety of alternative architectures and configurations. Indeed, it will be apparent to one of skill in the art how alternative functional, logical or physical partitioning and configurations may be implemented to implement the desired features of the present invention. Also, a multitude of different constituent module names other than those depicted herein may be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead may be applied, alone or in various combinations, to one or more of the other embodiments of the invention, whether or not such embodiments are described and whether or not such features are presented as being a part of a described embodiment. Thus the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the such as; the term "example" is used to provide exemplary instances of the item in discussion, not an exhaustive or limiting list thereof; the terms "a" or "an" should be read as meaning "at least one," "one or more" or the such as; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Hence, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the invention may be described or claimed in the singular, the plural is contemplated to be within the scope thereof unless limitation to the singular is explicitly stated.

The presence of broadening words and phrases such as "one or more," "at least," "but not limited to" or other such as phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, may be combined in a single package or separately maintained and may further be distributed across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives may be implemented without confinement to the illustrated examples. For example, block diagrams and their accompanying description should not be construed as mandating a particular architecture or configuration.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

Thus, for example, it will be appreciated by those of ordinary skill in the art that the diagrams, schematics, illustrations, and the such as represent conceptual views or processes illustrating systems and methods in accordance with particular embodiments. The functions of the various elements shown in the figures may be provided through the use of dedicated hardware as well as hardware capable of executing associated software. Similarly, any switches shown in the figures are conceptual only. Their function may be carried out through the operation of program logic, through dedicated logic, through the interaction of program control and dedicated logic, or even manually, the particular technique being selectable by the entity implementing this invention. Those of ordinary skill in the art further understand that the exemplary hardware, software, processes, methods, and/or operating systems described herein are for illustrative purposes and, thus, are not intended to be limited to any particular named manufacturer.

INCORPORATION BY REFERENCE

What follows is a cite list of references which are, in addition to those references cited above and below herein, and including that which is described as background, the invention summary, brief description of the drawings, the drawings and the abstract, hereby incorporated by reference into the detailed description of the preferred embodiments below, as disclosing alternative embodiments of elements or features of the preferred embodiments not otherwise set forth in detail below. A single one or a combination of two or more of these references may be consulted to obtain a variation of the preferred embodiments described in the detailed description below. Further patent, patent application and non-patent references are cited in the written description and are also incorporated by reference into the preferred embodiment with the same effect as just described with respect to the following references:

U.S. Pat. Nos. 6,161,999, 6,035,595, 6,750,391, 7,406,800, 7,435,134, 7,592,537, 7,762,027, 7,806,377, 7,819,114, 7,921,607, 7,977,818, 7,987,641; and United States published applications nos. 2003/0070368, 2006/0090789, 2007/0295393, 2009/0078299, 2009/0282755, 2010/0018571, 2010/0089389, 2010/0089390, 2010/0212244, 2010/0219304, 2011/0000526, 2011/0005983, 2011/0088740, 2011/0174365, 2011/0203637, 2011/0241426, 2012/0005983, 2012/0061337; and PCT published application no. WO2014/059445A2; and U.S. Design Pat. No. D6002005; and Citation. PCT Notification of Transmittal of the International Search Report and the Written Opinion of the International Searching Authority, or the Declaration, for PCT Application No. PCT/US2013/065144, dated Mar. 28, 2014, 9 pages.

What is claimed is:

1. A preassembled solar power module system, comprising:
   at least six mounting feet configured for coupling to a sunlight receiving surface that receives effective amounts of sunlight;
   a plurality of solar panels, including a first solar panel and a second solar panel, each preassembled with a front surface configured to collect and convert solar radiation for use as a source of energy and a back surface, said first solar panel having coupled thereto and being electrically insulated therefrom a preassembled mounting bracket at each corner that is coupled to at least one of the mounting feet, said second solar panel having coupled thereto and being electrically insulated therefrom a first plurality of mounting brackets each coupled to at least one of the mounting feet and a second plurality of mounting brackets each mechanically and electrically coupled with a respective mounting bracket of the first solar panel,
   first and second sets of stiffeners that are coated with or formed from electrically insulating material and adhesively coupled in preassembly, respectively, to backside locations away from edges of said first and second solar panels; and
   wherein the second plurality of preassembled mounting brackets of the second solar panel and said respective mounting brackets of the first solar panel comprise complementary flexible snap coupling components and a locking mechanism that prevents further flexing of the snap coupling components, and thereby prevents decoupling, when actuated into a locked position and permits flexing and coupling or decoupling when disposed in an unlocked position.

2. The system of claim 1, wherein each solar panel comprises an electrical box and cables to connect with one or more electrical boxes of one or more other solar panels.

3. The system of claim 1, wherein said plurality of mounting feet are configured to structurally attach to a roof surface without first locating roof structural members.

4. The system of claim 3, wherein said first solar panel is configured to be anchored to the sunlight receiving surface by coupling four of said at least six mounting feet both to said first solar panel and to the sunlight receiving surface, and wherein said second-solar panel is configured for snap-coupling adjacent mounting brackets and coupling two spaced-apart mounting brackets each having one of said at least six mounting feet coupled thereto directly to the sunlight receiving surface, such that said second solar panel includes two preassembled mounting brackets that are each coupled to said one of said at least six mounting feet that is configured to be directly coupled to the sunlight receiving surface and two mounting brackets-that are each configured to be coupled to a mounting bracket of the first solar panel.

5. The system of claim 4, further comprising one or more additional solar panels other than the first and second solar panels that are configured to couple with installed solar panels without first installing separate hardware or connectors on the roof before the additional solar panels are installed.

6. The system of claim 4, further comprising one or more additional solar panels other than the first and second solar panels that comprise two (2) mounting brackets that are coupled directly each to a respective mounting foot and two (2) mounting brackets that are each configured to be coupled to a respective mounting bracket of an adjacent solar panel.

7. The system of claim 6, wherein said flexible snap-coupling components of said mounting brackets are configured to be interconnected with mounting brackets on adjacent modules at a maximum angle in the range of 45 degrees to 90 degrees to the plane of the adjacent solar panel.

8. The system of claim 3, comprising at least one mounting foot that is configured to adjust in at least one dimension between itself and a mounting bracket, including in the upslope and downslope dimension or an adjustment that allows variability in the axis where the plane of the sunlight receiving surface and the plane of the exposed roofing course intersect, or combinations thereof.

9. The system of claim 3, wherein two or more of said at least six mounting feet include sensors which electronically measure compressive pressure exerted onto a fixed structure or exerted by an anchor head against the one or more of said at least six mounting feet, or combinations thereof.

10. The system of claim 1, wherein each solar panel comprises corner bumpers that overlap the solar panel in at least two dimensions.

11. The system of claim 10, wherein said corner bumpers overlap the solar panel in three dimensions.

12. The system of claim 1, wherein said plurality of solar panels comprise one or more alignment bumpers near at least one of the bracket connectors on each side that are configured for contacting a complementary bracket connector during coupling of adjacent solar panel modules.

13. A preassembled solar power module, comprising:
   at least one mounting foot configured for coupling to a sunlight receiving surface that receives effective amounts of sunlight;
   a solar panel preassembled with a front surface configured to collect and convert solar radiation for use as a source of energy and a back surface having coupled thereto and being electrically insulated therefrom at least one preassembled mounting bracket that is coupled to said at least one mounting foot and at least one additional preassembled mounting bracket configured to be mechanically and electrically coupled with a respective mounting bracket of an adjacent preassembled solar power module within a preassembled solar power module system,
   a set of stiffeners that are coated with or formed from electrically insulating material and adhesively coupled in preassembly, respectively, to backside locations away from edges of said solar panel; and
   wherein the at least one additional mounting bracket comprises one of a pair of complementary flexible snap coupling components and a locking mechanism that prevents further flexing of the snap coupling components, and thereby prevents decoupling, when actuated into a locked position and permits flexing and coupling or decoupling when disposed in an unlocked position.

14. The preassembled solar power module of claim 13, wherein each solar panel comprises an electrical box and cables to connect with one or more electrical boxes of one or more other solar panels.

15. The preassembled solar power module of claim 13, wherein said one or said pair of complementary flexible snap-coupling components of said at least one additional mounting bracket is configured to be interconnected with a mounting bracket on an adjacent module at a maximum angle in the range of 45 degrees to 90 degrees to the plane of the adjacent solar panel.

16. The preassembled solar power module of claim 13, wherein said at least one mounting foot is configured to adjust in at least one dimension between itself and a mounting bracket, including in the upslope and downslope dimension or an adjustment that allows variability in the axis where the plane of the sunlight receiving surface and the plane of the exposed roofing course intersect, or combinations thereof.

17. The preassembled solar power module of claim 13, wherein said at least one mounting foot includes a sensor which electronically measures compressive pressure exerted onto a fixed structure or exerted by an anchor head against the at least one mounting foot, or both.

18. The preassembled solar power module of claim 13, comprising a plurality of corner bumpers coupled at respective corners to said back of said solar panel to overlap the solar panel in at least two dimensions.

19. The preassembled solar power module of claim 18, wherein said plurality of corner bumpers overlap the solar panel in three dimensions.

20. The preassembled solar power module of claim 13, comprising at least one pair of alignment bumpers coupled to said back of said solar panel near said at least one additional mounting brackets on each side of said one of a pair of complementary flexible snap coupling components for contacting a complementary flexible snap coupling component during coupling of adjacent preassembled solar power modules.

* * * * *